(12) United States Patent
Castiglia et al.

(10) Patent No.: US 11,670,914 B2
(45) Date of Patent: Jun. 6, 2023

(54) EDGE-EMITTING LASER DIODE WITH IMPROVED POWER STABILITY

(71) Applicant: EXALOS AG, Schlieren (CH)

(72) Inventors: Antonino Francesco Castiglia, Schlieren (CH); Marco Rossetti, Schlieren (CH); Marco Malinverni, Schlieren (CH); Marcus Pierre Dülk, Schlieren (CH); Christian Velez, Schlieren (CH)

(73) Assignee: EXALOS AG, Schlieren (CH)

( * ) Notice: Subject to any disclaimer, the term of this patent is extended or adjusted under 35 U.S.C. 154(b) by 191 days.

(21) Appl. No.: 17/321,843

(22) Filed: May 17, 2021

(65) Prior Publication Data
US 2021/0367409 A1    Nov. 25, 2021

(30) Foreign Application Priority Data

May 19, 2020   (GB) ..................... 2007382

(51) Int. Cl.
*H01S 5/00*      (2006.01)
*H01S 5/40*      (2006.01)
(Continued)

(52) U.S. Cl.
CPC .......... *H01S 5/4031* (2013.01); *H01S 5/042* (2013.01); *H01S 5/0625* (2013.01);
(Continued)

(58) Field of Classification Search
CPC ...... H01S 5/4031; H01S 5/042; H01S 5/0625; H01S 5/1021; H01S 5/1039; H01S 5/2018; H01S 5/22
See application file for complete search history.

(56) References Cited

U.S. PATENT DOCUMENTS 4,794,608 A    12/1988  Matsushita
5,764,681 A *  6/1998  Ballantyne ............. H01S 3/063
                                              372/98

(Continued)

FOREIGN PATENT DOCUMENTS

DE    102010047451 A1    4/2012
GB         2437593       10/2007
WO       2020231584      11/2020

OTHER PUBLICATIONS

Scheibenzuber, Schwarz, Sulmoni, Carlin, Castiglia and Grandjean "Bias-dependent absorption coefficient of the absorber section in GaN-based multisection laser diodes" Appl. Phys. Lett. vol. 97, 181103 (2010); doi: 10.1063/1.3514232.

(Continued)

*Primary Examiner* — Kinam Park
(74) *Attorney, Agent, or Firm* — Nemphos Braue LLC; Michael Antone

(57) ABSTRACT

An edge-emitting semiconductor laser diode chip 15 with mutually opposed front and back end facet mirrors 22, 24. First and second ridges $26_1$, $26_2$ extend between the chip end facets 22, 24 to define first and second waveguides in an active region layer. Low and high slope efficiency laser diodes are thus formed that are independently drivable by respective electrode pairs $21_1$, $23_1$ and $21_2$, $23_2$. The single chip 15 thus incorporates two laser diodes sharing a common heterostructure, one with low slope efficiency optimized for low power operation with good power stability against temperature variations and random threshold current fluctuations in the close-to-threshold power regime, and the other with high slope efficiency optimized for high wall plug efficiency operation at higher output powers when the chip is operating far above threshold.

11 Claims, 48 Drawing Sheets

(51) Int. Cl.
*H01S 5/042* (2006.01)
*H01S 5/22* (2006.01)
*H01S 5/0625* (2006.01)
*H01S 5/10* (2021.01)
*H01S 5/20* (2006.01)
*H01S 5/343* (2006.01)

(52) U.S. Cl.
CPC .......... *H01S 5/1021* (2013.01); *H01S 5/1039* (2013.01); *H01S 5/2018* (2013.01); *H01S 5/22* (2013.01); *H01S 5/343* (2013.01)

(56) References Cited

U.S. PATENT DOCUMENTS

| | | | |
|---|---|---|---|
| 10,770,865 | B1* | 9/2020 | Shahin .................. H01S 5/1039 |
| 2002/0131466 | A1 | 9/2002 | Salvatore |
| 2003/0012244 | A1 | 1/2003 | Krasulick |
| 2005/0105577 | A1* | 5/2005 | Fukuhisa .............. H01S 5/4031 372/50.1 |
| 2006/0088066 | A1* | 4/2006 | He ........................ H01S 5/0265 372/50.1 |
| 2008/0130696 | A1 | 6/2008 | Shahine |
| 2008/0175295 | A1* | 7/2008 | Takayama ............. H01S 5/4031 372/46.01 |
| 2010/0142973 | A1 | 6/2010 | Innolume |
| 2015/0009508 | A1* | 1/2015 | Bachmann ......... G01B 9/02091 356/479 |
| 2018/0083422 | A1* | 3/2018 | Castiglia ............... H04N 9/3164 |
| 2018/0239148 | A1* | 8/2018 | Rudy .................... H01S 5/4093 |
| 2020/0018701 | A1* | 1/2020 | Meyer ................... H01S 5/1032 |

OTHER PUBLICATIONS

Arafin et al., Compact Low-Power Consumption Single-Mode Coupled Cavity Lasers, IEEE Journal of Selected Topics in Quantum Electronics, vol. 23, No. 6, Nov./Dec. 2017.

* cited by examiner

| Wavelength Range | 390–570 nm | 570–1150 nm | 1150–2000 nm | 2000–2700 nm |
|---|---|---|---|---|
| Substrate | GaN | GaAs | InP | GaSb |
| Cladding | $Al_xGa_{1-x}N$ | $Al_xGa_{1-x}As$ $Al_xGa_yIn_{1-x-y}P$ | InP $Al_xIn_{1-x}As$ | $Al_xGa_{1-x}As_{1-y}Sb_y$ |
| Waveguide | GaN | $Al_xGa_{1-x}As$ $Al_xGa_yIn_{1-x-y}P$ | $Al_xGa_yIn_{1-x-y}As$ $In_xGa_{1-x}As_{1-y}P_y$ | $Al_xGa_{1-x}As_{1-y}Sb_y$ |
| Active region (QWs + barriers) | $In_xGa_{1-x}N$ | $Al_xGa_yIn_{1-x-y}P$ $In_xGa_{1-x}As_{1-y}P_y$ | $Al_xGa_yIn_{1-x-y}As$ $In_xGa_{1-x}As_{1-y}P_y$ | $Al_xGa_{1-x}As_{1-y}Sb_y$ $In_xGa_{1-x}As_{1-y}Sb_y$ |

FIG. 15

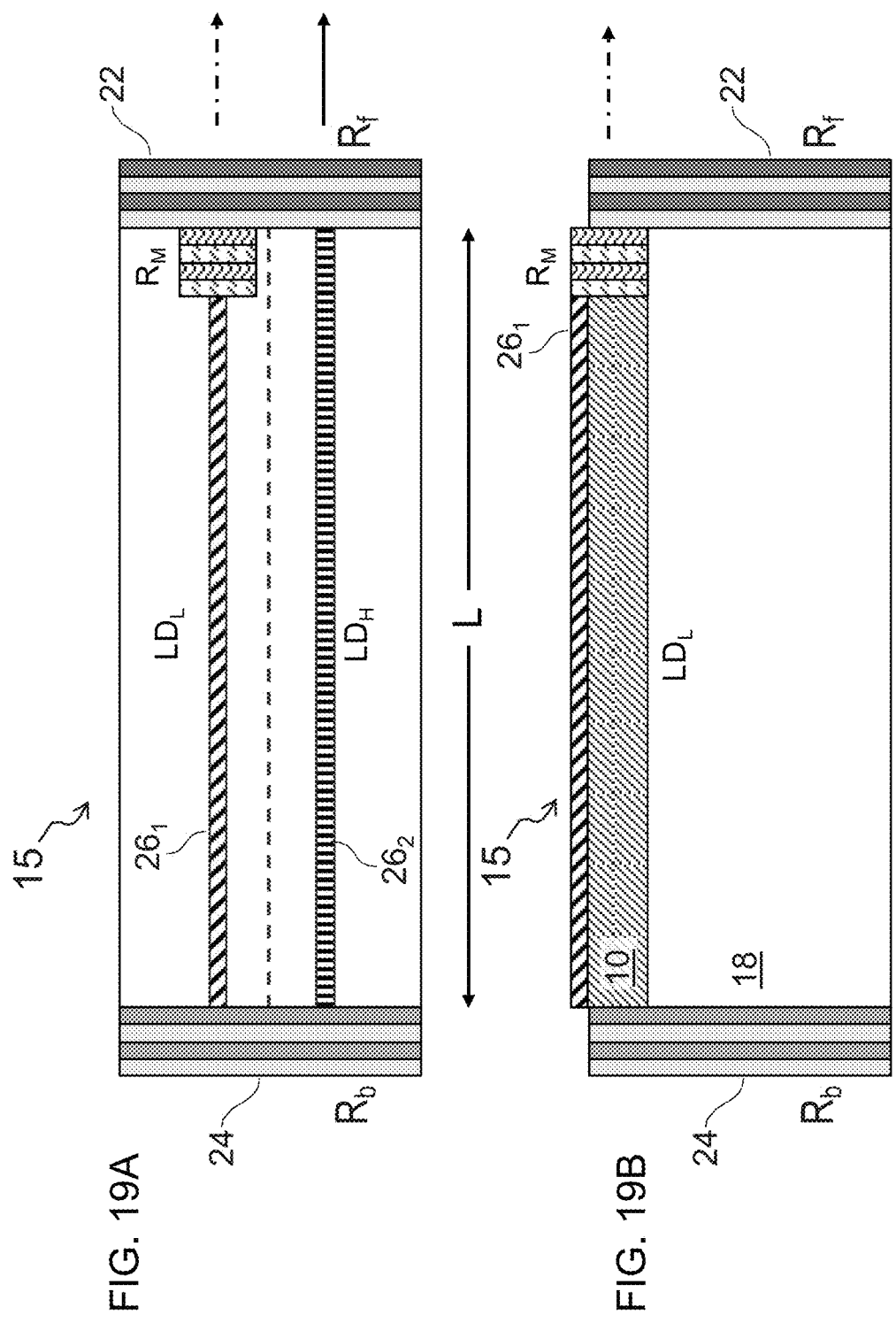

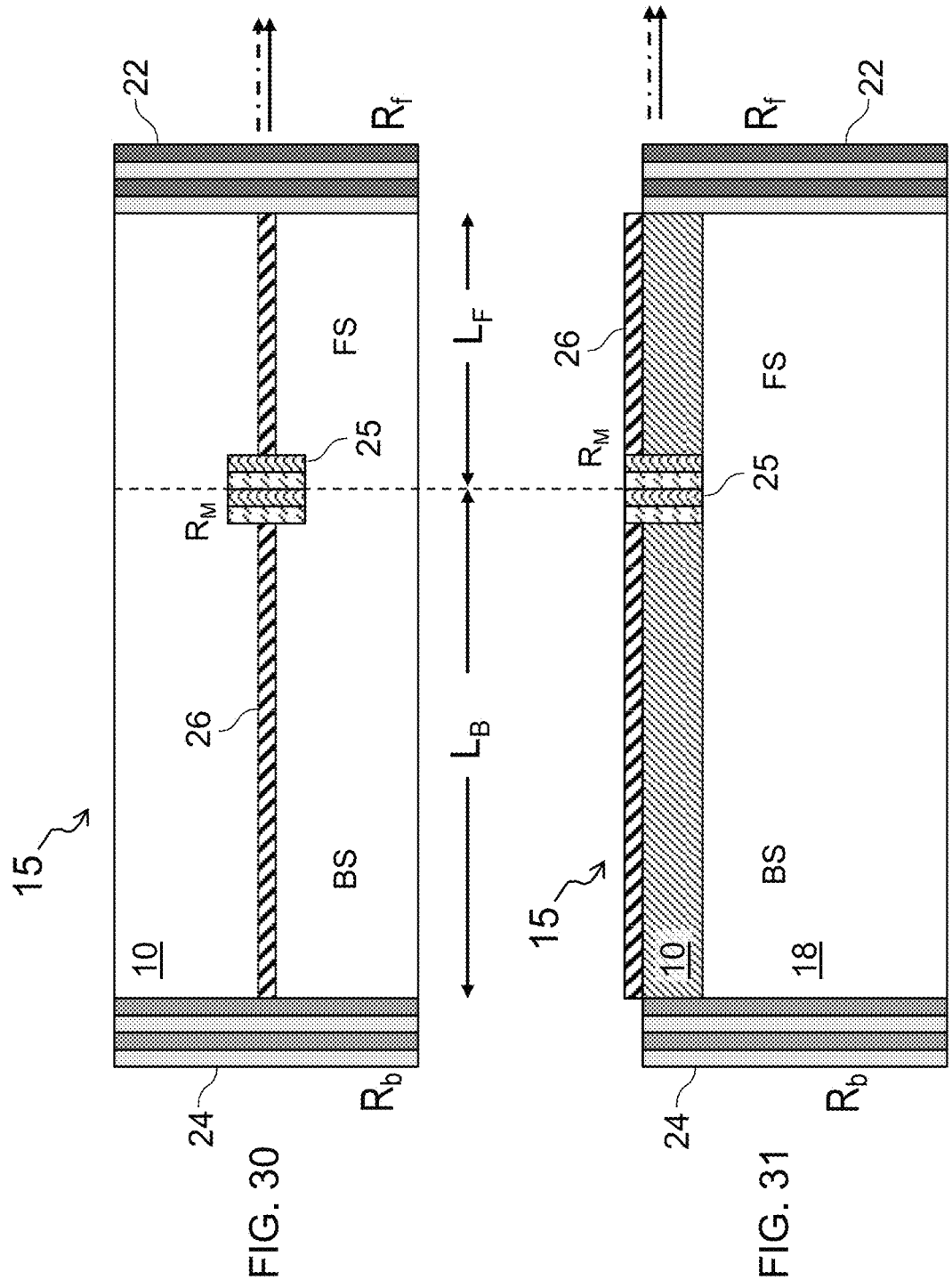

EDGE-EMITTING LASER DIODE WITH IMPROVED POWER STABILITY

BACKGROUND OF THE INVENTION

The invention relates to an edge-emitting laser diode with improved power stability.

Edge-emitting semiconductor laser diodes (LDs) are well known sources for visible light (400 nm to 700 nm) in the red, green and blue (RGB) and also in the near infra-red. The term edge-emitting LD is used, since the light is emitted with an optical axis in the plane of the active layer of the semiconductor heterostructure out of a side facet of the device structure. In the following when we refer to LDs we generally mean edge-emitting LDs, not vertical cavity surface emitting lasers (VCSELs), which are also LDs, but with their principal optical axis orthogonal to the layers which makes up the semiconductor heterostructure.

In recent decades, the main thrust of the development of LDs and related light emitting diodes (LEDs) has been to refine the design of blue and green LDs (and white light emitters) around the gallium nitride materials system, GaAlInN, so that green and blue emitters are available to complement the red emitters that were developed earlier around the GaAlInAsP materials system. Important areas of the development have been to increase power, efficiency, lifetime and reliability. Efficiency is commonly stated as wall plug efficiency (WPE) which is the ratio of output optical power to input electrical power. Current commercially available blue, green and red edge-emitting LDs now show excellent WPE and can be driven stably at high power levels. When integrated in complex light source modules, such LDs typically require the case (i.e. module) temperature to be controlled by means of an active cooling system to improve the power stability against temperature variations.

For virtual reality and augmented reality applications, high efficiency LDs are needed for RGB projection onto the inside of a visor or goggles or the inside surface of a window, such as a vehicle windscreen/windshield in a car or aircraft. More recently, interest in direct retinal projection has increased for virtual reality and augmented reality applications. In contrast to a classic projection system, or other applications such as telecoms transmitters, lighting and welding, where high power is needed, for direct or close-to-eye projection low power is needed. However, conventional LDs have not traditionally been optimized with low power applications in mind and tend to be relatively unstable when operated at low powers close to threshold.

FIG. 1A shows by way of example the power, P, vs current, I, characteristics of a commercial blue edge-emitting LD emitting at 450 nm and FIG. 1B shows its power variation $\Delta P/P$ in the different output regimes induced by threshold current variation from drive pulse to drive pulse (right). As can be seen, at low brightness the random variations in threshold current $\Delta I_{TH}$ cause ±50% power (=intensity) fluctuations in the output, whereas at high brightness the intensity fluctuations are only a few percent.

FIGS. 2A and 2B show the power vs current, and voltage vs current, characteristics and WPE characteristics of an example commercial blue LD emitting at 450 nm, referred to as Prior Art Example 1. The device shows a slope efficiency of ~1.6 W/A and a WPE of ~20% at full brightness (100 mW optical output power). Slope efficiency is the ratio of optical output power, P, to input drive current, I. These values are typical for devices available on the market and represent a good reference target in terms desirable performance in the high brightness power regime.

FIG. 3 shows how the device power-current characteristics, P vs I, of the laser of FIGS. 2A and 2B change when the module case undergoes a temperature variation between 15° and 60° C. The laser is driven in pulsed mode with a pulse width of 1 microsecond and a 1% duty cycle (DC). As is evident, there is a significant change in threshold current as a function of temperature, whereas the slope efficiency does not vary significantly.

FIGS. 4A and 4B summarize the results from FIG. 3 by showing the threshold current dependence on case temperature, $dI_{th}/dT$ vs T, and the slope efficiency dependence on case temperature, $dP/dI$ vs T. Assuming that the laser diode is working at a case temperature around 25° C., the relative power variation dependence on current and temperature can be easily determined as:

$$\Delta P_1 = \partial \frac{\partial P}{\partial I}(25° \text{ C.})$$

$$\Delta P_2 = \frac{\partial P}{\partial T} = \Delta P_1 \times \frac{\partial I}{\partial T}(25° \text{ C.})$$

FIG. 5A shows for the same blue LD the significant, indeed dramatic, effect of fluctuations in the threshold current on power stability at low output power levels, with the power variation rising to more than 100%/mA in the sub-milliwatt range. FIG. 5B shows for the same blue LD the effect of temperature on power stability. For case temperatures in the range 20-30° C., the relative power variation induced by temperature will be between less than 1% and a few percent when working in the high-power regime, but this increases to more than 100% when working in the 100 mW range. This example shows that precise power control in the low brightness range and, in general, close to threshold is a challenging task.

A second prior example, Prior Art Example 2, is of a commercially available green LD emitting at 510 nm. The general trends are similar to the blue LD example, but the specific values differ somewhat.

FIGS. 6 to 9 correspond to FIGS. 2 to 5 respectively.

FIGS. 10A and 10B show the effects of threshold current variation during pulsed, low power operation for both the blue LD example (FIG. 10A) and the green LD example (FIG. 10B). The current-power characteristics, P vs I, of the commercial blue and a green LDs are measured multiple times while keeping the same drive conditions and keeping the case temperature at a constant value of 25° C. A threshold current variation of circa 40 mA and circa 70 mA can be observed on the blue and the green emitter respectively. Taking into account the corresponding slope efficiencies (1.6 W/A for the blue LD and 0.7 W/A for the green LD), both devices show at a constant drive current a power variation of approximately ±30% with respect to a nominal power output value of 100 μW. We note these results are with the case temperature being kept constant. The situation if the case temperature is not under good control will of course be worse.

The above two prior art examples are for blue and green commercially available LDs. Although not reported here, an equivalent analysis on red commercial LDs would lead to similar results and conclusions.

To address this problem, a low power ridge LD was proposed in US 2018/083422 A1 in which the slope efficiency is deliberately lowered. Slope efficiency is lowered by a careful choice of a combination of physical parameters, in particular front facet reflectivity Rf which can be increased to lower slope efficiency (typically Rf=0.7 to 0.95), internal loss αi which can be increased from its residual value, e.g. by doping, to lower slope efficiency (typically 5-20 cm-1), and cavity length L which can be increased to lower slope efficiency (typically L=200-600 μm). With lower slope efficiency, the laser operates more stably at low output powers close to threshold, i.e. in the sub-mW output power range, and in particular has an output power that is less sensitive to temperature fluctuations and to random fluctuations in the threshold current each time the device is brought to lase.

FIG. 11A is a graph plotting relative power variation per unit temperature, ΔP/dT/P, as a function of output power, P, for six blue LDs with different slope efficiencies, but otherwise identical design parameters of cavity length, L: 500 μm, internal loss, αi: 3 cm-1, back reflectivity, Rb: 99%, ridge width, W: 2 μm and front reflectivity, Rf that is varied to vary the slope efficiency with values of: 25%, 70%, 88%, 96%, 97%, 98%, where slope efficiency decreases with increasing Rf. It is apparent how for a given laser (i.e. a given line in the plot) the power stability is good at higher output powers in the tens of mW range but becomes poor at sub-mW output powers. It is also apparent that relative power variation is reduced by reducing the slope efficiency.

FIG. 11B is a corresponding set of curves for five green LDs, where the curves show the same trends. Here the parameter values are L:1000 μm, αi: 3 cm-1, Rb: 99%, W: 2 μm, and Rf at values of 40%, 82%, 88%, 94%, 98%, where slope efficiency decreases with increasing Rf. With this prior art design approach, some wall plug efficiency is sacrificed to improve the low-power output stability. However, owing to this compromise, the laser inevitably does not operate with optimum WPEs at higher output powers, e.g. in the range 50-100 mW.

SUMMARY OF THE INVENTION

According to an aspect of the invention there is provided a laser diode chip comprising:
a. a plurality of semiconductor layers arranged on a substrate, the semiconductor layers collectively defining an active region layer of higher refractive index sandwiched between upper and lower cladding layers of lower refractive index;
b. mutually opposed front and back end facets on which are formed front and back mirrors;
c. first and second ridges each extending laterally between the front and back end facets and having respective pairs of sides that extend part way to the active region layer to define first and second waveguides in the active region layer;
d. a first laser diode having a first gain medium defined by the first waveguide and which is configured to operate with a first, low slope efficiency;
e. a second laser diode having a second gain medium defined by the second waveguide and which is configured to operate with a second, high slope efficiency, wherein the second slope efficiency is higher than the first slope efficiency;
f. a plurality of electrical contacts configured to allow the first and second laser diodes to be independently driven; and
g. a controller configured to drive the electrical contacts in a first mode of operation to operate the laser diode chip with low slope efficiency for low output powers using the first laser diode, and in a second mode of operation to operate the laser diode chip with high slope efficiency for high output powers using the second laser diode.

According to this design, it is possible to provide an edge-emitting LD chip with improved power stability against temperature variations and against random threshold current fluctuations in the close-to-threshold power regime.

First and second emitters are thus formed by the first and second ridges in the same LD chip that can share the same semiconductor heterostructure, i.e. the plurality of semiconductor layers grown on the substrate. With this design, the first and second laser diodes share a common cavity, since they are based on the same semiconductor heterostructure and since they share the same front and back mirrors. Although a plethora of parameters define the performance of such emitters, we use the parameter space defined by the following parameters to engineer two different slope efficiency emitters in the same chip:

Chip cavity length, i.e. distance between front and back mirrors, L
Ridge width, W
Back mirror reflectivity, Rb
Front mirror reflectivity, Rf
Internal loss of gain medium, αi The chip cavity length may, for example, be in the range: 300 mm L 2000 mm It is further noted that the slope efficiency does not change significantly with ridge width for typical ridge width values, so we do not distinguish between the ridge width of the first and second ridges, $W_1$ and $W_2$, which may be the same or different, with both typically being in the range 1-4 μm.

The difference between the slope efficiencies can be realized in various different ways within the parameter space, in particular by one or more of the following design approaches:

The difference between the slope efficiencies can be realized at least in part by providing the front mirror of the first, low slope efficiency, laser diode with a higher reflectivity than the front mirror of the second, high slope efficiency, laser diode. For example, the front and back reflectivities may be in the ranges:
10%≤$R_b$≤100%
10%≤$R_f$≤80%

The difference between the slope efficiencies can be realized at least in part by providing the first waveguide of the first, low slope efficiency, laser diode with a higher internal loss than that of the second waveguide of second, high slope efficiency, laser diode. For example, the respective internal losses of the low and high slope LDs—$a_i^H$ and $a_i^L$—can be set in the following ranges:
0 cm$^{-1}$≤$a_i^H$≤10 cm$^{-1}$
$a_i^H$<$a_i^L$≤30 cm$^{-1}$ The difference between the slope efficiencies can be realized at least in part by providing the second waveguide of the second, high slope efficiency, laser diode with an intermediate mirror arranged part way between the front end facet and the back end facet so that the second laser diode has a shortened cavity length compared to the first laser diode. For example, the respective cavity lengths of the high and low slope efficiency LDs—$L_H$ and $L_L$—can be set in the following ranges:
300 mm≤$L_H$≤2000 mm
300 mm≤$L_L$≤2000 mm The difference between the first and second slope efficiencies can be realized at least in part by providing the first waveguide of the first, low slope efficiency, laser diode with a bend so that it meets the back end facet at a non-orthogonal angle, thereby inducing additional coupling losses for light reflected back into the first waveguide from the back mirror. For example, the non-orthogonal angle may deviate from the orthogonal by an amount in the following range:

0 deg<q≤5 deg

The ridges may be buried or unburied. By buried ridges we refer to the presence of semiconductor material either side of the ridges in an infill region. The infill region may, for example, be fabricated by regrowth after the ridges have been formed by etching. By unburied ridges, we refer to a structure that has no such infill, so the ridges are at the surface of the semiconductor layer stack. The unburied ridges may nevertheless be covered in some other material, such as a dielectric material for electrical isolation and/or a metal or metallic material for forming an electric contact.

These designs require at least the above-mentioned first and second ridges. However, it will be understood that multiple ones of either or both of type of ridge may be included in a single chip as an array, e.g. multiple pairs of first and second ridges.

In examples of the laser diode chip, the second slope efficiency is at least 1.5, 2, 3, 4, 5, 6, 7, 8, 9, 10, or 20 times greater than the first slope efficiency.

The laser diode chip can be configured to emit in the blue spectral region, the first slope efficiency is less than 0.8 W/A and the second slope efficiency is greater than 1.2 W/A. The laser diode chip can be configured to emit in the green spectral region, the first slope efficiency is less than 0.3 W/A and the second slope efficiency is greater than 0.5 W/A. The laser diode chip can be configured to emit in the red spectral region, the first slope efficiency is less than 0.3 W/A and the second slope efficiency is greater than 0.8 W/A.

Another aspect of the invention relates to a light module comprising at least one laser diode chip as described above. A still further aspect of the invention relates to a vision system configured to be placed on a human head incorporating such a light module.

According to another aspect of the invention there is provided a laser diode chip comprising: a plurality of semiconductor layers arranged on a substrate, the semiconductor layers collectively defining an active region layer of higher refractive index sandwiched between upper and lower cladding layers of lower refractive index;
  a. mutually opposed front and back end facets on which are formed front and back mirrors;
  b. a ridge extending laterally between the front and back end facets and having a pair of sides that extend part way to the active region layer to define a waveguide in the active region layer;
  c. a partially transmissive mirror arranged part way between the front end facet and the back end facet to subdivide the waveguide into a back waveguide section and a front waveguide section, wherein the partially transmissive mirror is shared by the front and back waveguide sections;
  d. a plurality of electrical contacts configured to allow the front and back waveguide sections to be independently driven; and
  e. a controller configured to drive the electrical contacts in a first mode of operation to operate the laser diode chip with low slope efficiency for low output powers and in a second mode of operation to operate the laser diode chip with high slope efficiency for high output powers, wherein to produce at least one of the first and second modes of operation, the controller drives the electrical contacts to operate one of the waveguide sections as a laser diode and the other of the waveguide sections as a bias-dependent tunable absorber.

According to this design, it is possible to provide an edge-emitting LD chip with improved power stability against temperature variations and against random threshold current fluctuations in the close-to-threshold power regime.

An emitter is thus formed in a LD chip by combining a bias-dependent absorber section and a lasing section in a common waveguide. The LD chip can be operated to have a low slope efficiency or a high slope efficiency as desired depending on the desired power stability and output power. The first and second sections are arranged in series between an opposing pair of end facets of the LD chip sharing a common waveguide separated by a partially transmissive mirror, which may be realized as a monolithic mirror, which has a dual function of forming the output coupler for the back section and the back reflector for the front section. The bias in each section is independently controllable by the controller through the electrical contacts. The two sections of the waveguide can share the same semiconductor heterostructure. Although a plethora of parameters define the performance of a ridge LD, we use the parameter space defined by the following parameters to allow operation at different slope efficiencies:

Cavity Length (chip), L
Cavity Length (front section), $L_F$
Cavity Length (back section), $L_B$
Ridge width, W
Back reflector reflectivity, Rb
Front reflector reflectivity, Rf
Intermediate reflector reflectivity, $R_M$
Internal loss of gain medium, αi Example parameter ranges for the above are as follows:

300 mm≤L≤2000 mm
100 mm≤$L_B$≤1000 mm
100 mm≤$L_F$≤1000 mm
0 deg≤q≤5 deg
0 cm$^{-1}$≤$a_i$≤30 cm$^{-1}$
10%≤$R_b$≤100% (but see comment below)
10%≤$R_f$≤80%
10%≤$R_M$≤100%

In one embodiment, to produce the first and second modes of operation, the controller is configured to drive the electrical contacts to operate the front waveguide section as a laser diode and the back waveguide section as a bias-dependent tunable absorber, the controller selecting an effective reflectivity for the front waveguide section by applying a bias voltage to the back waveguide section. The effective reflectivity is selectable in a range between the reflectivity of the partially transmissive mirror and the reflectivity of the back mirror through varying the bias voltage, and wherein the first, low slope efficiency mode of operation is selected by applying a low or zero bias voltage to the back section to provide a first, lower effective reflectivity, and the second, high slope efficiency mode of operation is selected by applying a high bias voltage to the back section to provide a second, higher effective reflectivity. For example, in the first, low slope efficiency mode of operation the bias voltage applied to the back section provides an effective reflectivity that is at or close to that of the partially transmissive mirror, whereas in the second, high slope efficiency mode of operation the bias voltage applied to the back section provides an effective reflectivity that is at or close to that of the back mirror.

A specific parameter space optimized for this embodiment may follow one or more of the following conditions:
- the partially transmissive mirror has a reflectivity RM lower than the reflectivity of the front mirror Rf and the back mirror Rb
- the partially transmissive mirror has a reflectivity RM less than or equal to one of 40, 30 and 20 percent
- the reflectivity of the front mirror Rf is greater than or equal to one of 70, 80 and 90 percent the reflectivity of the back mirror Rb is greater than or equal to one of 80, 85, 90 and 95 percent.

In one embodiment, to produce the first, low slope efficiency mode of operation, the controller is configured to drive the electrical contacts to operate the back waveguide section as a laser diode and the front waveguide section as a bias-dependent tunable absorber, and, to produce the second, high slope efficiency mode of operation, the controller is configured to drive the electrical contacts to operate the front waveguide section as a laser diode. A specific parameter space optimized for this embodiment may follow one or more of the following conditions:
- the partially transmissive mirror has a reflectivity RM greater than the reflectivity of the front mirror Rf and the back mirror Rb
- the partially transmissive mirror has a reflectivity RM greater than or equal to one of: 70, 75, 80, 85 and 90 percent
- the front mirror has a reflectivity Rf less than or equal to one of: 50, 40, 30 and 20 percent the back mirror has a reflectivity Rb greater than or equal to one of: 50, 60, 70, 80 and 90 percent.

In one embodiment, to produce the first and second modes of operation, the controller is configured to drive the electrical contacts to operate the back waveguide section as a laser diode and the front waveguide section as a bias-dependent tunable absorber, wherein the first, low slope efficiency mode of operation is selected by applying a low bias voltage to the front section to provide more absorption, and the second, high slope efficiency mode of operation is selected by applying a high bias voltage to the front section to provide less absorption or some gain. A specific parameter space optimized for this embodiment may follow one or more of the following conditions:
- the partially transmissive mirror has a reflectivity $R_M$ lower than the reflectivity of the back mirror Rb
- the partially transmissive mirror has a reflectivity $R_M$ less than or equal to one of: 40, 30, 20 and 10 percent
- the front mirror has a reflectivity Rf less than or equal to one of: 40, 30, 20 and 10 percent the back mirror has a reflectivity Rb greater than or equal to one of: 50, 60, 70, 80 and 90 percent.

The ridge or ridges may be buried or unburied. By a buried ridge or ridges we refer to the presence of semiconductor material either side of the ridge(s) in an infill region. The infill region may, for example, be fabricated by regrowth after the ridge or ridges have been formed by etching. By an unburied ridge or ridges, we refer to a structure that has no such infill, so the ridge or ridges are at the surface of the semiconductor layer stack. The unburied ridge(s) may nevertheless be covered in some other material, such as a dielectric material for electrical isolation and/or a metal or metallic material for forming an electric contact.

It will be understood that multiple two-section waveguides as described may be included in a single chip as an array.

In examples of the laser diode chip, the second slope efficiency is at least 1.5, 2, 3, 4, 5, 6, 7, 8, 9, 10, or 20 times greater than the first slope efficiency.

The laser diode chip can be configured to emit in the blue spectral region, the first slope efficiency is less than 0.8 W/A and the second slope efficiency is greater than 1.2 W/A. The laser diode chip can be configured to emit in the green spectral region, the first slope efficiency is less than 0.3 W/A and the second slope efficiency is greater than 0.5 W/A. The laser diode chip can be configured to emit in the red spectral region, the first slope efficiency is less than 0.3 W/A and the second slope efficiency is greater than 0.8 W/A.

Another aspect of the invention relates to a light module comprising at least one laser diode chip as described above. A still further aspect of the invention relates to a vision system configured to be placed on a human head incorporating such a light module.

BRIEF DESCRIPTION OF THE DRAWINGS

This invention will now be further described, by way of example only, with reference to the accompanying drawings.

FIG. 15 is a table showing example materials choices for LD chip fabrication in each of four different materials systems.

FIGS. 19A, 19B, 20 and 21 show embodiments according to a first design approach based on having different front reflectivities between the low and high slope lasers.

FIG. 29, FIG. 30 and FIG. 31 are schematic drawings of an edge-emitting LD chip suitable for two-section waveguide embodiments in perspective, plan and section views respectively.

DETAILED DESCRIPTION

In the following detailed description, for purposes of explanation and not limitation, specific details are set forth in order to provide a better understanding of the present disclosure. It will be apparent to one skilled in the art that the present disclosure may be practiced in other embodiments that depart from these specific details.

Figure 1A:
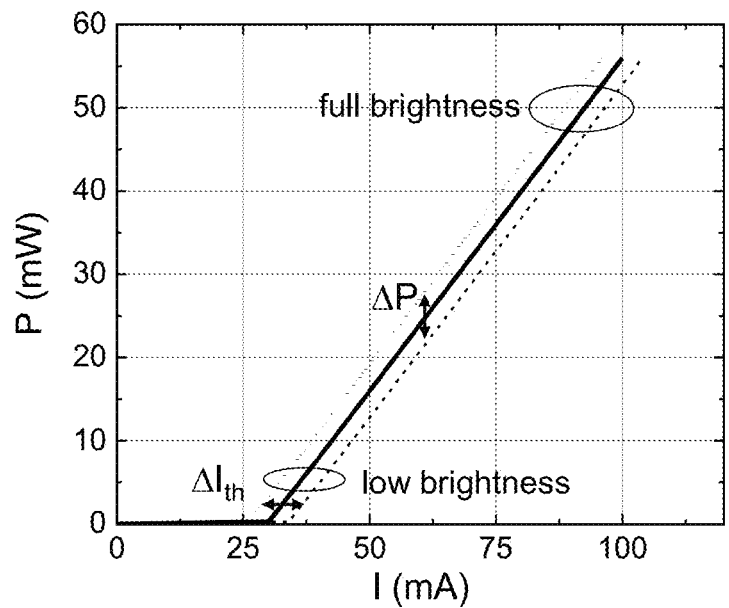
FIGS. 1A and 1B show by way of example the power, P, vs current, I, characteristics of an example commercial blue edge-emitting LD
Figure 1B:
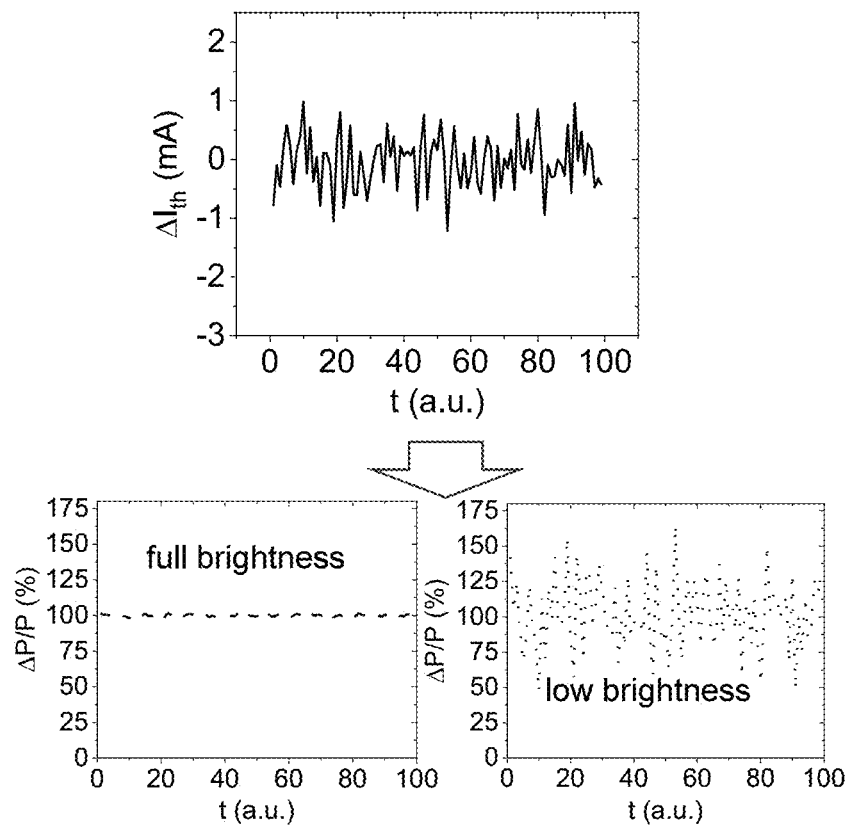
Figure 2A:
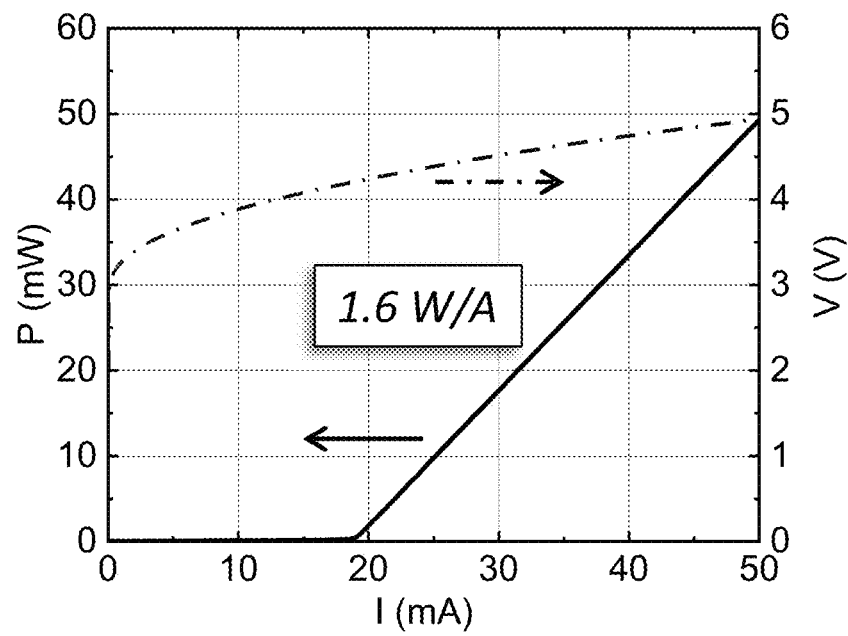
FIGS. 2A and 2B show the LIV characteristics and WPE characteristics of an example commercial blue LD.
Figure 2B:
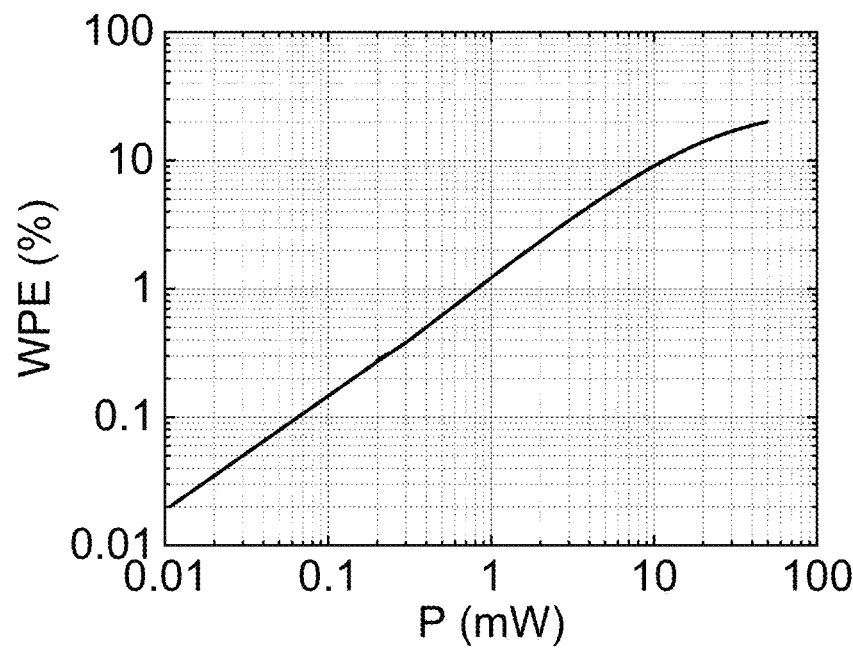
Figure 3:
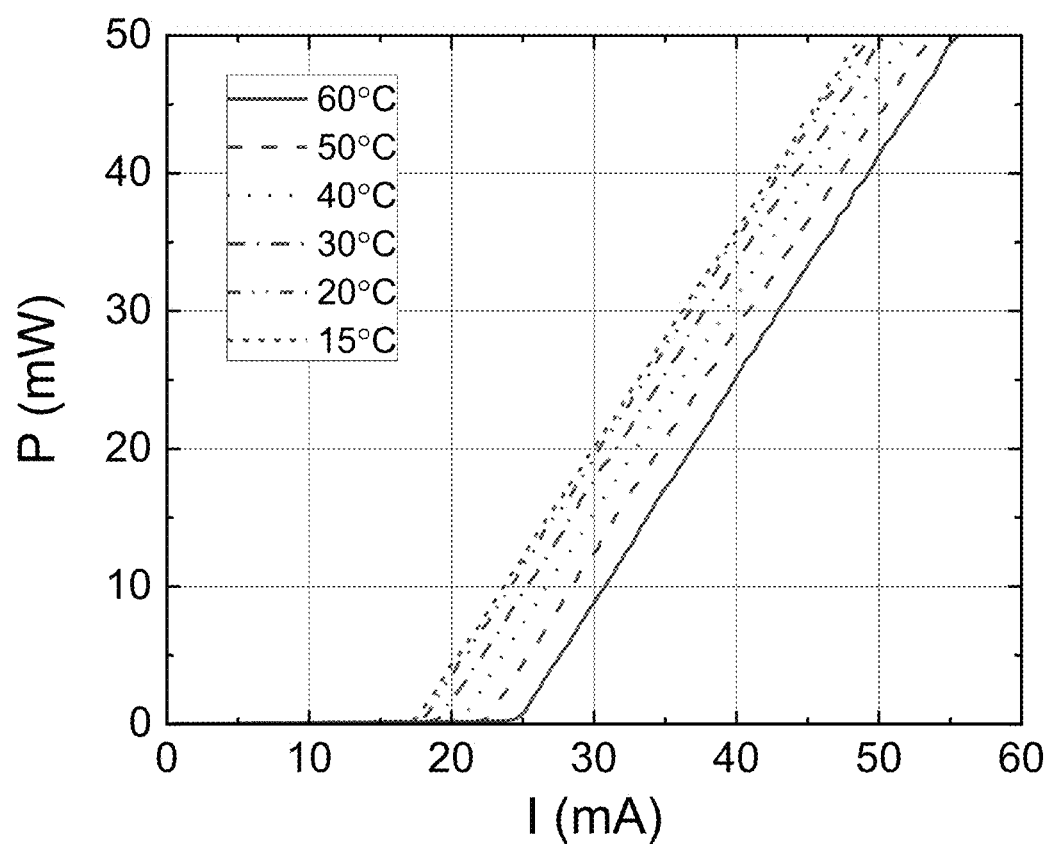
FIG. 3 shows the temperature dependence of the power-current characteristics of the blue LD of FIG. 2.
Figure 4A:
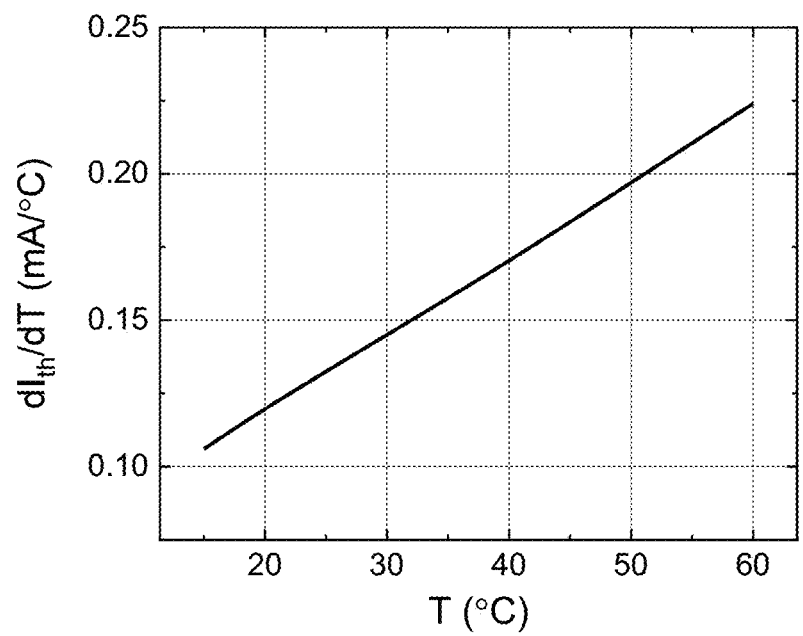
FIGS. 4A and 4B summarize the results from FIG. 3 by showing the threshold current dependence on case temperature (FIG. 4A) and the slope efficiency dependence on case temperature (FIG. 4B).
Figure 4B:
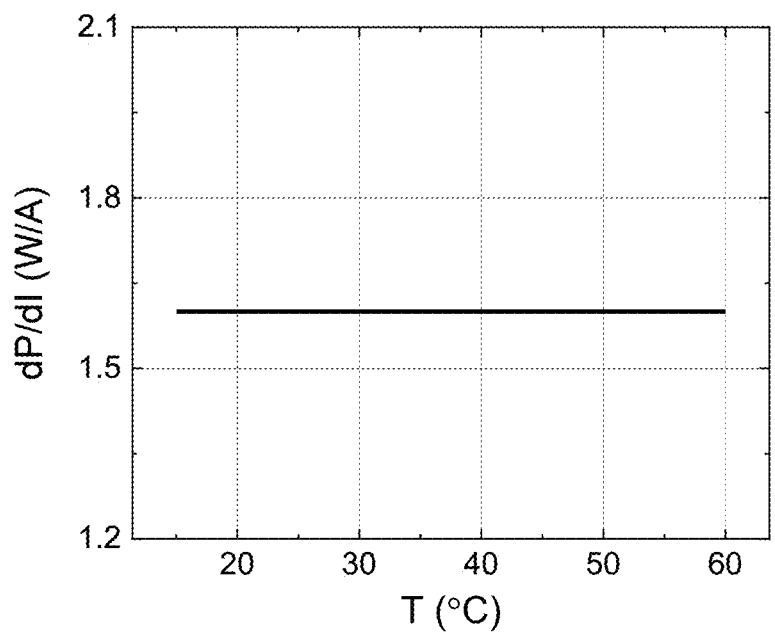
Figure 5A:
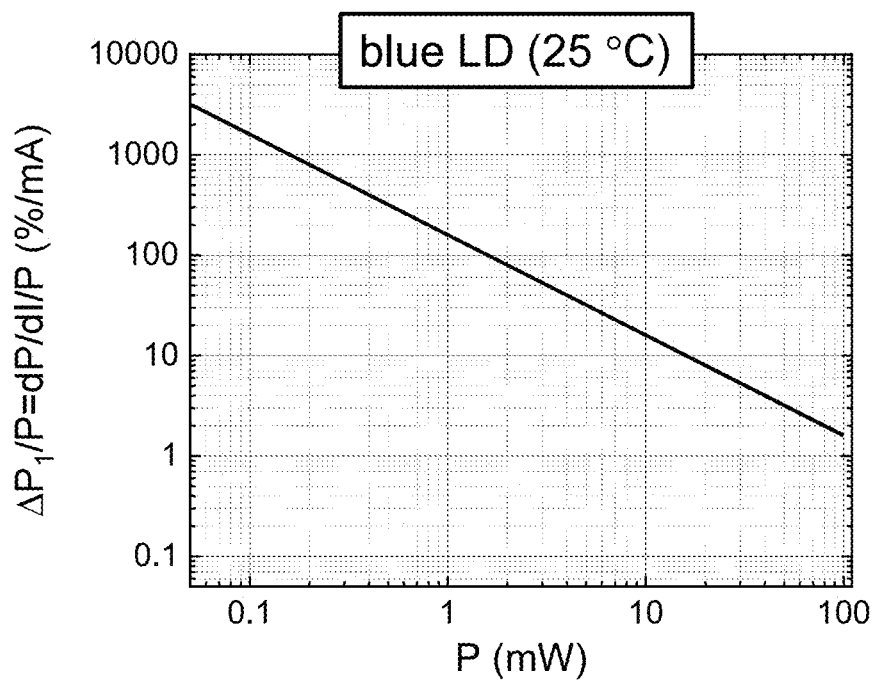
FIGS. 5A and 5B are graphs plotting the relative power variation dependence on current and on temperature respectively as a function of output power for the blue LD of FIGS. 2A and 2B.
Figure 5B:
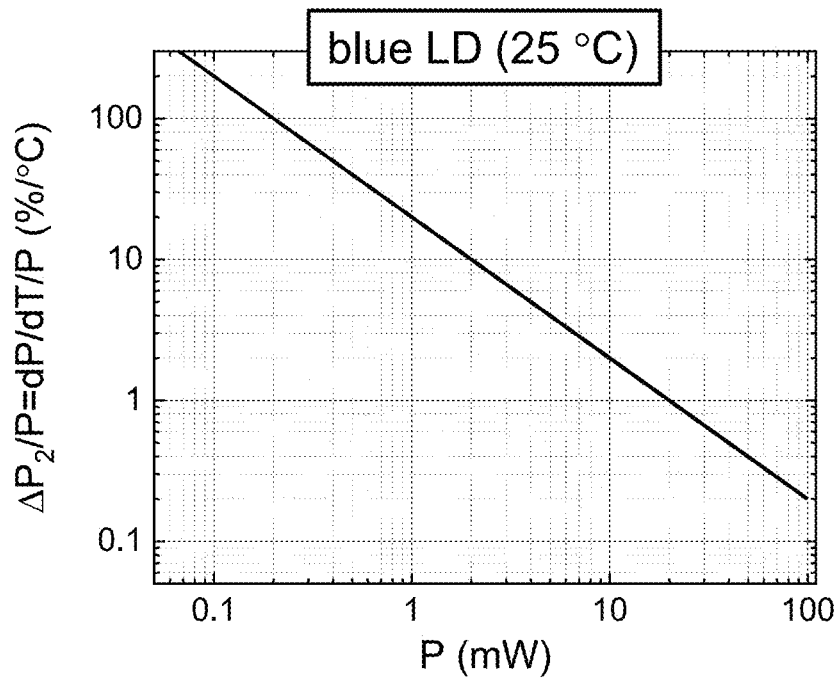
Figure 6A:
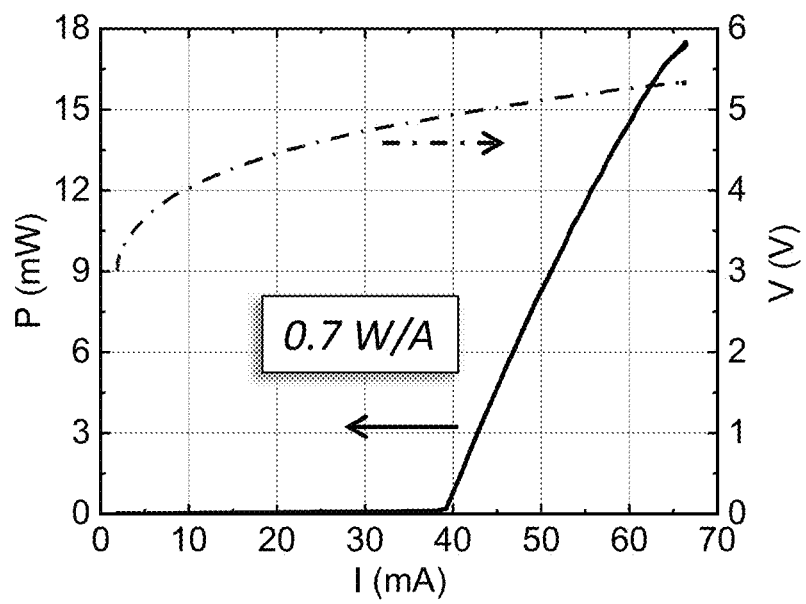
FIGS. 6A, 6B, 7, 8A, 8B, 9A and 9B correspond to FIGS. 2A, 2B, 3, 4A, 4B, 5A and 5B respectively for a green edge-emitting LD.
Figure 6B:
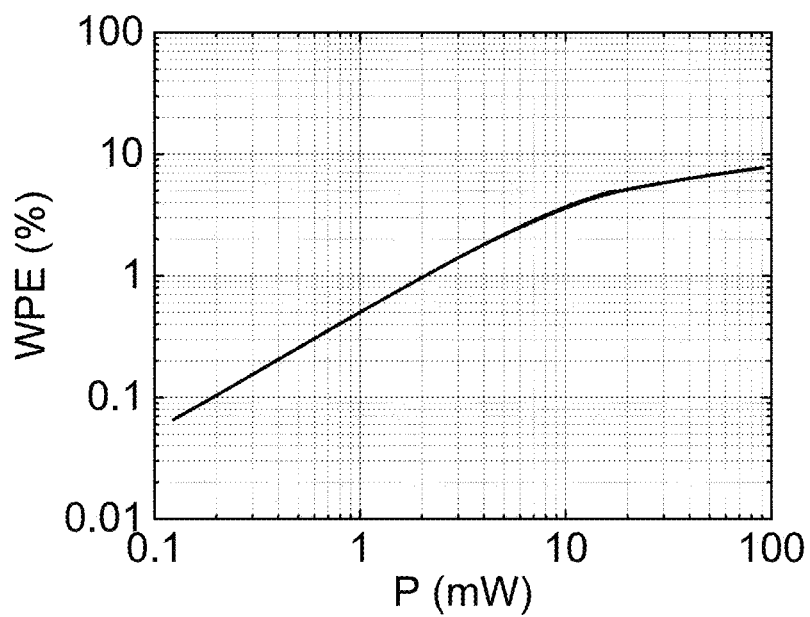
Figure 7:
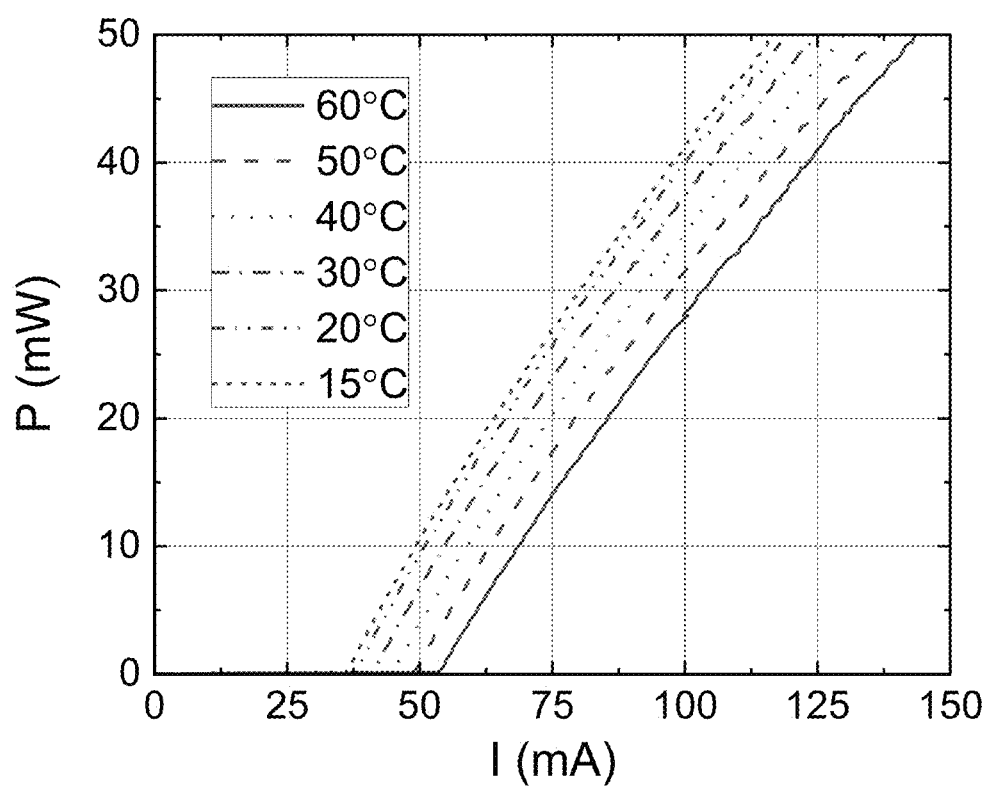
Figure 8A:
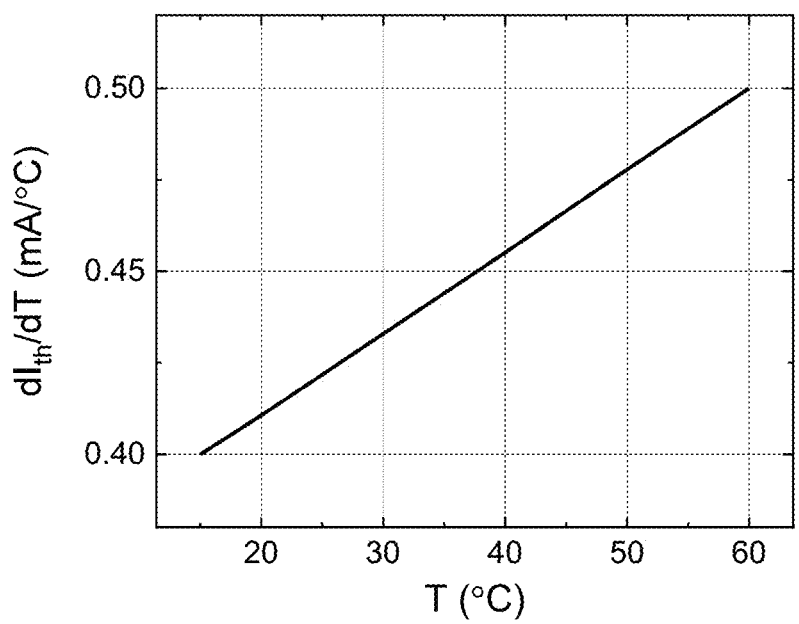
Figure 8B:
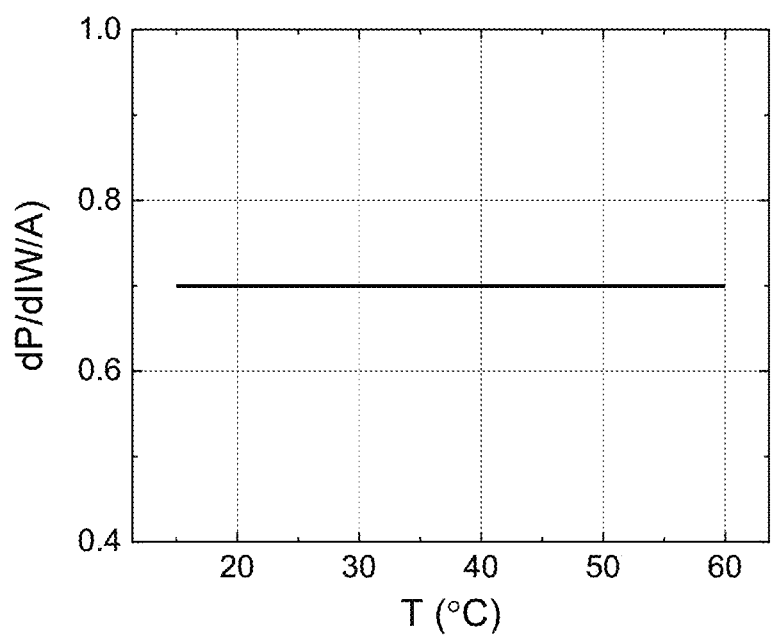
Figure 9A:
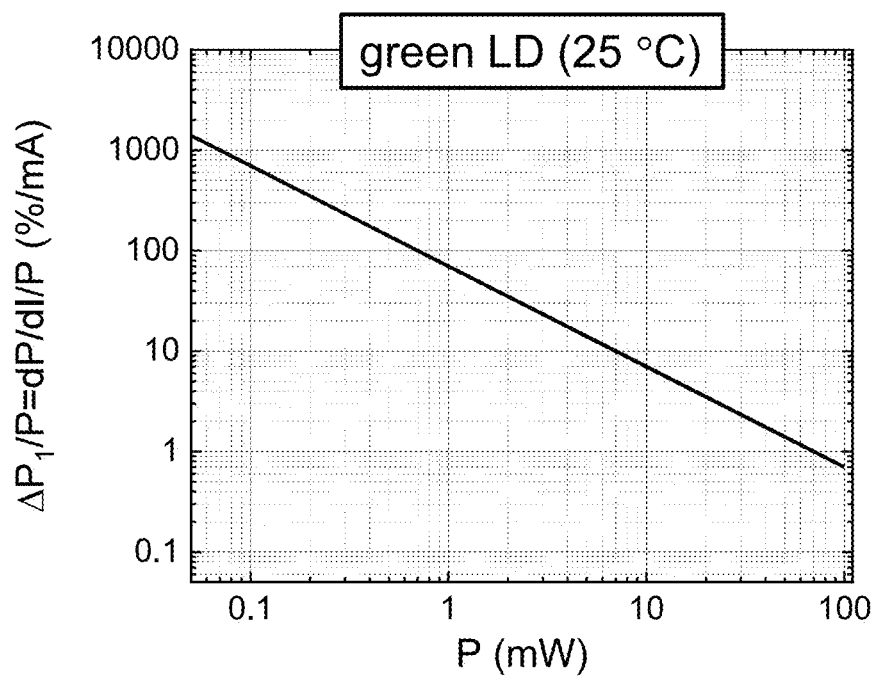
Figure 9B:
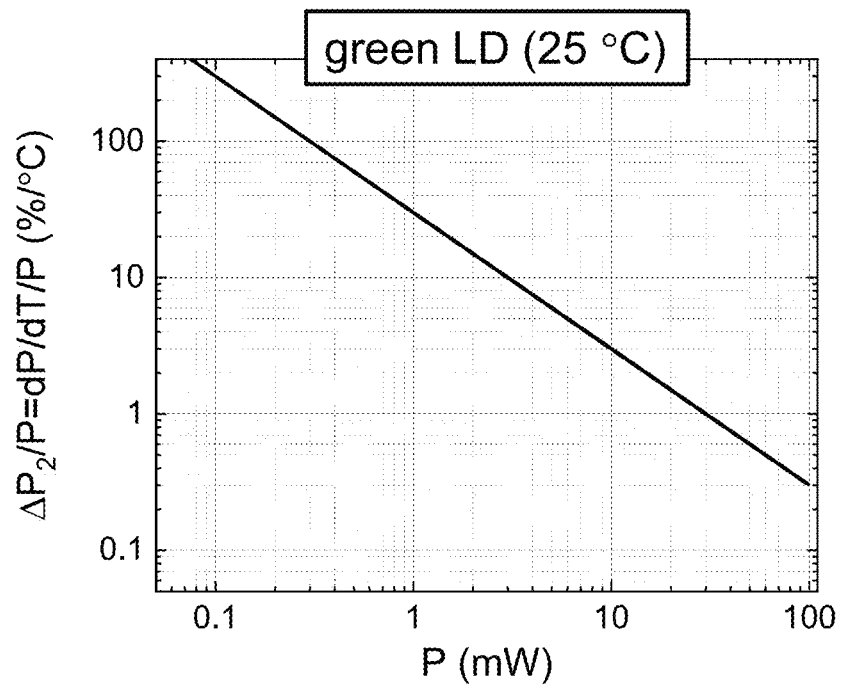
Figure 10A:
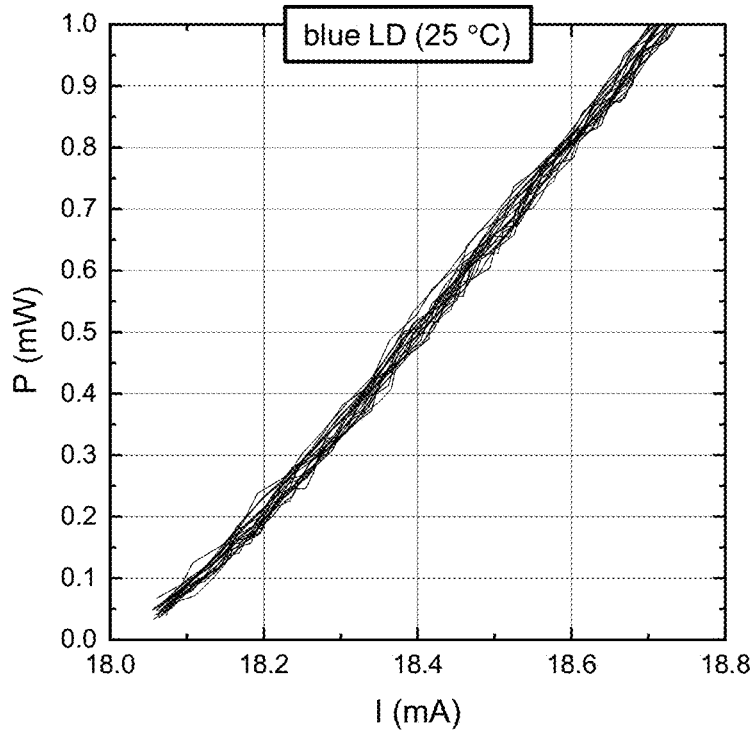
FIG. 10A shows the effects of threshold current variation during pulsed operation for the blue LD example of FIGS. 2 to 5.
Figure 10B:
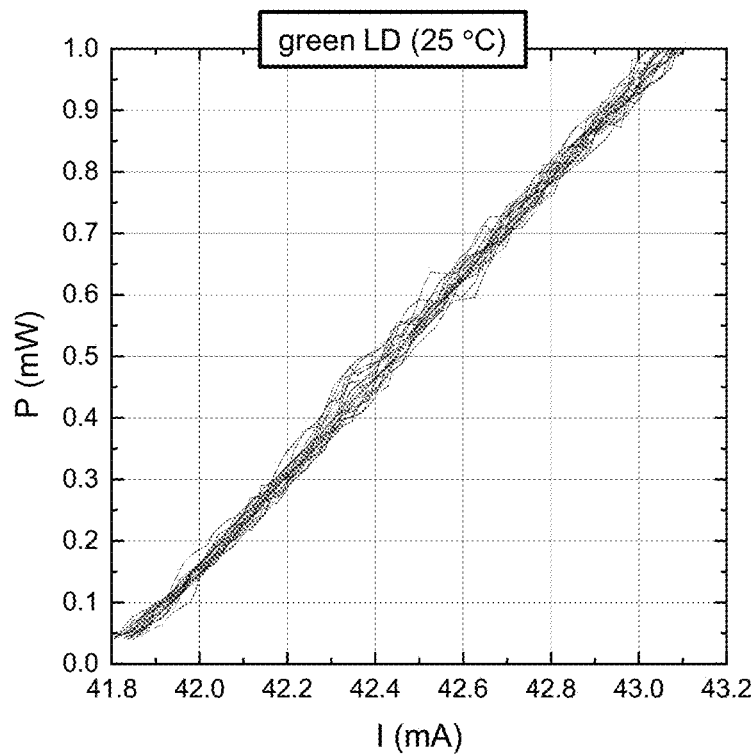
FIG. 10B shows the effects of threshold current variation during pulsed operation for the green LD example of FIGS. 6 to 9.
Figure 11A:
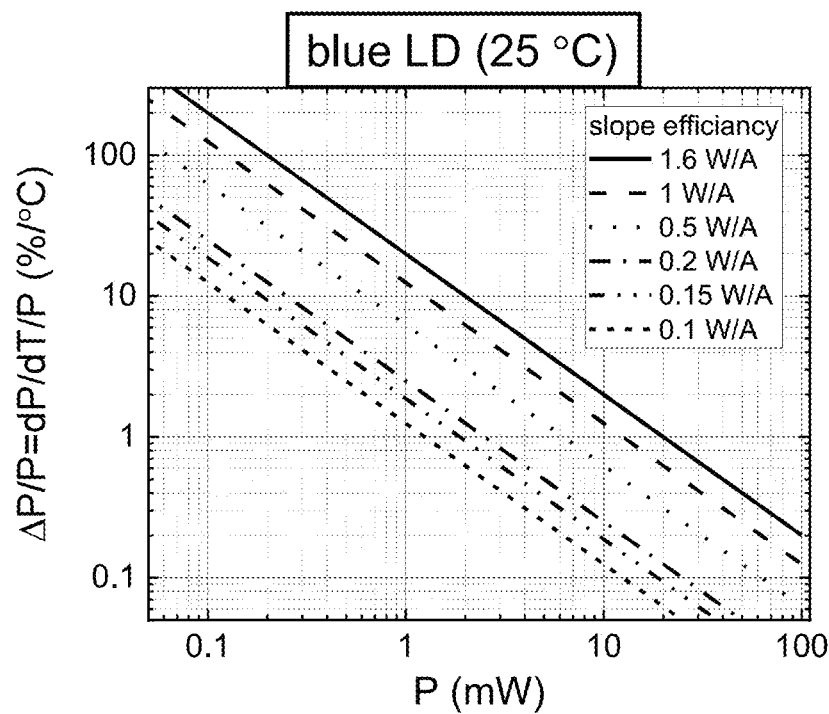
FIG. 11A is a graph of relative power variation per unit temperature as a function of output power for otherwise identical blue LDs with different slope efficiencies.
Figure 11B:
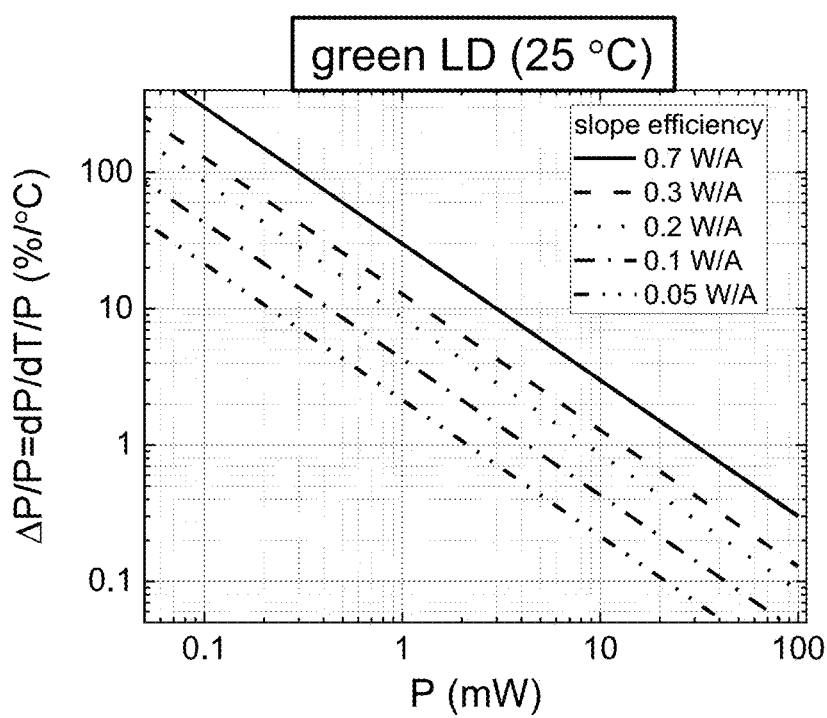
FIG. 11B is a graph of relative power variation per unit temperature as a function of output power for otherwise identical green LDs with different slope efficiencies.
Figure 12:
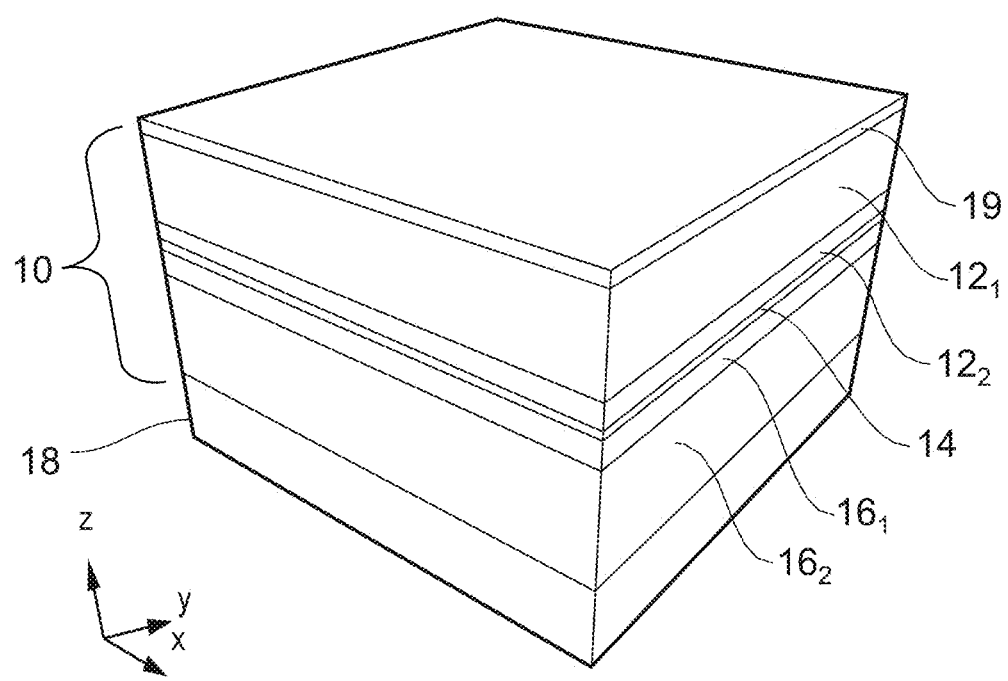
FIG. 12 shows a semiconductor heterostructure suitable for fabricating a LD chip according to embodiments of the disclosure.

FIG. 12 shows the basic layer structure of a semiconductor heterostructure for a LD chip according to embodiments of the disclosure. This shows the situation prior to post-growth processing, e.g. to form ridges and deposit electrodes. The epitaxial semiconductor layers 10 are an active layer 14 sandwiched between p-type layers $12_1$ and $12_2$ and n-type layers $16_1$ and $16_2$, wherein the epitaxial layers 10 are grown on an n-type substrate 18. The heterostructure 10 further includes a p-type capping layer 19 to form a junction to a metallic top contact electrode. The p-type layers $12_1$ and $12_2$ are a top cladding layer $12_1$ and thereunder a waveguide layer $12_2$ adjacent the active layer 14. The n-type layers $16_1$ and $16_2$ are a waveguide layer $16_1$ adjacent the active layer 14 and a bottom cladding layer $16_2$ thereunder. The two waveguiding layers $12_2$ and $16_1$ have refractive indices lower than that of the active layer 14 and higher than layers $12_1$ and $16_2$, so as to support at least one guided mode in the active layer 14 in each of the waveguiding regions. The different layers are made of different materials (heterostructure) to provide the desired band gap profiles and refractive index profiles, as well as other desired properties. The person skilled in the art will know that each of these layers will in fact most likely be made of multiple layers, for example the active layer 14 may be a multi-quantum well (MQW) heterostructure. Quantum dots or other reduced dimensional structures may also be incorporated. Further, additional layers, such as buffer layers between the substrate and other layers may be included. Moreover, the order of the p-type and n-type layers can be reversed with respect to the substrate. To provide waveguiding in the active layer(s), the active and waveguiding layers are bounded in the stack direction (z-direction) by areas of lower refractive index (cladding layers $12_1$ and $16_2$). The vertically adjacent parts of the p-type and n-type layers are given a lower refractive index than the active layer by a suitable material choice in a heterostructure. It will be understood that reference to top and bottom are for convenience. For example, flip-chip bonding techniques may be applied which would reverse the layer sequence in a packaged device compared to the layer sequence as grown.

LD chips according to our designs can be used for green and blue emitters in particular, but also can be used for red emitters.

Commercially, the dominant materials system for current blue or green LDs is based around gallium nitride and related materials, principally those in which gallium is partially or wholly substituted with aluminum and/or indium in the quaternary system GaAlInN.

Gallium nitride and related semiconductor compounds have a Wurtzite crystal structure, which is hexagonal with the hexagonal axis being referred to as the c-axis, or {0001} in the usual notation. The plane perpendicular to the c-axis is referred to as the c-plane. The substrate orientation can be in the c-plane, which is polar, or some other plane where the polarity is reduced or eliminated, referred to as semi-polar (SP) or non-polar (NP) orientations respectively. Example NP planes are the a-plane {11-20} and m-plane {10-10}. Example SP planes are {11-22} and {20-21}. The advantage of reducing or eliminating the polarity is that any subsequent Wurtzite layers which are not lattice-matched and pseudomorphic with the substrate will have their electric polarization fields reduced or eliminated. The Wurtzite crystal orientation in relation to the LD structure can therefore have different permutations depending on what is desired. For example, the c-axis may be aligned with the z-axis (c-plane structure), or may be aligned with the y-axis (NP structure), or may have some intermediate alignment (SP structure).

It is usual to measure efficiency and other performance characteristics of a LD by various different parameters. The most fundamental parameter for efficiency from a physics perspective of the semiconductor part of the LD is quantum efficiency (QE), namely the percentage of photons emitted per the number of electron-hole pairs that should be generated in the pn-junction assuming that all the drive current is converted into such electron-hole pairs. QE can be subdivided into the efficiency with which photons are coupled out of the laser structure (light extraction efficiency) and the efficiency with which photons are generated in the gain medium from the drive current (internal quantum efficiency). In turn, the internal quantum efficiency is the product of radiative efficiency and current injection efficiency (usually referred to as $\eta_{inj}$). Current injection efficiency is the percentage of drive current that results in electron-hole pairs being injected into the gain medium. Radiative efficiency is the percentage of those electron-hole pairs which reach the gain medium that recombine as desired to create a photon of the desired wavelength.

Separately from this discussion of quantum efficiency, the cavity in any laser will have losses arising from the mirrors and from the light absorption in the epitaxial stack (doping or defect induced) or light scattering at the ridge waveguide boundaries. The sum of these last two gives the so-called internal loss and denoted $a_i$. While mirror losses are to a large extent a design choice, i.e. dictated by the choice of reflectivities of the end mirrors, the internal loss is a 'real' loss caused by intrinsic properties of the materials used for the epitaxial structure or induced by process imperfections, such as scattering or absorption at the lasing wavelength. The fact that the laser is emitting constitutes a loss, so the existing of the 'leaky' output coupler mirror constitutes a loss of photons which would otherwise continue circulating in the cavity. Moreover, the gain medium itself will cause loss of photons through various diverse physical effects which may be more or less prevalent depending on the nature and design of the epitaxial stack. Examples are photon absorption (by the crystal lattice or doping in our case) or scattering out of the cavity. Internal losses $a_i$ are typically of the order of ones to low tens of inverse centimeters (say 3-30 $cm^{-1}$). Lower mirror losses and higher internal losses $a_i$ mean that more drive current is needed to achieve a given increase in power, that is the so-called "slope efficiency" is reduced, i.e. the optical output power to input drive current ratio.

Commercially, what is most important is wall-plug efficiency (WPE) which as well as the QE incorporates any other losses that may occur. Namely, WPE is the ratio of output optical energy of the laser to input electrical energy, i.e. from the mains supply at the "wall plug". Although in principle WPE should include all system losses, including for example power supply losses, powering of coolers, losses in output coupling optics and so forth, usually WPE is defined more narrowly in terms of the LD itself without peripherals, as the ratio of output optical power from the LD (without any optics other than the cavity mirrors) and input electrical power to the laser diode (i.e. excluding any electrical power consumption or losses external to that). We adopt this common usage in the present document.

We also note that in the present document electrical power consumption is generally referred to as power consumption and is the product of the drive current and applied voltage V across the LD, which is averaged over a cycle in the case of pulsed operation.

The structure of a blue or a green LD chip may be made from the GaAlInN materials system in which one or a multiple number of light emitting, active layers are sandwiched between doped layers of different type. The active layers may contain Ga, Al and In elements in any desired alloy to provide the desired band gaps, refractive indices and other relevant properties in the heterostructure. The p-type layers are arranged above the active layers in the stack, i.e. towards the surface of the device structure. The n-type layers are arranged below the active layers, i.e. in between the light emitting, active layers and the substrate. The substrate may be a c-plane free-standing GaN substrate, or a GaN substrate of a non-polar or semi-polar orientation. Both n-type and p-type layers may contain different molar percentages of the substitutional elements Al, In and Ga to provide the desired band gaps, refractive indices and other relevant properties in the semiconductor heterostructure.

In blue and green LD chip embodiments, the heterostructure includes one or a multiple number of light emitting layers (active layers) that are sandwiched between doped layers of different type. The active layers may contain Al, In, Ga, N elements. P-type layers are above, towards the surface of the device. N-type layers are below, in between the light emitting layers and a substrate (preferably c-plane freestanding GaN). Both n- and p-layers may contain Al, In, Ga, N elements. The blue and green LDs of certain examples include:

a. n- and p-doped conducting (Al, In, Ga)N layers;
b. (Al, In, Ga)N light emitting layers (light emitting layers/quantum wells—QWs); and/or
c. Light confining layers: (Al, In, Ga)N cladding layers and waveguides (which may be included in the p-layers, in the n-layers or at the upper and lower boundaries of the emitting region).

In red LD chips, the semiconductor heterostructure may be made of one or a multiple number of light emitting layers that are sandwiched between doped layers of different type. The active layers may contain In, Al, Ga, As or In, Al, Ga, P elements. P-type layers are above, towards the surface of the device. N-type layers are below, in between the light emitting layers and a substrate (GaAs). Both n- and p-layers may contain In, Al, Ga, As or In, Al, Ga, P elements. Similar to blue and green LDs, the body of the red LDs may include n- and p-conducting layers, light emitting layers (quantum wells) and/or light confining layers (claddings and waveguides).

The structure of a red LD chip may be made from the GaAlInAsP materials system. The body of the red LD can be made of one or a multiple number of light-emitting layers that are sandwiched between doped layers of different type. The active layers may contain In, Ga and P elements in any desired alloy to provide the desired band gaps, refractive indices and other relevant properties in the semiconductor heterostructure. The p-type layers are arranged above the active layers, i.e. towards the surface of the device structure. The n-type layers are arranged below the active layers, i.e. in between the light emitting, active layers and the substrate, for example a GaAs substrate. Both the n-type and p-type layers may contain Al, In, Ga, P elements in any desired alloy to provide the desired band gaps, refractive indices and other relevant properties in the heterostructure.

The semiconductor heterostructures are processed through standard process technology into devices having waveguiding structures (ridges), isolating dielectric layers, p- and n-electrode metallizations, and two end facets (mirrors). The end facets may be finally covered by dielectric coatings with a specified reflectivity.

We now discuss a first group of embodiments in which a single LD chip accommodates first and second emitters that are separately optimized for low and high slope operation.

Figure 13A:
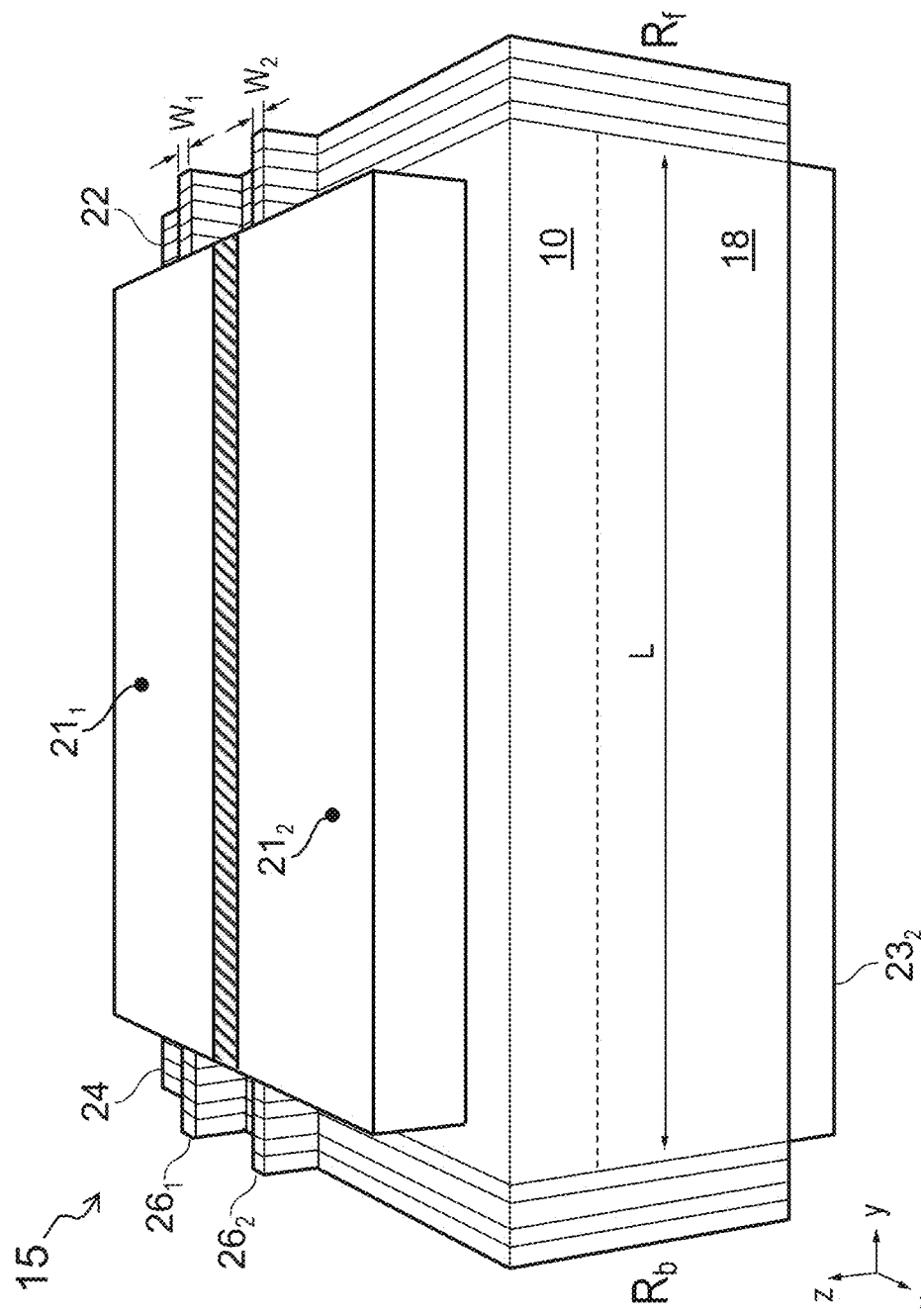
FIG. 13A is a schematic perspective drawing of a two-ridge edge-emitting LD chip according to some embodiments of the disclosure.

FIG. 13A is a schematic perspective drawing of an edge-emitting LD chip 15 according to such embodiments. The edge-emitting LD chip 15 has first and second ridges $26_1$, $26_2$ arranged side by side, instead of the usual one in a conventional ridge LD, and thus incorporates two emitters in the same chip sharing the same semiconductor heterostructure, namely the semiconductor heterostructure 10 on substrate 18 of FIG. 12. The chip 15 has a length L in the y-direction between opposed mutually parallel cleaved end facets lying in the xz-plane which is common to both ridges and their underlying waveguides. In the vertical stack direction (z-direction), the semiconductor layer structure 10 is bounded by first and second metallic top contact electrodes $21_1$, $21_2$ and first and second metallic bottom contact electrodes $23_1$, $23_2$ for independently contacting the p-type layers and n-type substrate in the region of the first and second ridges $26_1$, $26_2$ respectively. In one lateral direction (y-direction), the active layer (not shown) of the semiconductor layer structure 10 is bounded by a front reflector (i.e. mirror) 22 and a back or back reflector (i.e. mirror) 24. The front and back reflectors 22 and 24 thus form the output coupler and high reflector respectively of the laser cavity. The semiconductor layer structure 10 is etched away on its upper surface to form first and second ridges $26_1$, $26_2$ of widths $W_1$, $W_2$ respectively (and the same length L). The ridge widths may be equal or different. The purpose of the etching is to bring the active layer (not visible in FIG. 13A) sufficiently close to the surface to achieve good lateral optical confinement perpendicular to the ridge direction, i.e. in the x-direction, so as to form a linear waveguide, i.e. the gain material in the laser cavity, but not so close to the surface that scattering losses become significant. The ridges thus induce stripe portions of the active layer underlying the ridges $26_1$ and $26_2$ to form respective gain media between the reflectors 22 and 24 where population inversion is induced through injecting carriers via the pn-junction, which then recombine across the band gap generating photons of the desired wavelength. The provision of separate pairs of electrodes $21_1$ & $23_1$ and $21_2$ & $23_2$ allow the carrier injection in the two gain regions to be independently controlled. In a variant one of the top and bottom electrodes could be a single electrode covering both ridges, so there is one split electrode pair (either the top or the bottom) and one blanket electrode which is common to both ridges, wherein, the blanket electrode could be the ground electrode. The principal optical axes of the laser are in the y-direction. Each reflector 22, 24 is schematically illustrated as being a multi-layer which would be a typical construction. It is noted that both gain media share the same end reflectors 22, 24. The front and back reflectors 22, 24 are formed on one opposed pair of cleaved end facets of the crystal which are perpendicular to the surface of the device, and these end facets are coated with high reflection dielectric mirrors to form the reflectors. The mirror materials can be deposited onto the end facets of the semiconductor structure using a physical deposition technique. The reflectivities of the front and back reflectors 22 and 24 are denoted $R_f$ and $R_b$ respectively.

Figure 13B:
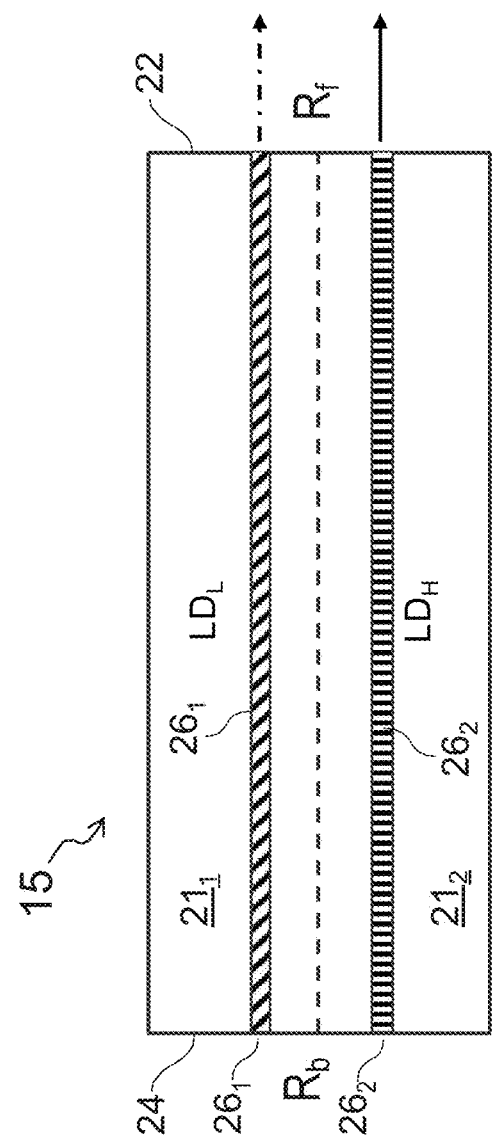
FIG. 13B is a schematic plan view of the two-ridge LD chip of FIG. 13A.

FIG. 13B is a schematic plan view of the two-ridge LD chip of FIG. 13A. The LD chip 15 accommodates two laser diodes as defined by the two ridges $26_1$ and $26_2$ which share a common cavity having been based on the same semiconductor structure 10, 18 (FIG. 12) and also sharing the same front and back reflectors 22, 24 (FIG. 13A). The laser diode, whose waveguiding region is formed in the active layer 14 under the ridge $26_1$, labelled $LD_L$, has a lower slope efficiency. The laser diode whose waveguiding region is formed in the active layer 14 under the ridge $26_1$, labelled $LD_H$, has a higher slope efficiency. The LD chip 15 can be driven using the laser diode $LD_L$ with a low slope efficiency when low power output and better power stability are required. The LD chip 15 can be driven using the laser diode $LD_H$ with a high slope efficiency when high power output and high-power efficiency are required. In the following, we sometimes refer to a low slope emitter or a high slope emitter as a short form for a low slope efficiency emitter or a high slope efficiency emitter respectively.

Figure 13C:
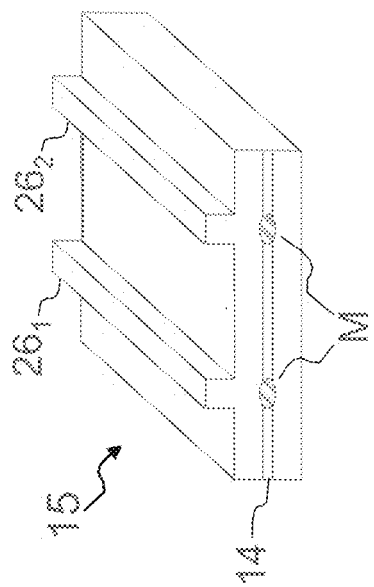
FIG. 13C is a schematic perspective drawing of the two-ridge LD chip of FIGS. 13A & 13B.

FIG. 13C is a schematic perspective drawing of the ridge LD chip structure 15 of FIGS. 13A & 13B. Under each of the first and second ridges $26_1$ and $26_2$ in the active region layers 14, an optical mode 'M' is formed, as shown schematically with the cross-hatched oval.

Figure 13D:
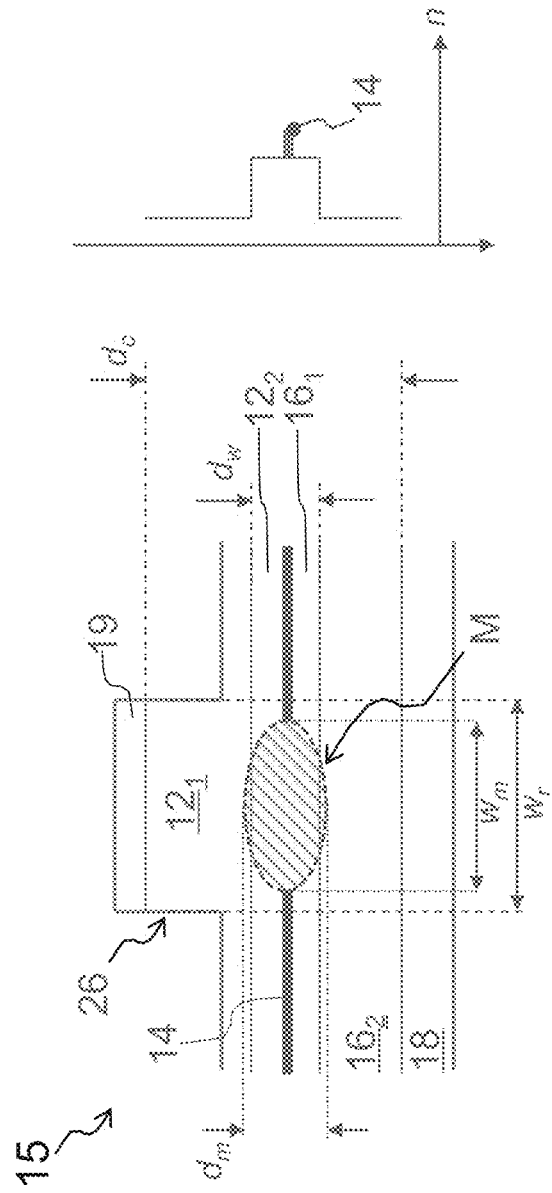
FIG. 13D is a schematic cross-section showing one ridge of the two-ridge LD structure of FIGS. 13A to 13C.

FIG. 13D (left-hand part) is a schematic cross-section showing one ridge of the ridge LD structure of FIGS. 13A to 13C combined with a schematic graph of the variation of refractive index 'n' with depth (right-hand part). An optical mode 'M' is supported in a waveguide that is defined laterally by the ridge 26 and vertically by the epitaxial design. The epitaxial layers 10 are grown on a substrate 18 by a suitable epitaxy process, such as metal-organic vapor phase epitaxy (MOVPE) or molecular beam epitaxy (MBE).

The epitaxial layers 10 from the bottom up that are deposited on the substrate 18 are: lower cladding layer $16_2$, lower waveguide layer $16_1$, active regions layer(s) 14, upper waveguide layer $12_2$, upper cladding layer $12_1$ (which extends upwards into a lower part of the ridge 26), and cap layer 19. As shown schematically in the right-hand part of the drawing, the active region layer(s) 14 are of higher refractive index than the waveguide layers $12_2$ and $16_1$, which are, in turn, of higher refractive index than the cladding layers $12_1$ and $16_2$. In terms of carriers, the outer cladding layers $12_1$ and $16_2$ are respectively doped p-type and n-type (or vice versa) to enable carrier injection across the active region layer(s) 14. The active region layer(s) 14 host in operation a reservoir of carriers that are available for stimulated emission across a suitable band gap of or within the active region, thereby providing the amplification. A functional definition of the active region layer(s) is therefore those layers which, in operation, host carriers that are available for providing amplified stimulated emission for photons propagating along the waveguide. The (vertical) thickness of the layers $16_1$, 14, $12_2$, collectively referred to as the waveguide layers, is marked as '$d_w$' and the (vertical) thickness of the fundamental mode of the waveguide is marked as '$d_m$'. The mode (vertical) thickness is somewhat larger than the waveguide layer thickness owing to the evanescent wave components. Laterally, the (horizontal) width of the ridge is marked as and the width of the fundamental mode of the waveguide as '$w_m$', where in this schematic cross-section $w_m < w_r$, although this inequality may be reversed by adjusting the etch depth of the ridge relative to the active region. The thickness of the total LD structure is labelled '$d_c$'.

Figure 13E:
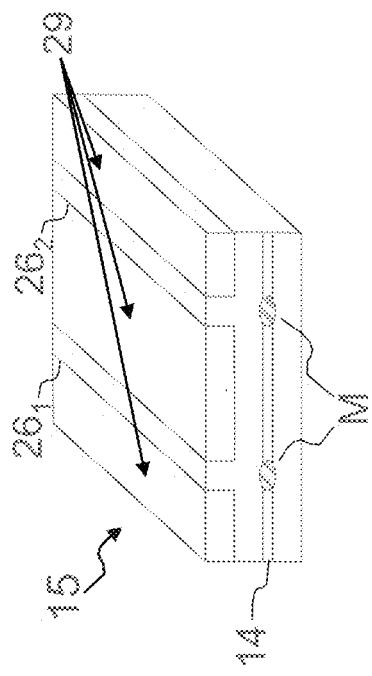
FIG. 13E is a schematic perspective drawing of a buried ridge waveguide design comparable to FIG. 13C showing a ridge waveguide design.

FIG. 13E is a schematic perspective drawing of a buried waveguide design comparable to FIG. 13C showing an "unburied" ridge waveguide design. Compared to FIG. 13C, FIG. 13E shows regrown infill regions 29 which together with the ridges $26_1$ and $26_2$ (and optionally also capping layer 19) form a layer of the structure. The infill regions 29 may be undoped semiconductor material. The material of the infill is preferably chosen to have a refractive index less than that of the ridge material so that waveguiding occurs under the buried ridge. In addition, dielectric material (not shown) may be deposited on the overgrown infill material around the ridge to promote guiding of the injection current into the gain medium.

Figure 13F:
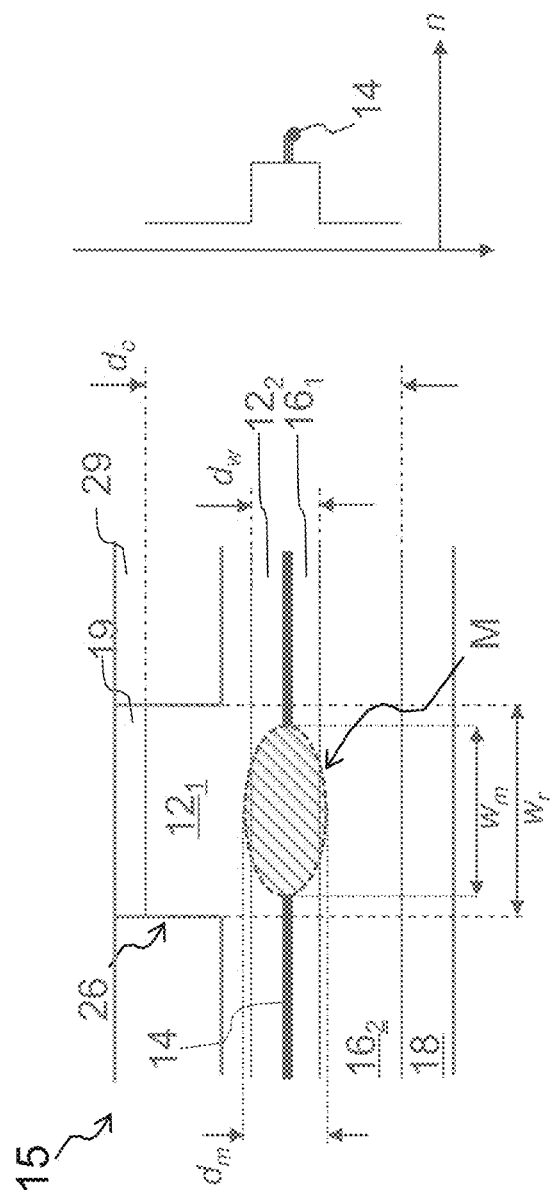
FIG. 13F is a schematic cross-section of a buried ridge waveguide design comparable to FIG. 13D showing a ridge waveguide design.

FIG. 13F is a schematic cross-section of a buried waveguide design as shown in FIG. 13E with the infill region 29. FIG. 13F is comparable to FIG. 13D for the ridge waveguide design.

Figure 14:
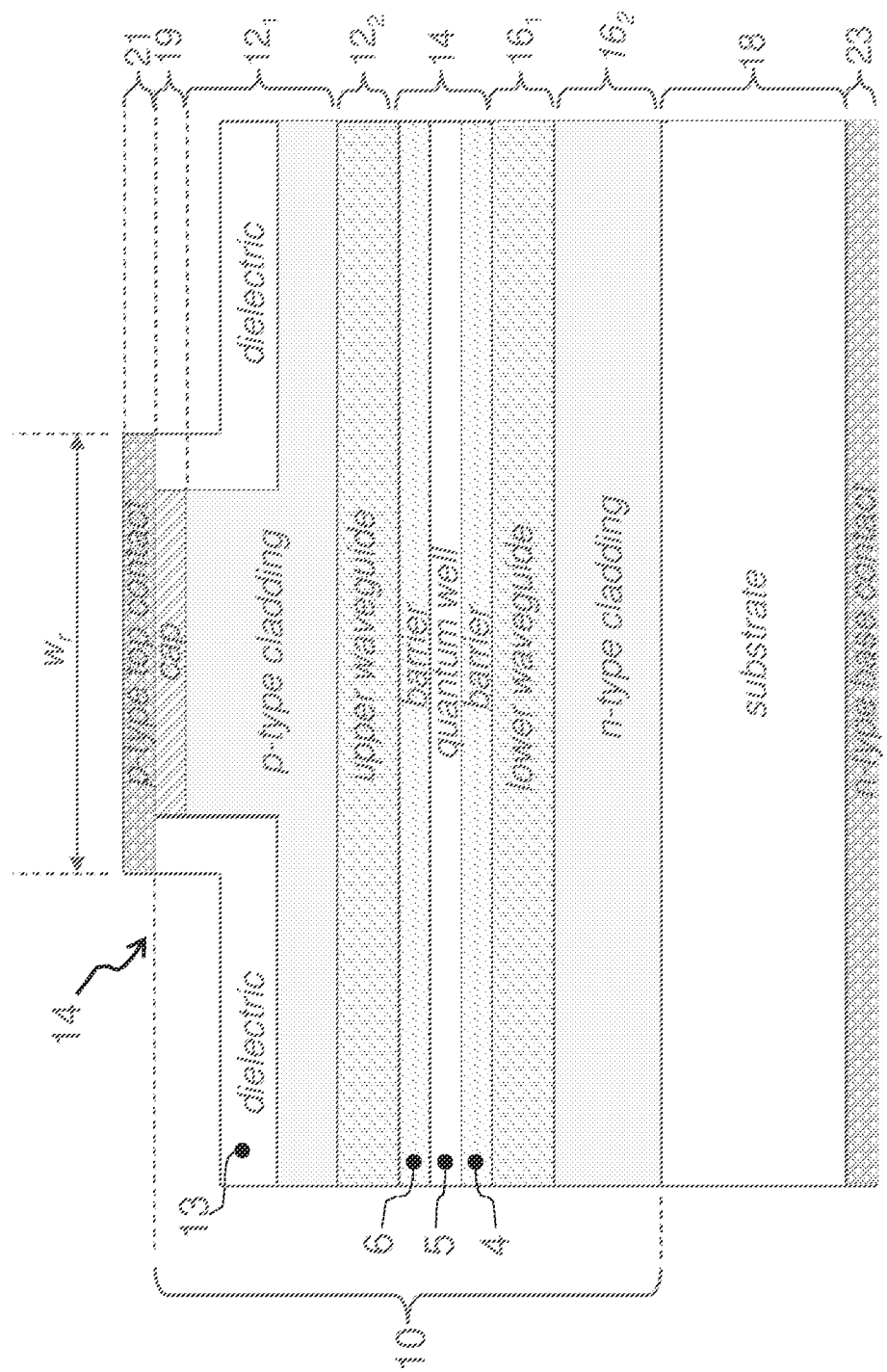
FIG. 14 is a schematic cross-section in more detail than FIG. 13D showing the layer structure of an example LD chip with one of the ridges being shown.

FIG. 14 is a schematic cross-section showing an example layer structure in more detail than FIG. 13D. Only one of the two ridges is shown. The other ridge has the same layer sequence, but may differ as a result of different processing, e.g. may have a different ridge width, ridge etch depth or ridge shape. The semiconductor epitaxial layers 10 are arranged on a substrate 18. The epitaxial layers 10 are, from the substrate 18 up: lower outer cladding layer $16_2$, lower inner cladding layer $16_1$, active regions layers 4, 5 and 6 (collectively labelled as 14), upper inner cladding layer $12_2$, upper outer cladding layer $12_1$, and cap layer 19. The active region layers 4, 5, 6 are of higher refractive index than the waveguide layers $16_1$, $12_2$, which are in turn of higher refractive index than the cladding layers $16_2$, $12_1$. In terms of carriers, the cladding layers $16_2$, $12_1$ are respectively doped p-type and n-type (or vice versa) to enable carrier injection across the active region layer(s) 14. The active region layers 4, 5, 6 form a QW structure, with a well layer 5 sandwiched between lower and upper barrier layers 4 and 6. If the active region includes multiple QWs, then this layer structure will be repeated for each QW. In operation, each well hosts a reservoir of carriers that are available for stimulated emission, each well having a suitable band gap (or band gaps) for providing the amplification. Each ridge 26 is formed after growth of the epitaxial structure by etching away the cap layer 19 and a part of the cladding layer $12_1$. A dielectric layer 13 is then deposited to cover the surface of the outer cladding layer 13. A top contact layer 21 is deposited on the top of each ridge 26 over the cap layer 19, and a base contact layer 23 is deposited on the underside of the substrate 18, the contacts serving as electrodes to allow the drive current to be applied across the active region 14. It will be appreciated that each of the illustrated layers may be made of multiple layers. Additional layers may also be included, e.g. buffer layers immediately on top of the substrate. Moreover, other structures are possible, e.g. with graded refractive index designs.

Regarding the thickness of the active region 14, this is principally defined by the thickness of the waveguide core between the waveguide layers, the core being formed by the QW region and the cladding being formed by the inner cladding layers. We define the active region thickness in this document as either the sum of the thicknesses of the layers 4, 5, 6 between the lower and upper waveguide layers $16_1$ and $12_2$, or the distance between the bottom of the upper waveguide layer $12_2$ and the top of the lower waveguide layer $16_1$. In a typical implementation using a single QW or multiple QWs made up of one or more QW layers and corresponding barrier layers, the active region thickness will be the sum of the thicknesses of the well and barrier layers, possibly including any additional layers that may be present between the (M)QW structure and the waveguide cladding layers. Another alternative is to have an active region without quantum wells, i.e. based on a conventional pn-junction across a bulk, i.e. 3D, band gap.

Each LD emitter is split in two independently controllable lasers that are arranged side by side separated by a short lateral distance: one LD with low slope efficiency (LDL) and one with high slope efficiency ($LD_H$). The two LD emitters are arranged in different regions of the same chip. Each emitter can be independently addressed by the drive electrodes depending on the required output power regime.

FIG. 15 is a table summarising material choice options for the different epitaxial layers for each of four known materials systems for fabricating LDs. In the left-hand column: the label 'cladding' corresponds to the outer cladding layers $16_2$, $12_1$; and 'waveguide' the inner cladding layers $16_1$, $12_2$. The principal materials systems of choice for fabricating LDs, as set out from left to right in the table are GaAlInN (sometimes referred to as GaN-based or nitride-based) for the wavelength range 390-570 nm, GaAlAs (sometimes referred to as arsenide-based) for the wavelength range 570-1150 nm, GaAlInP (sometimes referred to as phosphide-based) for the wavelength range 1150-2000 nm, and GaAlInAsSb (sometimes referred to as antimonide-based) for the wavelength range 2000-2700 nm. For current commercial LDs in the visible and near infrared (NIR) ranges, phosphide- and arsenide-based systems are predominantly used for red wavelengths and nitride-based systems for blue and green wavelengths.

Figure 16:
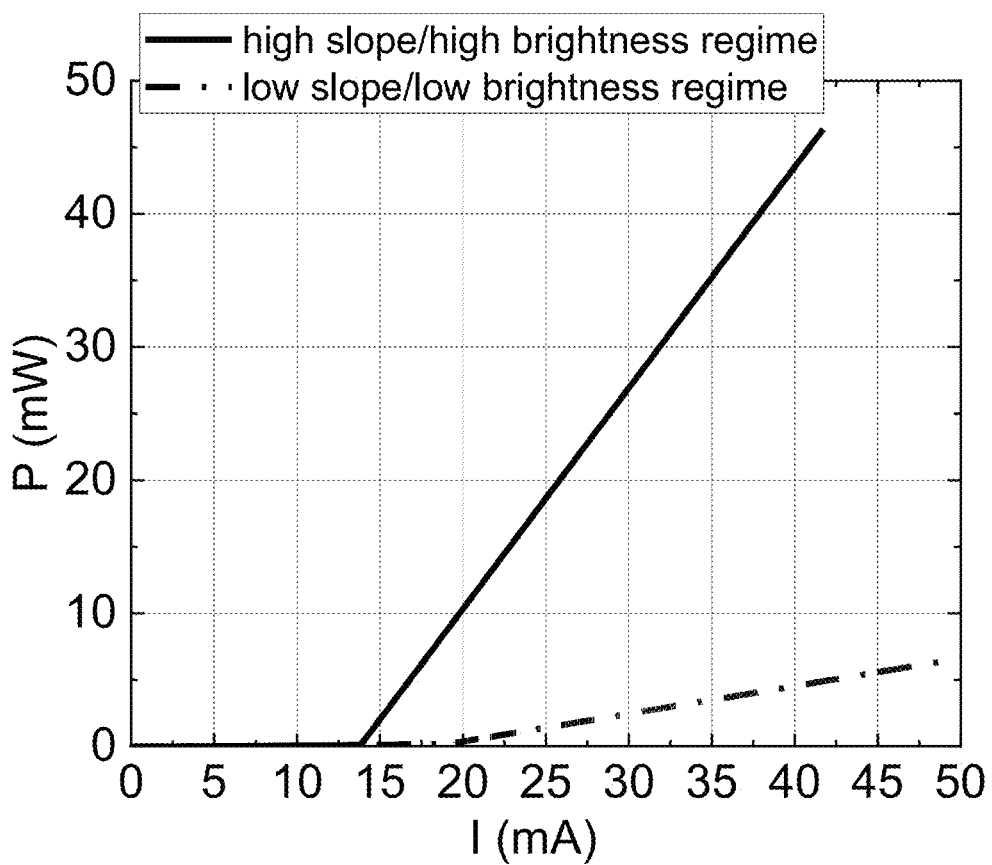
FIG. 16 shows LI-characteristics of a two-ridge LD chip where one emitter for use at low output powers has low slope efficiency and the other emitter for use at high output powers has high slope efficiency.

FIG. 16 shows output power, P, vs current, I, for the LD emitter chip, where laser $LD_L$ has a slope efficiency of approximately 0.2 mW/mA and laser $LD_L$ has a slope efficiency of approximately 1.6 mW/mA. How two lasers with different slope efficiencies can be accommodated in the same chip is described in detail below. The specific examples reported below are for LD chips emitting in the blue spectral region, but the design can be extended to chips emitting in the green and red spectral regions.

Figure 17:
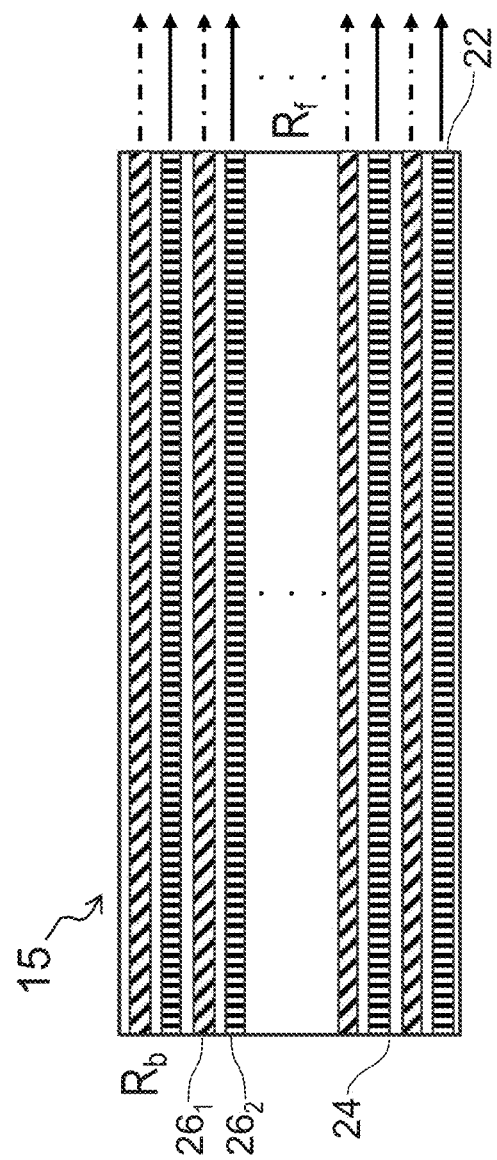
FIG. 17 is a schematic plan view of a variant of the embodiment of FIGS. 13-14 with multiple pairs of ridges to provide multiple low slope efficiency LDs and multiple high slope efficiency LDs in an array.

FIG. 17 is a schematic plan view of a variant with multiple pairs of ridges $26_1$ and $26_2$ to provide multiple low slope efficiency LDs and multiple high slope efficiency LDs.

Although a plethora of parameters define the performance of a ridge LD, we use the parameter space defined by the following parameters to engineer two different slope efficiency laser diodes in the same chip:

| Parameter | Symbol | Unit | Type |
|---|---|---|---|
| Cavity Length | L | m | geometric |
| Ridge width | W | m | geometric |
| Back reflector reflectivity | $R_b$ | % | physical |
| Front reflector reflectivity | $R_f$ | % | physical |
| Internal loss of gain medium | $\alpha_i$ | $m^{-1}$ | physical |

The general effect of varying these parameters is known and is as follows.

The slope efficiency increases when:
$R_f$ is decreased
$R_b$ is increased
$a_i$ is decreased
L is decreased The threshold current decreases when:
$R_f$ or $R_b$ is increased
$a_i$ is decreased
L is decreased Additionally, when the back-facet reflectivity Rb is decreased, the LD threshold current increases while the slope efficiency decreases.

The slope efficiency does not change significantly with ridge width for typical ridge width values in the range 1-4 μm. In the following examples, if not stated, the ridge width, W, is 2 μm.

Figure 18A:
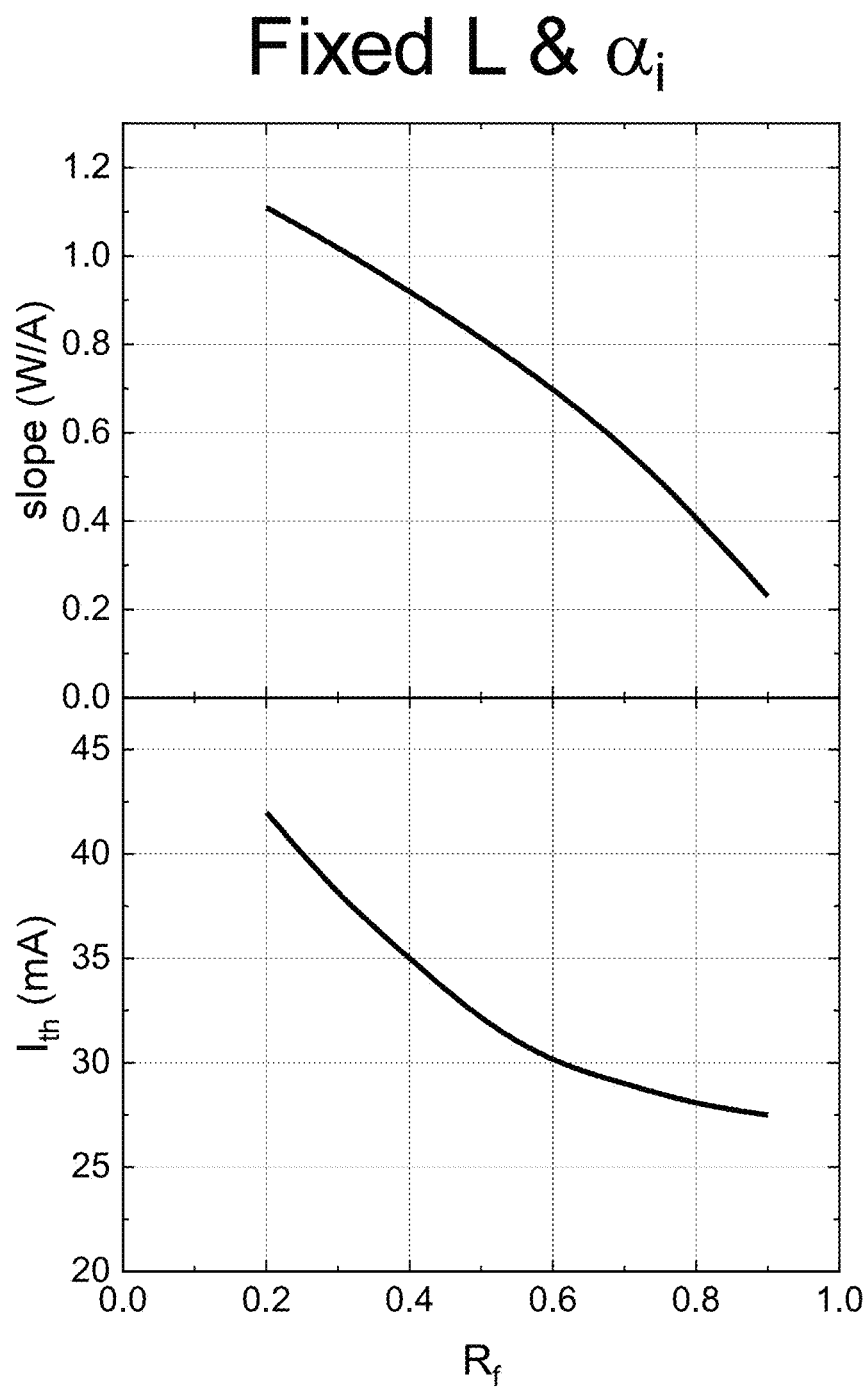
FIGS. 18A, 18B and 18C are three pairs of graphs showing the parameter space that can be explored by varying the parameters front reflectivity $R_f$, cavity length L and internal loss $a_i$.
Figure 18B:
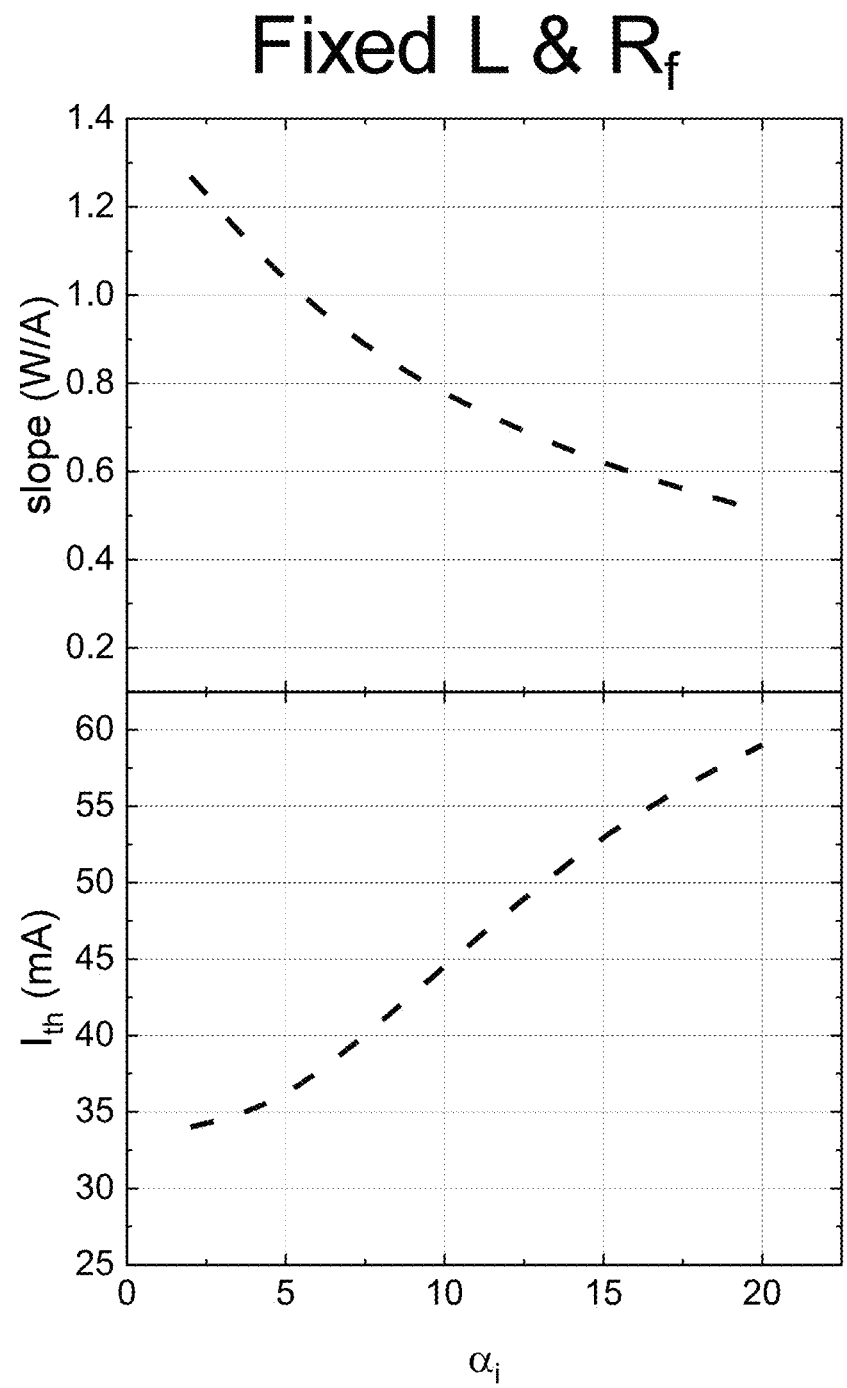
Figure 18C:
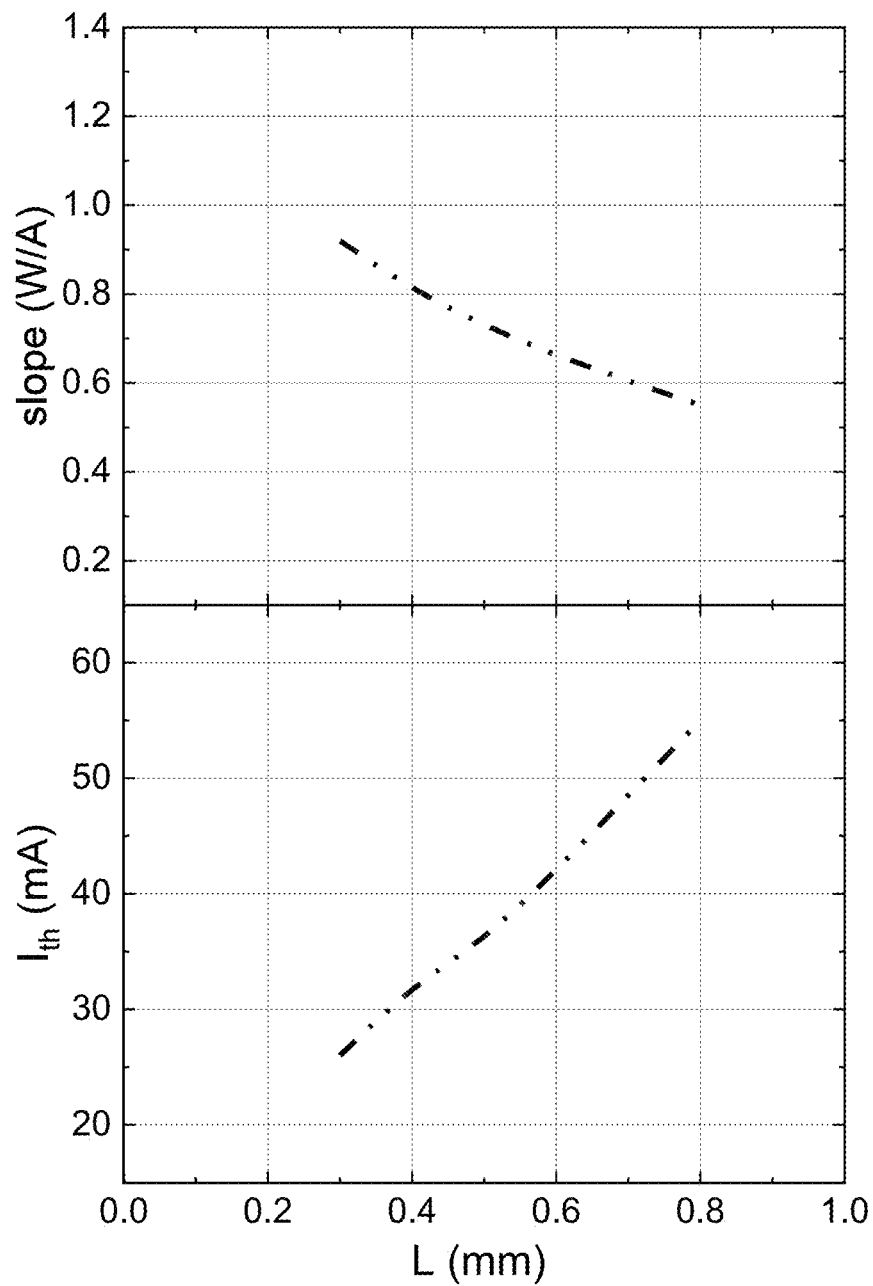

FIGS. 18A, 18B and 18C are three pairs of graphs showing the parameter space that can be explored by varying the parameters Rf, $a_i$ and L. FIG. 18A shows the effect of varying front reflectivity $R_f$ when cavity length L and internal loss $a_i$ are fixed. FIG. 18B shows the effect of varying cavity length L when internal loss $a_i$ and front reflectivity $R_f$ are fixed. FIG. 18C shows the effect of varying front reflectivity $R_f$ when cavity length L and internal loss $a_i$ are fixed. The illustrated ranges are by way of example only and should not be taken as target values.

Based on those considerations, a low slope emitter $LD_L$ may be produced by:
Higher front facet reflectivity $R_f$ (lower slope and lower threshold compared to the high slope emitter $LD_H$ on the same chip);
Higher internal $a_i$ (higher threshold and lower slope compared to the high slope emitter $LD_H$ on the same chip);
Longer cavity length L (higher threshold and lower slope compared to the high slope emitter $LD_H$ on the same chip).
Lower back facet reflectivity Rb (lower slope and higher threshold compared to the high slope emitter $LD_H$ on the same chip).

Certain embodiments of the disclosure can have design parameters values for both $LD_L$ and $LD_H$ lying in the following ranges:
Cavity length: 300 mm L 2000 mm
Internal loss: 0 $cm^{-1} \le a_i \le 30$ $cm^{-1}$
Back facet reflectivity: 10%$\ge R_b \ge$100%
Front facet reflectivity: 10%$\le Rf \le$80%
Monolithic mirror reflectivity: 10% $R_M$ 95%
Waveguide tilt angle at the back facet: 0° q 5°

Several different design approaches for designing a dual-slope LD chip having at least one low slope and at least one high slope emitter are now disclosed. These design approaches are discussed in turn with reference to a single pair of emitters $LD_L$ and $LD_H$. Each of these design approaches may however be adapted to conform to the array design of FIG. 17 with multiple low slope and/or multiple high slope emitters, e.g. arranged in pairs.

A first design approach provides the low slope efficiency emitter $LD_L$ with a higher front reflectivity Rf compared to the high slope efficiency emitter $LD_H$. The emitters $LD_L$ and $LD_H$ share the same cavity length L, internal loss $a_i$ and back facet reflectivity $R_b$.

To provide a different front reflectivity Rf for the two emitters, one option is to coat the whole front facet to provide the desired front reflectivity for the high slope efficiency emitter and then apply an additional coating locally to the low slope efficiency emitter to increase the front reflectivity for the low slope efficiency emitter. Another option is to first fabricate a monolithic mirror a reflectivity $R_M$ at or near the front facet locally to the low slope efficiency emitter $LD_L$ and then a blanket front coating is deposited over the whole front facet. The slope efficiency on the $LD_L$ emitter can thus be set lower or higher by respectively increasing or decreasing $R_M$.

FIGS. 19A and 19B show respectively in plan view and cross-section schematic representations of a laser diode chip according to this design approach with a monolithic mirror with reflectivity $R_M$ for the low slope laser diode $LD_L$.

The monolithic mirror can be produced during the LD fabrication process by standard processing techniques including standard and e-beam lithography, semiconductor etching and dielectric coating deposition.

Figure 20:
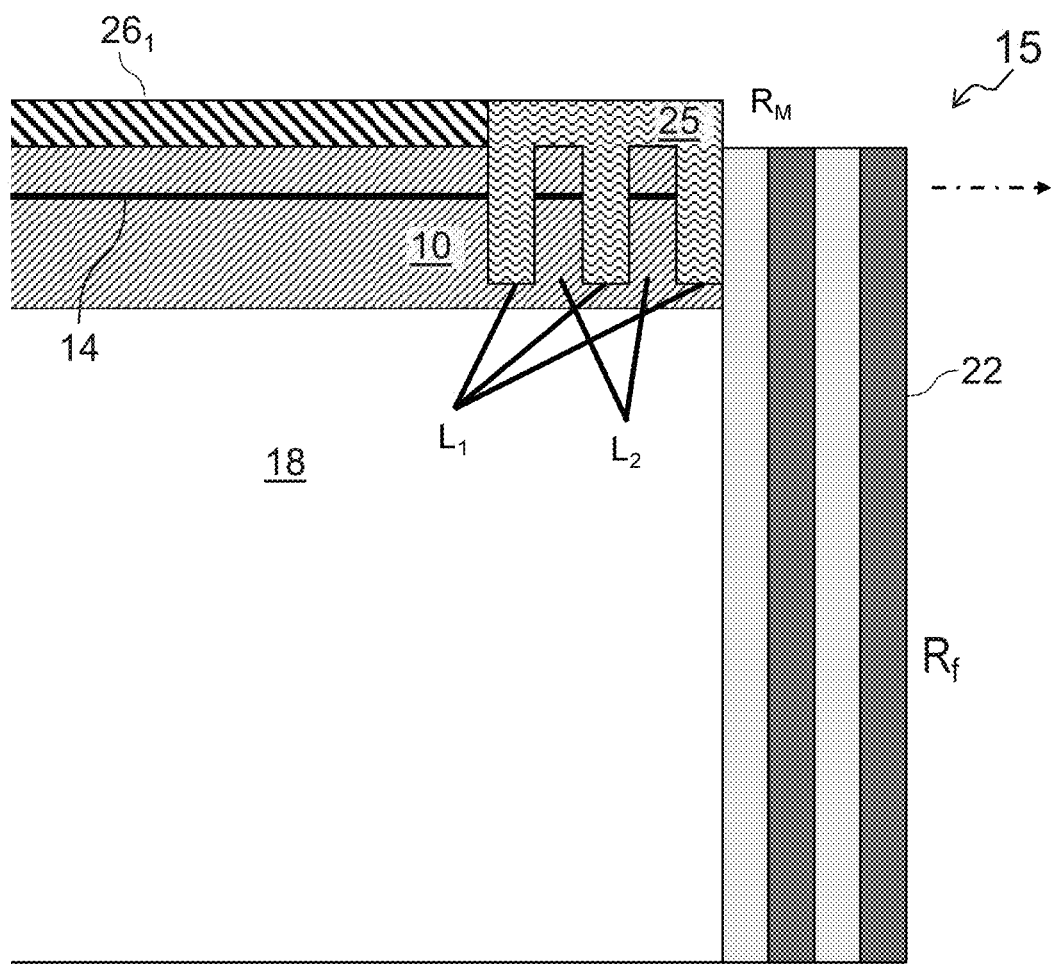

FIG. 20 shows an example to realize a monolithic mirror. Periodic channel structures with properly chosen dimensions ($L_1$ and $L_2$) are defined by e-beam lithography and by dry etching the channels. The air gaps in the channels are then filled with an insulating material. This forms a Bragg reflector 25 with a desired reflectivity $R_M$. The reflectivity can be set to a design value by appropriate choice of the parameters $L_1$, $L_2$ and by using an insulating material with a suitable optical refractive index. Oxides and nitrides such as $SiO_2$, SiN, AlN, $Al_2O_3$, $Ta_2O_5$, $HfO_2$, $ZrO_2$, $TiO_2$ can be used for this purpose.

Figure 21:
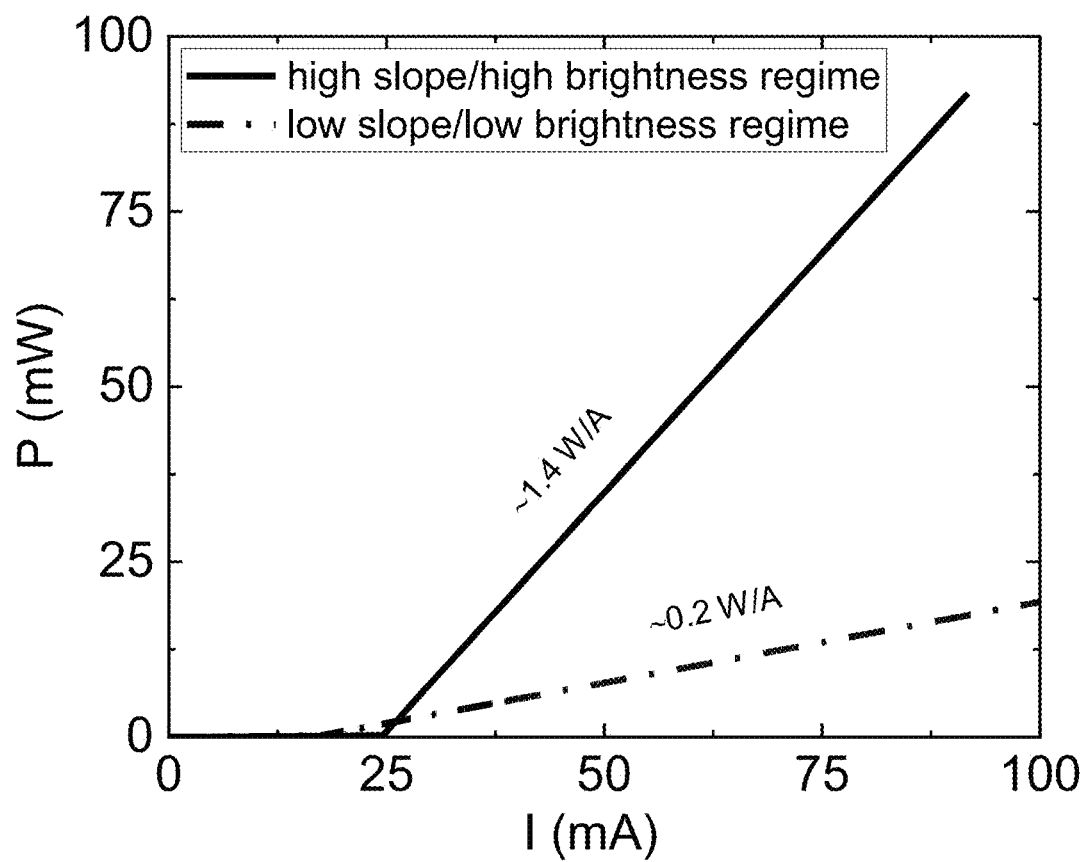

FIG. 21 shows power, P, vs current, I, curves for an example blue LD according to a high Rf design as shown in FIG. 20. The example LD chip has the following parameter values:
Cavity length: L=600 μm
Internal loss: $a_i$=5 $cm^{-1}$
Back facet reflectivity: $R_b$=80%
Front facet reflectivity (high slope emitter): Rf=20%
Front facet reflectivity (low slope emitter): Rf=90% (combined value from Bragg reflector and end facet coating)
The high slope emitter (solid line) has a slope efficiency of approximately 1.4 W/A and the low slope emitter (dash-dotted line) has a slope efficiency of approximately 0.2 W/A.

The LD chip can be run using the low slope emitter at low output powers, e.g. up to a few mW and run using the high slope emitter at high output powers, e.g. from about 10-100 mW.

The design parameters are not limited to the values used in the example as there are multiple combinations of parameters allowing the achievement of a desired performance for the low slope and the high slope LD emitters.

A second design approach provides the low slope efficiency emitter $LD_L$ with a higher internal loss a' compared to the high slope efficiency emitter $LD_H$ having a low internal loss $a_i$. The emitters $LD_L$ and $LD_H$ share the same cavity length L, front reflectivity $R_f$ and back facet reflectivity $R_b$.

Figure 22:
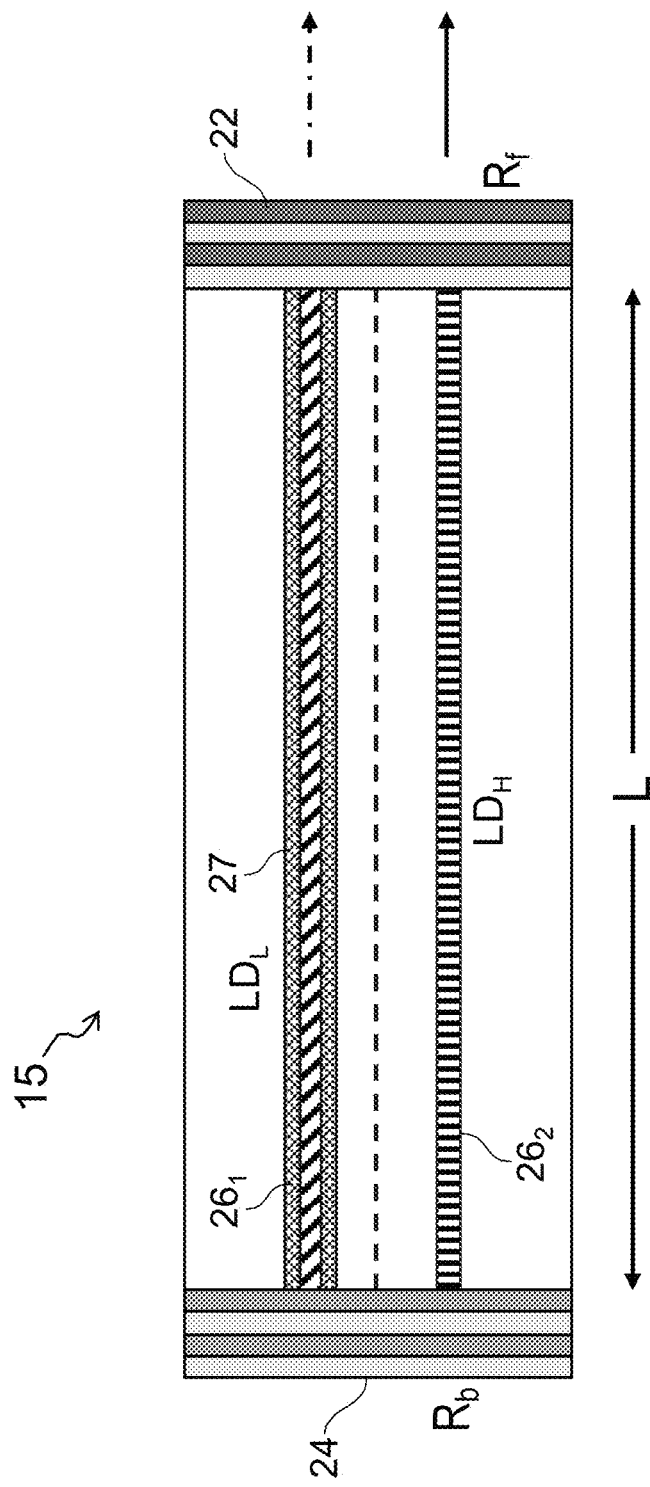
FIGS. 22 & 23 show embodiments according to a second design approach based on having different internal losses between the low and high slope lasers.

FIG. 22 is a schematic plan view of an embodiment according to this design, which is one way to increase the internal loss for the low slope emitter. The internal loss is increased by structuring the $LD_L$ waveguide during the device fabrication process with lossy regions 27 in order to increase the scattering loss at the waveguide sidewalls. Scattering loss at the waveguide sidewall can be increased by increasing the sidewall roughness and/or increasing the ridge etch depth.

Figure 23:
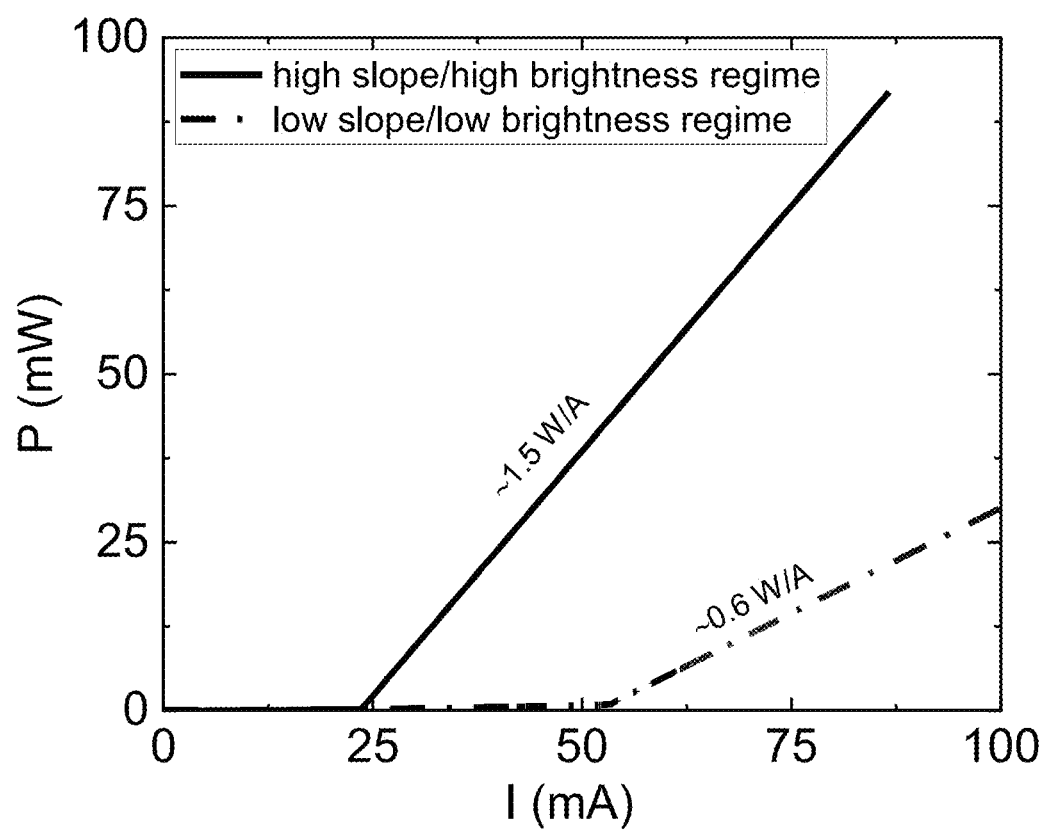

FIG. 23 shows power, P, vs current, I, curves for an example blue LD chip according to a raised internal loss design as shown in FIG. 22. The example LD chip has the following parameter values:
Cavity length: L=600 μm
Internal loss (LDH): =5 cm$^{-1}$
Internal loss (LDL): $a_i^L$=30 cm$^{-1}$
Back facet reflectivity: $R_b$=95%
Front facet reflectivity: Rf=20%
The high slope emitter (solid line) has a slope efficiency of approximately 1.5 W/A and the low slope emitter (dash-dotted line) has a slope efficiency of approximately 0.6 W/A.

The design parameters are not limited to the values used in the example as there are multiple combinations of parameters allowing the achievement of a desired performance for the low slope and the high slope LD emitters.

A third design approach shortens the cavity length for the high slope emitter. The low and high slope emitters share the front mirror, but the high slope cavity is shortened and uses a monolithic mirror as its back reflector which is fabricated within the chip part way between the front and back chip facets. The low and high slope emitters share the same internal loss $a_i$ as well as the same front facet reflectivity $R_f$.

Figure 24:
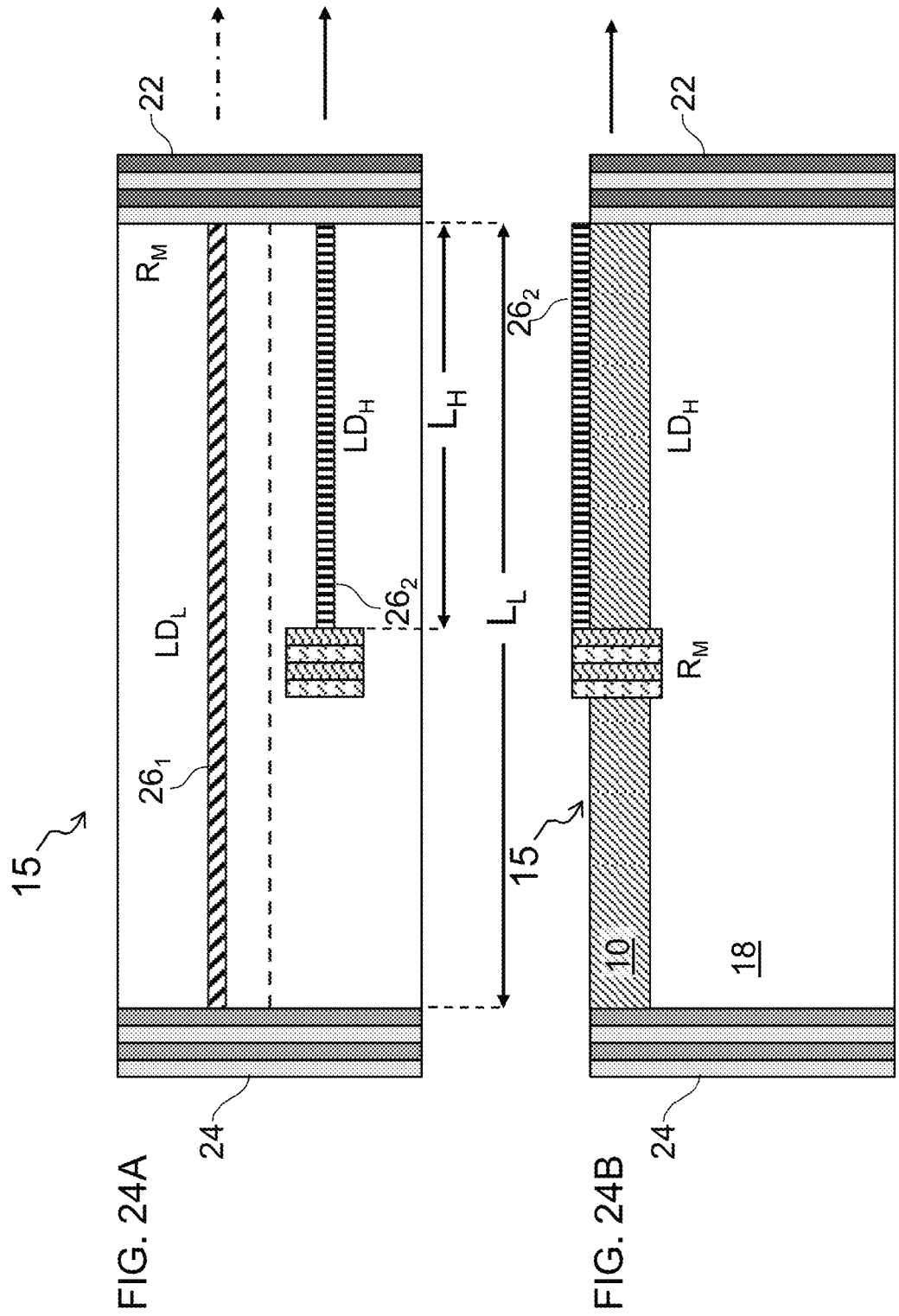
FIGS. 24A, 24B & 25 show embodiments according to a third design approach based on having different cavity lengths between the low and high slope lasers.

FIGS. 24A and 24B are schematic drawings in plan and section showing an example structure according to this design approach. To decrease the cavity length L for the high slope laser diode $LD_H$, a monolithic back mirror $R_M$ is fabricated by standard lithography and semiconductor etching processes.

Figure 25:
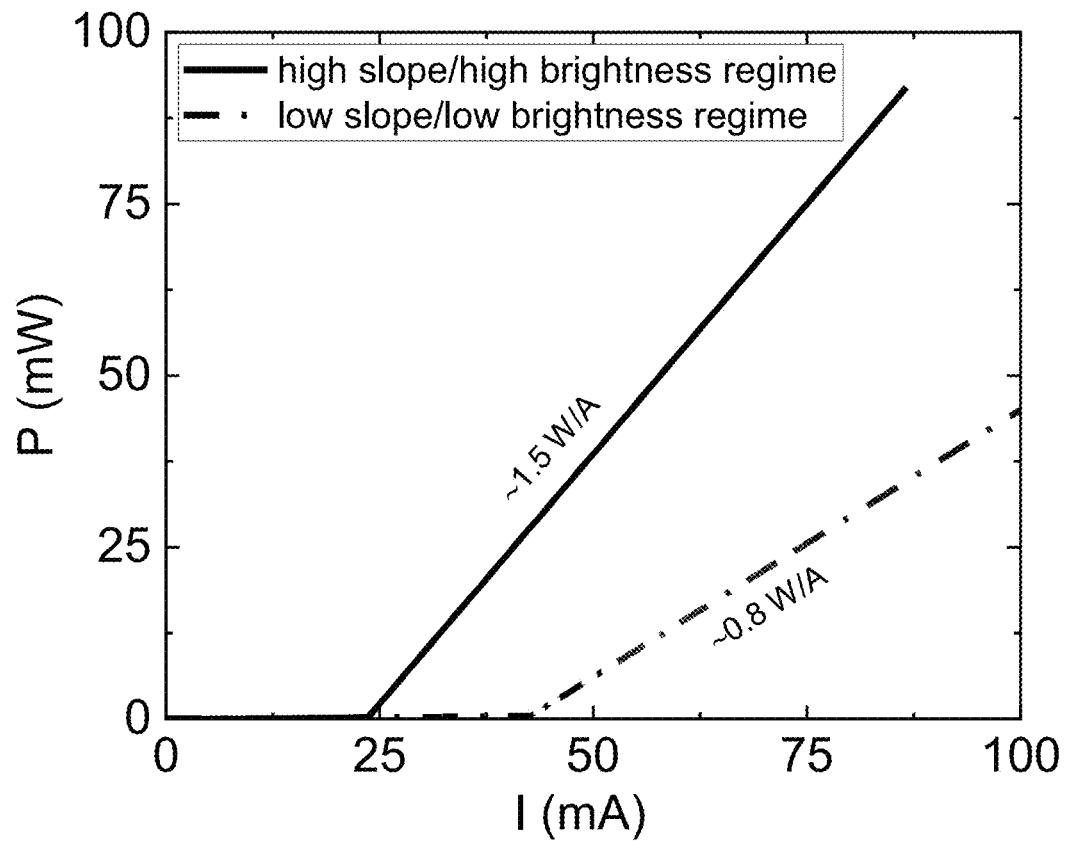

FIG. 25 shows power, P, vs current, I, curves for an example blue LD according to shortened cavity high slope laser design as shown in FIGS. 24A and 24B. The example LD chip has the following parameter values:
Cavity length $LD_L$: $L_L$=1000 μm
Cavity length $LD_H$: $L_H$=600 μm
Internal loss: $a_i$=5 cm$^{-1}$
Back facet reflectivity (=$LD_L$ back reflectivity): $R_b$=20%
Monolithic mirror reflectivity (=$LD_H$ back reflectivity): $R_M$=90%
Front facet reflectivity: Rf=20%
The high slope emitter (solid line) has a slope efficiency of approximately 1.5 W/A and the low slope emitter (dash-dotted line) has a slope efficiency of approximately 0.8 W/A.

The design parameters are not limited to the values used in the example as there are multiple combinations of parameters allowing the achievement of a desired performance for the low slope and the high slope LD emitters.

A fourth design approach is to reduce the effective back reflectivity for the low slope laser by bending the waveguide where it meets the back facet. The bend has the effect that a higher proportion of the light reflected from the back facet is not coupled back into the waveguide, thereby increasing round trip loss. The low and high slope lasers share the same cavity length L, internal loss $a_i$, front reflectivity Rf and (intrinsic) back reflectivity $R_b$.

Figures 26, 27:
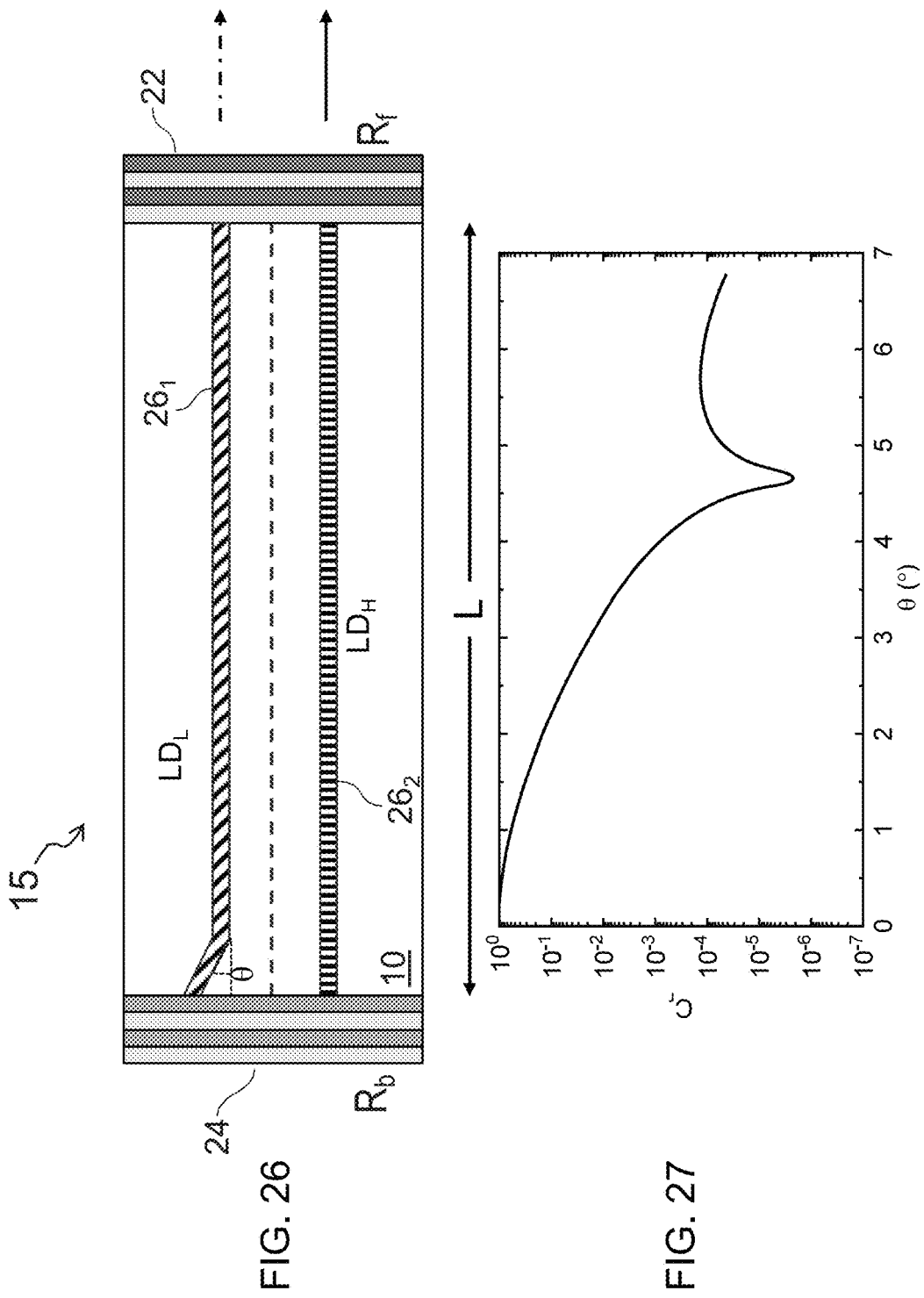
FIGS. 26 to 28 show embodiments according to a fourth design approach based on a tilted waveguide for the low slope laser to induce additional losses on reflection from the back reflector.

FIG. 26 is a schematic plan view of an example structure according to this design approach. The ridge $26_1$, and hence the underlying waveguide, of the low slope efficiency emitter $LD_L$ is bent by an angle θ so that the waveguide meets the back facet at a non-orthogonal angle. This has the effect of reducing the modal back reflectivity for the low slope emitter.

FIG. 27 is a graph showing the attenuation in the reflectivity as a function of tilt angle θ. The reflection attenuation coefficient $c_r$ that is desired will typically be in the range 10^0 to 10^−1, which for this example means a tilt angle θ≤2°.

Figure 28:
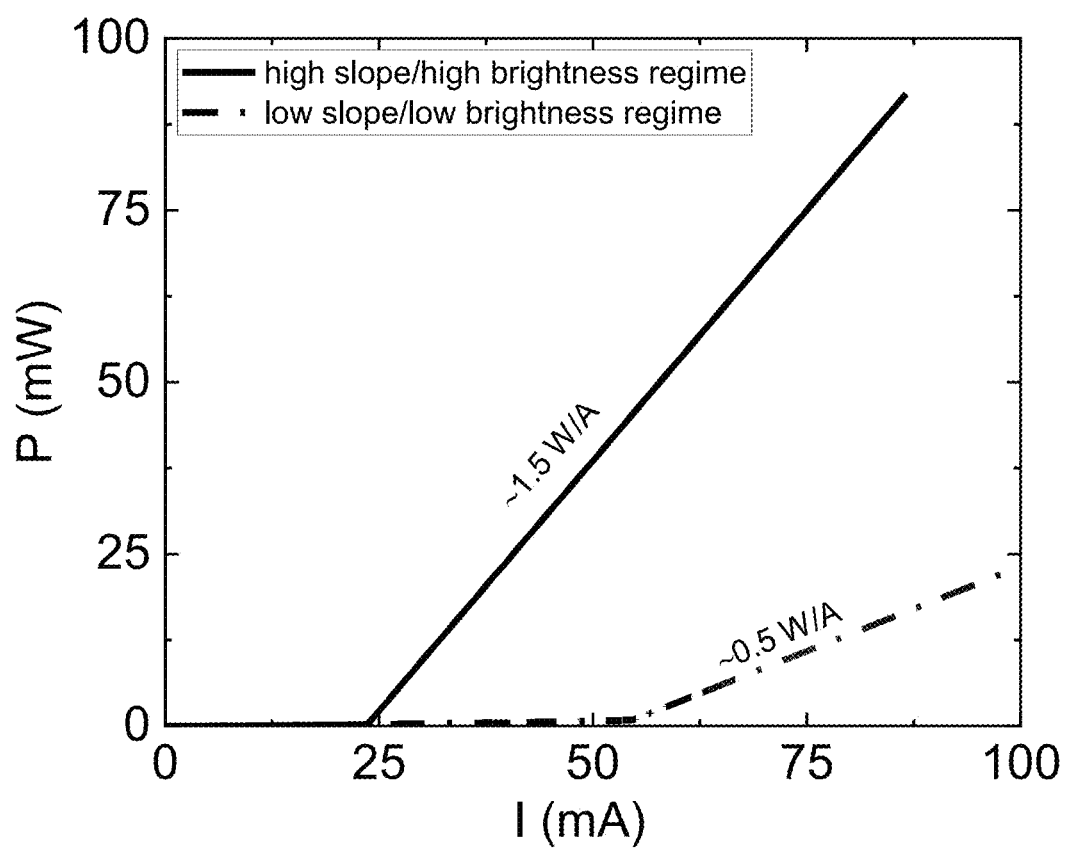

FIG. 28 shows power, P, vs current, I, curves for an example blue LD chip according to the tilted waveguide design as shown in FIG. 26. The example LD chip has the following parameter values:
Cavity length: L=600 μm
Internal loss: $a_i$=5 cm$^{-1}$
Back facet reflectivity (intrinsic): $R_b$=95%
Front facet reflectivity: Rf=20%
Tilt angle at the back facet: q=2°
The high slope emitter (solid line) has a slope efficiency of approximately 1.5 W/A and the low slope emitter (dash-dotted line) has a slope efficiency of approximately 0.5 W/A.

The design parameters are not limited to the values used in the example as there are multiple combinations of parameters allowing the achievement of a desired performance for the low slope and the high slope LD emitters.

It will be understood that further design permutations are possible by combining two or more of the first to fourth design approaches of the dual-slope LD chip embodiments.

We now discuss a further group of embodiments that provide a single emitter in a single LD chip by combining a bias-dependent absorber section and a lasing section in a single waveguide. These two-section waveguide embodiments have in common that the LD chip can be operated to have a low slope efficiency or a high slope efficiency as desired depending on the desired power stability and output power. The first and second sections are arranged in series between an opposing pair of end facets of the LD chip sharing a common waveguide but independent optical cavities separated by an intermediate, monolithic mirror which has a dual function of forming the output coupler for the back section and the back reflector for the front section. The bias in each section is independently controllable by having section-specific electrodes. The two sections share not only the same waveguide lengthwise in the optical axis direction, but also the same epitaxial structure. This may be based on the semiconductor heterostructure shown, by way of example, in FIG. 12. The same considerations apply as discussed further above with reference to FIGS. 12 to 15 in terms of layer sequence and choice of materials. A single emitter can therefore provide either low or high slope characteristics depending on how the electrical inputs are applied to the front and back sections. These embodiments are described in terms of a single emitter, but a single chip may incorporate multiple such emitters in an array design with multiple ridges arranged side by side.

Figure 29:
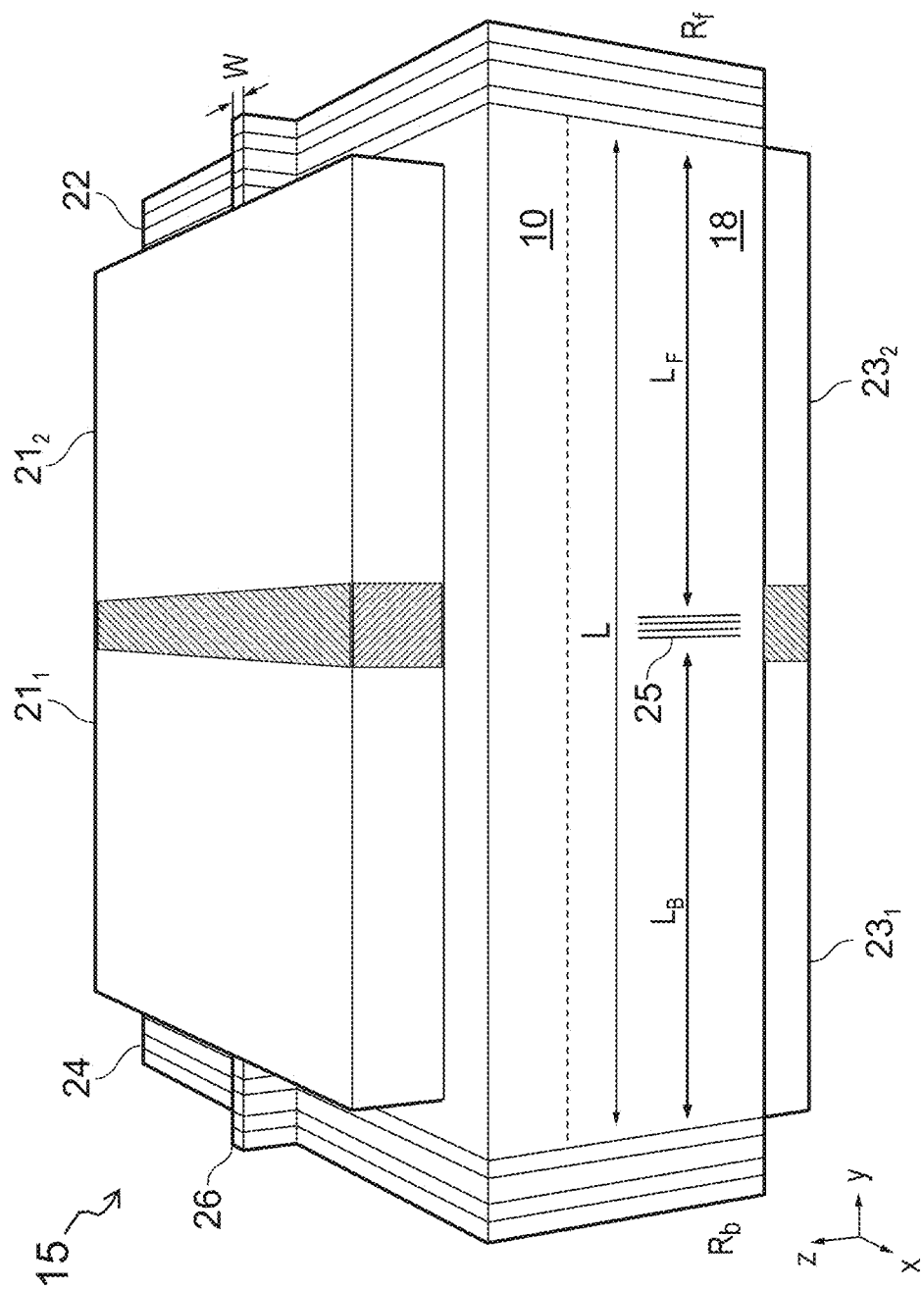

FIGS. 29 to 31 are schematic drawings of an edge-emitting LD chip 15 suitable for any of the two-section waveguide embodiments in perspective, plan and section views respectively. The edge-emitting LD chip 15 has a single ridge 26. The waveguide formed in the active layer under the ridge 26 is divided into a front section FS and a back section BS having respective lengths LF and LB. The front and back sections are separated by an intermediate, monolithic mirror 25.

The monolithic mirror 25 can be fabricated as follows. Periodic channel structures with properly chosen dimensions ($L_1$ and $L_2$) are defined by e-beam lithography and by dry etching the channels. The air gaps in the channels are then filled with an insulating material. This forms a Bragg reflector 25 with a desired reflectivity $R_M$. The reflectivity can be set to a design value by appropriate choice of the parameters $L_1$, $L_2$ and by using an insulating material with a suitable optical refractive index. Oxides and nitrides such as $SiO_2$, SiN, AlN, $Al_2O_3$, $Ta_2O_5$, $HfO_2$, $ZrO_2$, $TiO_2$ can be used for this purpose. This is as generally as shown in FIG. 20, but with the difference that the monolithic mirror is positioned away from the front reflector 22, part way between the front and back reflectors 22, 24 as shown in FIG. 29.

Each section is individually addressed by first and second metallic top contact electrodes $21_1$, $21_2$ and first and second metallic bottom contact electrodes $23_1$, $23_2$ for independently contacting the p-type layers and n-type substrate in the front and back sections respectively. An alternative is to have a non-split bottom contact electrode 23 that is common to the front and back sections while at the top the contact electrodes remain split $23_1$, $23_2$. The two waveguide sections are thus optically separated by the monolithic mirror 25 of reflectivity $R_M$. The two waveguide sections share the same semiconductor heterostructure, e.g. the semiconductor heterostructure 10 of FIG. 12, and are defined in the active layer by the same ridge, i.e. ridge 26. The semiconductor heterostructure 10 of FIG. 12 is shown in FIG. 29, but without showing the individual layers. The semiconductor heterostructure 10 has a length L in the y-direction between opposed mutually parallel cleaved end facets lying in the xz-plane. In the vertical stack direction (z-direction), the semiconductor layer structure 10 is bounded by first and second metallic top contact electrodes $21_1$, $21_2$ and first and second metallic bottom contact electrodes $23_1$, $23_2$ for independently contacting the p-type layers and n-type substrate in the region of the back and front waveguide sections respectively. In one lateral direction (y-direction), the active layer (not shown) of the semiconductor layer structure 10 is bounded by a front reflector (i.e. mirror) 22 and a back reflector (i.e. mirror) 24. The semiconductor layer structure 10 is etched away on its upper surface to form the ridge 26 of width W and length L. The purpose of the etching is to bring the active layer sufficiently close to the surface to achieve good lateral optical confinement perpendicular to the ridge direction, i.e. in the x-direction, so as to form a linear waveguide spanning both sections, i.e. the gain material for the laser, but not so close to the surface that scattering losses become significant. The ridge thus induces a stripe portion of the active layer underlying the ridge 26 to form a gain medium between the reflectors 22 and 24 where population inversion is induced through injecting carriers via the pn-junction, which then recombine across the band gap generating photons of the desired wavelength.

In these two-section waveguide embodiments designs, when the back section is operated as a laser the front section is operated as a tunable absorber with a bias-dependent modal absorption, and, when the front section is operated as a laser, the back section can either be operated as a tunable absorber with a bias-dependent modal absorption to vary the effective reflectivity of the front section's back reflector, or be deactivated so that the front section operates as a stand-alone laser using the intermediate mirror as its back reflector.

The provision of separate pairs of electrodes $21_1$ & $23_1$ and $21_2$ & $23_2$ allows the carrier injection and biasing of the front and back sections FS, BS to be independently controlled. In a variant, one of the top and bottom electrodes could be a single electrode, so there is one split electrode pair (either the top or the bottom) and one blanket electrode, wherein, the blanket electrode could be the ground electrode. The principal optical axis of the laser diode is in the y-direction. Each reflector 22, 24 is schematically illustrated as being a multi-layer which would be a typical construction. The front and back reflectors 22, 24 are formed from cleaved facets of the crystal which are perpendicular to the surface of the device, and these end facets are coated with high reflection dielectric mirrors to form the reflectors. The mirror materials can be deposited onto the end facets of the semiconductor structure using a vapor deposition technique. The reflectivities of the front and back reflectors 22 and 24 are denoted $R_f$ and $R_b$ respectively.

Although a plethora of parameters define the performance of a ridge LD, we use the parameter space defined by the following parameters to engineer a desired outcome:

| Parameter | Symbol | Unit | Type |
| --- | --- | --- | --- |
| Cavity Length (chip) | L | m | geometric |
| Cavity Length (front section) | $L_F$ | m | geometric |
| Cavity Length (back section) | $L_B$ | m | geometric |
| Ridge width | W | m | geometric |
| Back reflector reflectivity | $R_b$ | % | physical |
| Front reflector reflectivity | $R_f$ | % | physical |
| Intermediate reflector reflectivity | $R_M$ | % | physical |
| Internal loss of gain medium | $\alpha_i$ | $m^{-1}$ | physical |

In these designs, the back facet reflectivity is kept high, e.g.: Rb≥90%.

We now describe specific embodiments of the tunable absorber/laser design. The example values given for these embodiments relate to a single emitter chip emitting in the blue spectral region, but embodiments may also be realized that emit in the green and red spectral regions.

In a first embodiment of the tunable absorber/laser design, the front section FS acts as a laser diode and the back section BS acts as a tunable absorber that changes the effective reflectivity of the front section's back reflector. When the back section is functionally ineffective, e.g. at zero bias, then the laser diode of the front section becomes a stand-alone low slope efficiency laser whose back reflector is the intermediate mirror 25. Moreover, the reflectivity of the intermediate, monolithic mirror 25 is less than that of the front reflector: $R_M < R_f$.

Figure 32:
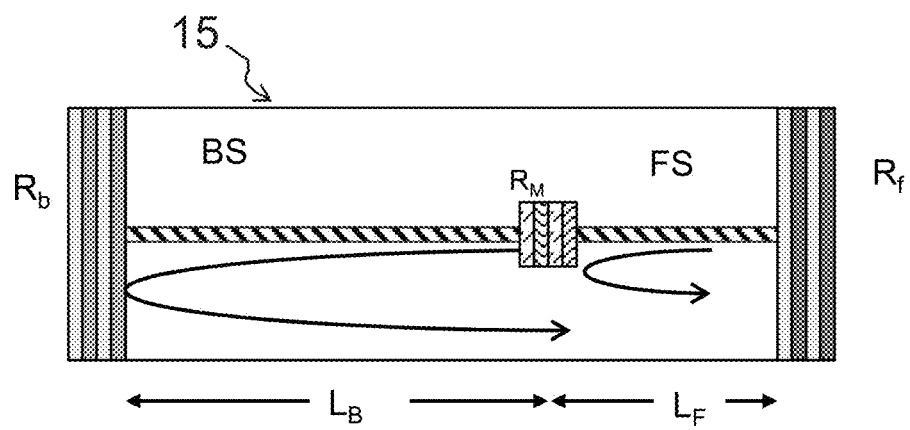
FIG. 32 is a schematic plan view of the LD chip according to an embodiment in which the front section acts as a laser diode and the back section as a tunable absorber.
Figure 33:
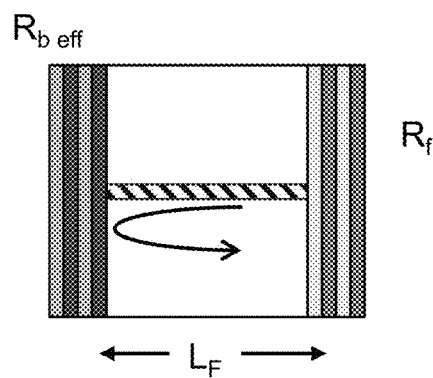
FIG. 33 shows schematically in the embodiment of FIG. 32 how the monolithic mirror and back reflector (mirror) combine in an optically equivalent way to a single mirror.

FIG. 32 is a schematic plan view of the LD chip according to an embodiment in which the front section acts as a laser diode and the back section as a tunable absorber. In the front section laser diode, the front reflector 24 acts as the output coupler and the intermediate reflector 25 acts as a leaky rear cavity mirror (e.g. with reflectivity of a few tens of percent) which transmits a significant portion of the back travelling light in the front section into the back section. The backwards travelling light that is leaked out from the back of the front section into the back section continues to be guided by the waveguide and so is incident on the back reflector 22, which is highly reflective. The forward travelling light reflected from the back reflector is then injected back into the front section via transmission through the intermediate mirror 25. The intermediate, monolithic mirror 25 and the back reflector (mirror) 22 of reflectivities Rb and $R_M$ operate in combination in an optically equivalent way to a single mirror with a reflectivity $R_{B\_EFF}$ as shown schematically in FIG. 33.

Figure 35:
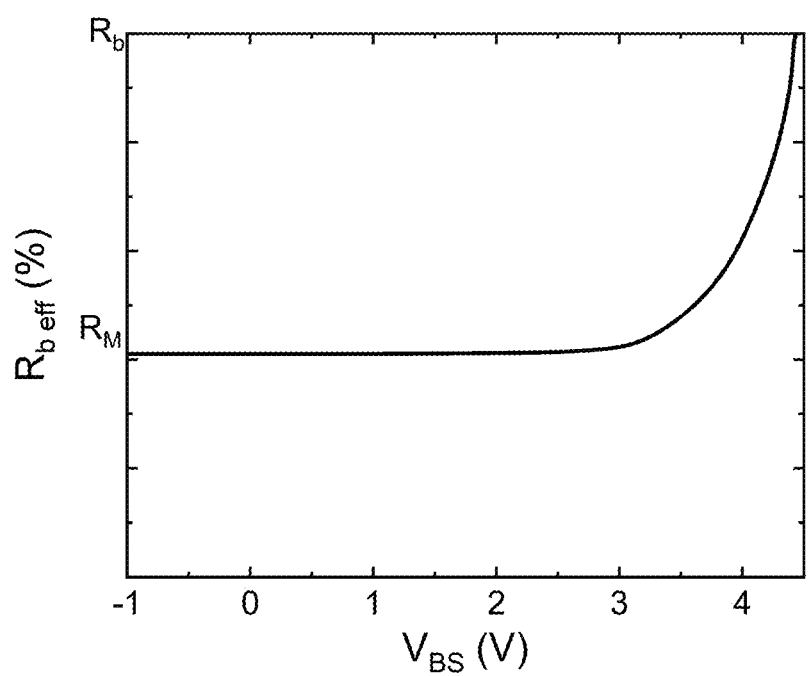
FIG. 35 is a graph showing the variance of the effective reflectivity $R_{B\_EFF}$ with back section bias voltage $V_B$.

FIG. 35 is a graph showing the variance of the effective reflectivity $R_{B\_EFF}$ with back section bias voltage $V_B$ which changes the polarization of the back section. For the design of FIG. 32, changing the bias voltage $V_B$ allows the LD chip to be switched between a high slope mode of operation with $R_{B\_EFF} \approx R_B$ and a low slope mode of operation with $R_{B\_EFF} \approx R_M$, or indeed with any two differing values of effective reflectivity that can be set within the tunable bias range as shown by FIG. 35. To exploit this effect, the intermediate mirror reflectivity $R_M$ should be lower than the front mirror reflectivity Rf and the back mirror reflectivity Rb. Specifically, the mirror reflectivities may satisfy the following constraint: $R_M < Rf < Rb$. In addition, in this embodiment it is preferred that the back mirror is highly reflective, e.g. with Rb≥90%.

Figure 34:
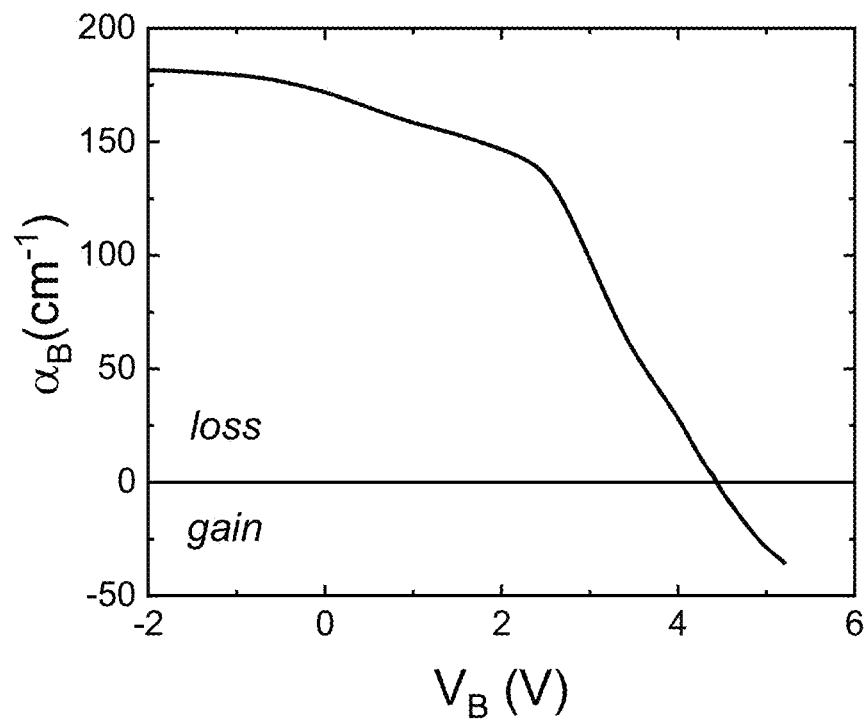
FIG. 34 is a graph showing modal absorption in the back section as a function of applied bias voltage.

FIG. 34 is a graph showing modal absorption in the back section as a function of applied bias voltage for an example structure. Absorption decreases with increasing positive bias and at a bias voltage of about 4.5 V, there is a transition from loss, i.e. net absorption, to gain through stimulated emission taking place in the back section. We propose operating with a bias voltage close to the gain/loss cross-over. This means that the absorber is configured to be slightly lossy, or perhaps very slightly in gain, but not enough to cause lasing in the absorber section, bearing in mind that other losses will also exist which would need to be overcome before the lasing threshold would be attained in the absorber section. Further details of this bias-dependent modal absorption effect are described in Scheibenzuber, Schwarz, Sulmoni, Carlin, Castiglia and Grandjean "Bias-dependent absorption coefficient of the absorber section in GaN-based multisection laser diodes" Appl. Phys. Lett. vol. 97, 181103 (2010); doi: 10.1063/1.3514232, this reference disclosing a laser with a single cavity formed by the chip end facets that contains both a gain section and an absorber section. Exploiting the bias-dependent modal absorption effect, the monolithic mirror, the back section and the back reflector combine together to act as a tunable back-reflector for the front section LD whose effective reflectivity $R_B$_EFF can be tuned between the back reflector reflectivity $R_B$ and the monolithic mirror reflectivity $R_M$ according to the formula:

$$r_{beff} = r_M + \frac{\eta_c^2 \times (1 - r_M)^2 \times r_b \times \exp(-2i\beta L_B)}{1 + r_M \times r_b \times \exp(-2i\beta L_B)}$$

where
a. $r_f$, $r_m$ and $r_b$ are the Fresnel reflection coefficients of the front facet, the monolithic mirror and the back facet respectively;
b. $h_c$ is the coupling efficiency between the two waveguide sections; and
c. β is the propagation constant of the light in the back section and accounts for the absorption in the back section.

This formula is further described in the textbook: Diode Lasers and Photonic Integrated Circuits, Second Edition: Coldren, Corzine & Maganović (2012), Print ISBN: 9780470484128, Online ISBN:9781118148167, DOI: 10.1002/9781118148167.

Figure 36:
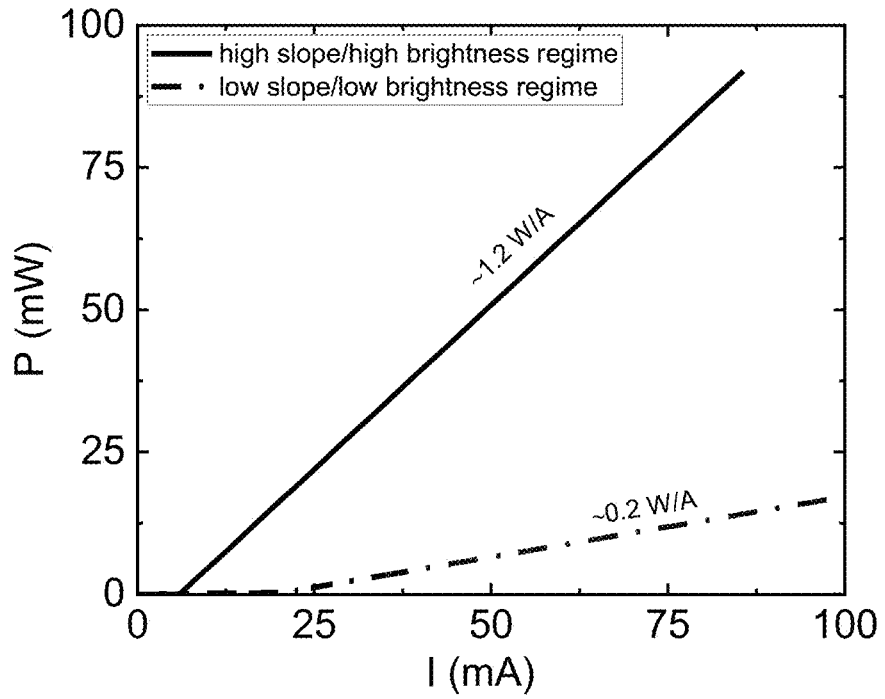
FIG. 36 is a graph of power, P, vs current, I, for an example blue LD chip according to the embodiment of FIG. 32.

FIG. 36 is a graph showing power, P, vs current, I, curves for an example blue LD chip according to this embodiment. The example LD chip has the following parameter values:
 Cavity lengths: $L \approx L_F + L_B$; $L_F$=200 μm; $L_B$=400 μm
 Internal loss: $a_i$=3 cm$^{-1}$
 Back facet reflectivity: $R_b$=95%
 Front facet reflectivity: Rf=80%
 Monolithic mirror reflectivity: $R_M$=20%

By varying the voltage bias applied to the back section, the slope efficiency can be varied from a highest value of approximately 1.2 W/A (solid line) when the effective back reflectivity is close to the Rb value of 95% to a lowest value of approximately 0.2 W/A (dash-dotted line) when the effective back reflectivity is at the $R_M$ value of 20%.

Figure 37:
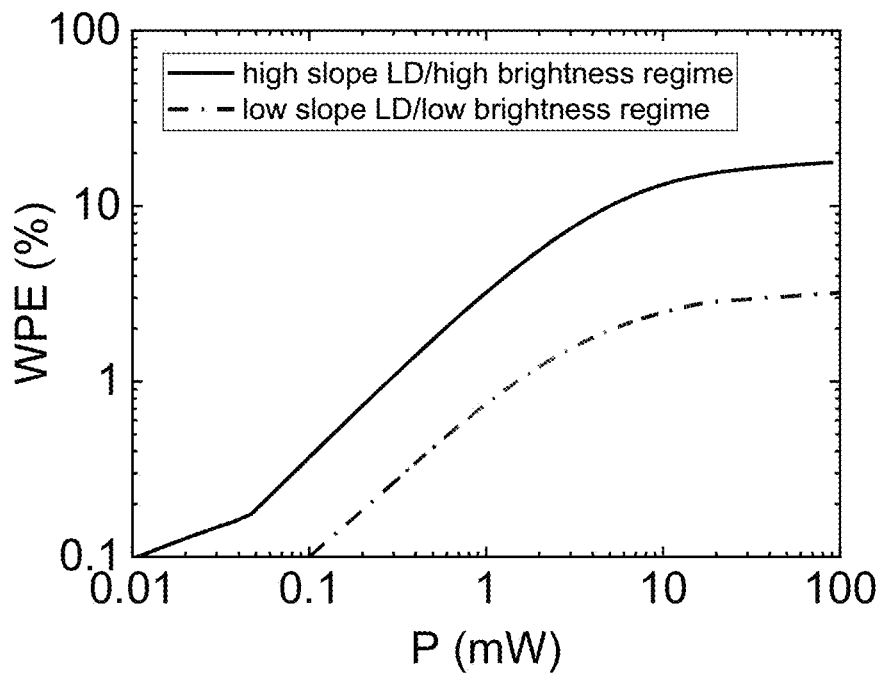
FIG. 37 is a graph showing WPE vs output power for the example blue LD chip of FIG. 36.

FIG. 37 is a graph showing WPE vs output power for the example LD chip of FIG. 36. The high slope performance (solid curve) is with the back section at a bias voltage of approximately 4V to provide an effective back reflectivity $R_{B\_EFF} \approx R_B$ and hence a slope efficiency close to its maximum of about 1.2 W/A. The low slope performance (dot-dashed curve) tracks the high slope performance, but a significantly reduced WPE for any given output power.

It will be understood that the design parameters are not limited to the values used in the example. Rather, there are multiple combinations of parameters that allow a desired transition from low slope to high slope to take place as output power is increased.

Figure 38:
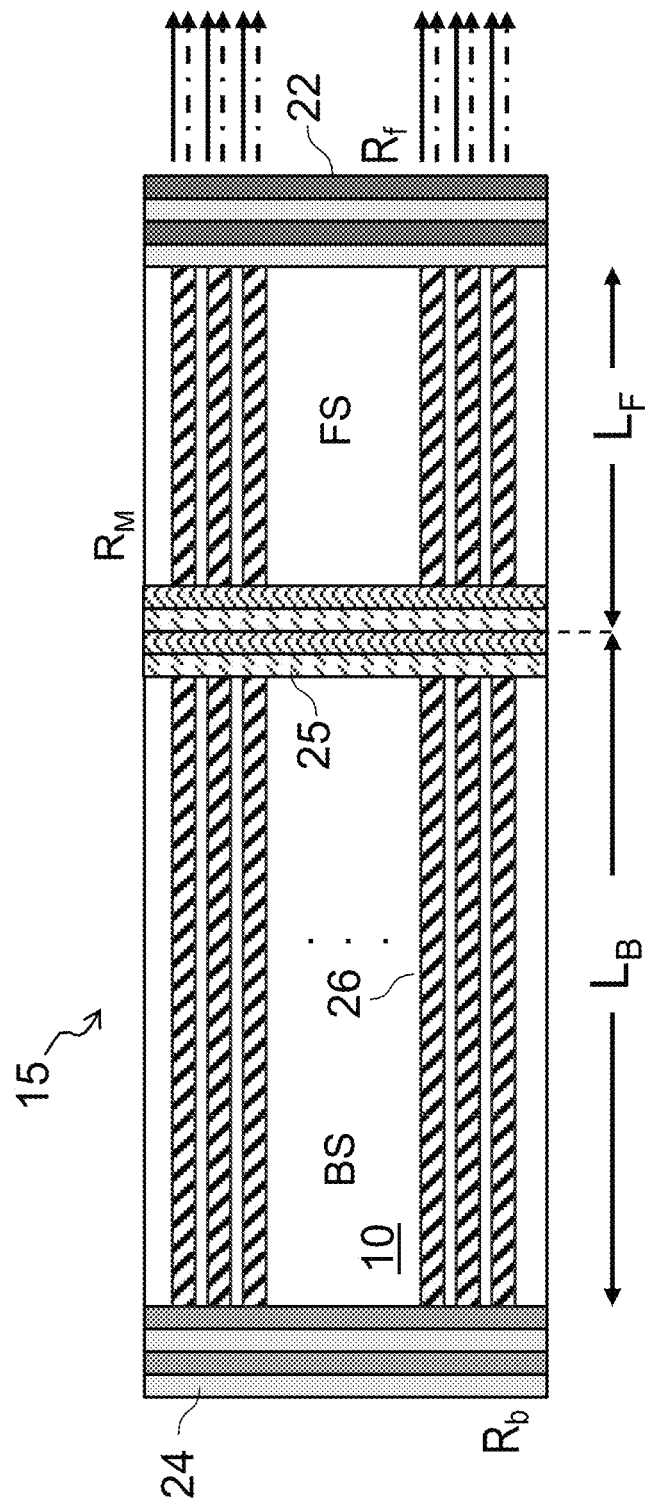
FIG. 38 is a schematic plan view of a variant of the embodiment of FIG. 32 in which multiple emitters are incorporated into a single chip with an array design.

FIG. 38 is a schematic plan view of a variant of the above embodiment in which multiple emitters are incorporated into a single chip with an array design of multiple ridges arranged side by side, each emitter operating as described above.

In a second embodiment of the tunable absorber/laser design, the LD chip has first and section modes of operation. In the first mode of operation, the back section operates as a laser diode and the front section operates as a tunable absorber for the back section to provide in combination a low slope efficiency operation. In this mode of operation, the effect of the tunable absorber front section is to reduce the effective slope efficiency of the back section. In a second mode of operation, the back section is deactivated and the front section is run as a laser diode. To provide the desired performance in the second mode of operation, the front section is designed to operate as a stand-alone high slope efficiency laser. To switch between the first and second modes of operation, the back section is either run as a laser or is inactive, whereas the front section is either biased to operate as a tunable absorber or run as a laser. For high brightness laser operation, the front section is driven far above threshold, whereas for operation as an absorber for the back section, the front section is driven close to the loss/gain cross-over close slightly below the threshold for the front section. In this embodiment, the intermediate, monolithic mirror 25 needs a relatively high reflectivity: typically in this embodiment $R_M$≥80%. The front section cavity length, LF, is preferably ≥100, 150 or 200 μm.

Figure 39A:
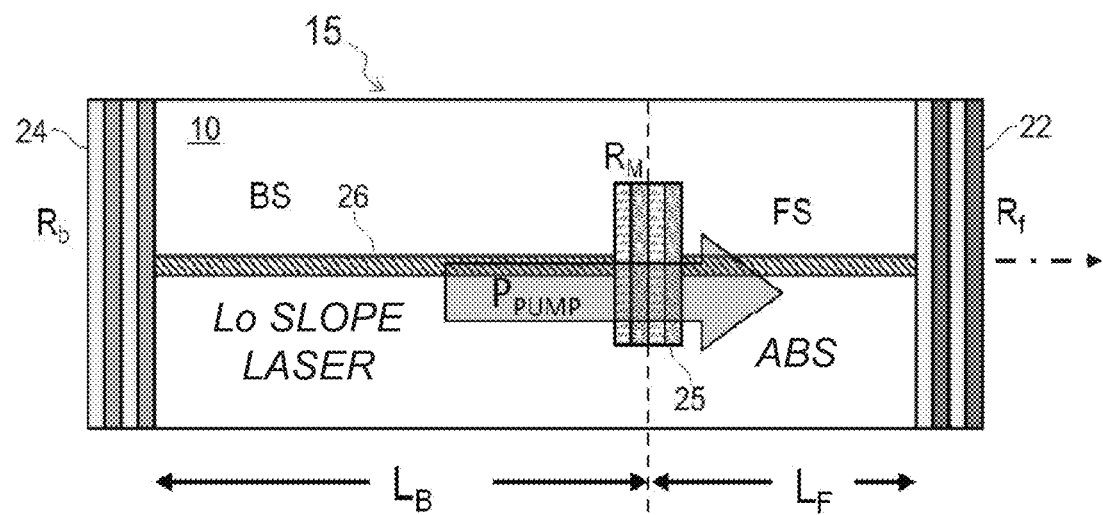
FIGS. 39A and 39B are schematic plan views of the LD chip according to a further embodiment in first and second modes of operation.
Figure 39B:
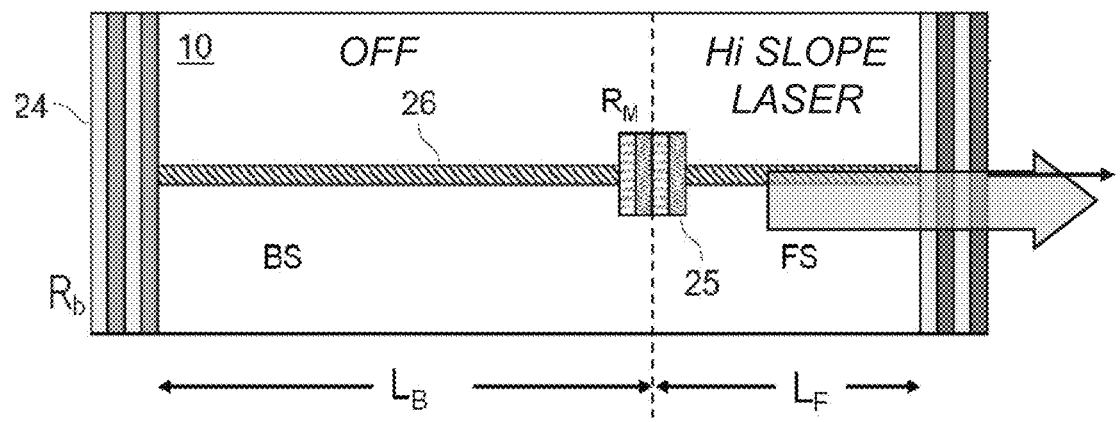

FIGS. 39A and 39B are schematic plan views of the LD chip according to such an embodiment in first and second modes of operation. FIG. 39A shows the first mode of operation in which the back section operates as a laser diode, typically of intrinsically low slope, and the front section operates as a tunable absorber (labelled 'ABS') to further reduce the slope efficiency of the chip output. FIG. 39B shows the second mode of operation in which the back section is deactivated (labelled 'OFF') and the front section is run as a stand-alone high slope laser diode. In the first mode of operation, the power attenuation ratio of the front section will depend on its bias according to its bias dependent modal absorption (i.e. as shown in FIG. 34 of the previous embodiment). The back section laser's output coupler mirror, i.e. the monolithic mirror 25, will typically have a high reflectivity value, e.g. $70\% \geq R_M \geq 95\%$, so that the back section operates as a laser with low slope efficiency. However, this need not be the case in all examples of this embodiment, since in principal the back section could be designed as a high slope efficiency laser whose slope efficiency is suppressed by the absorber front section. An example LD chip according to this embodiment for emitting in the blue spectral region has the following parameter values:

Cavity lengths: $L \approx L_F + L_B$; $L_F$=400 µm; $L_B$=400 µm
Internal loss: $a_i$=3 cm$^{-1}$
Back facet reflectivity: $R_b$=70%
Front facet reflectivity: $R_f$=30%
Monolithic mirror reflectivity: $R_M$=95%

Figure 40:
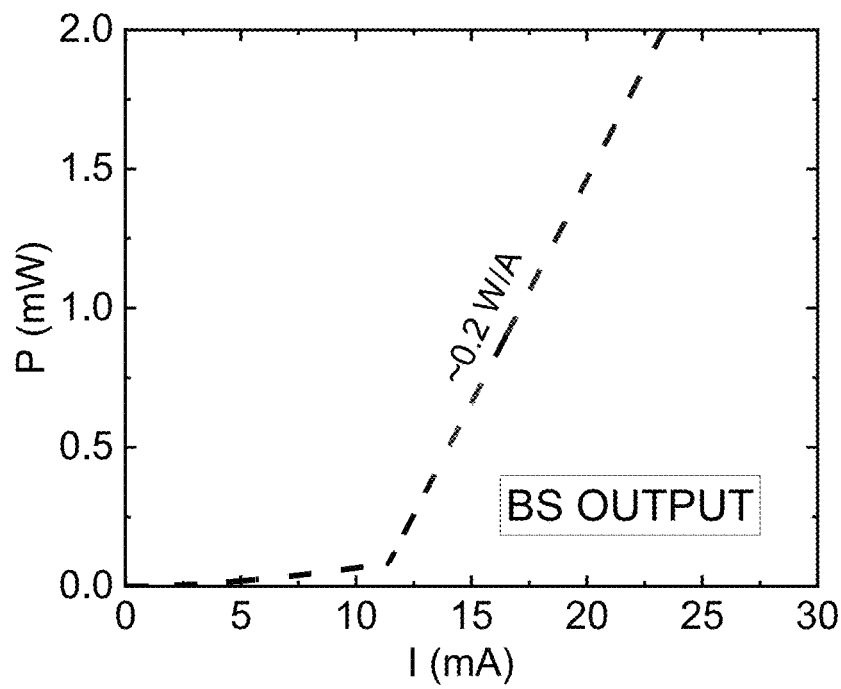
FIG. 40 shows for the embodiment of FIGS. 39A and 39B the back section output power, P, vs back section drive current, I.

FIG. 40 shows the power, P, vs drive current, I, curve for the back section BS. This is the output from the back section BS at the monolithic mirror 25 and therefore ignores the effect of the front section FS. Here we see a normal lasing action with threshold at an injection current of slightly above 10 mA and a slope efficiency of approximately 0.2 W/A. Referring to the reflectivity values, we see that the back reflector and output coupler reflectivity values for the back section are Rb=70% and $R_M$=95% respectively.

Figure 41:
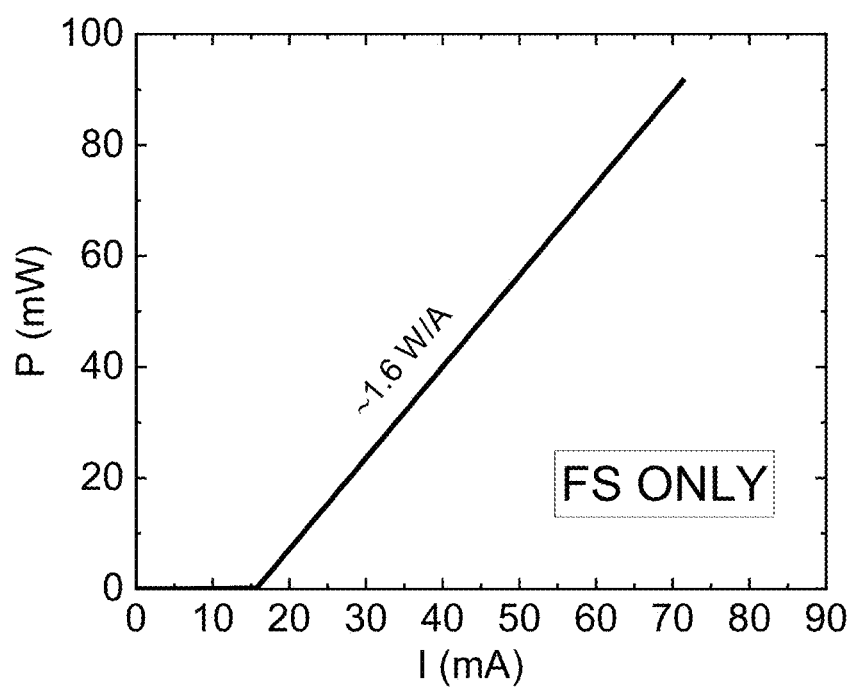
FIG. 41 shows for the embodiment of FIGS. 39A and 39B the output power, P, vs front section drive current, I, when the front section is operating on its own.

FIG. 41 shows the power, P, vs current, I, curve for the front section. This is the condition when the front section is operating on its own as a laser, i.e. with the back section is unbiased and hence inactive, since it has no carriers being injected into its active region. Here we see a normal lasing action with threshold at an injection current of about 15 mA and a slope efficiency of approximately 1.6 W/A. Referring to the reflectivity values, we see that the back reflector and output coupler reflectivity values for the front section are $R_M$=95% and Rf=30% respectively.

Figure 42:
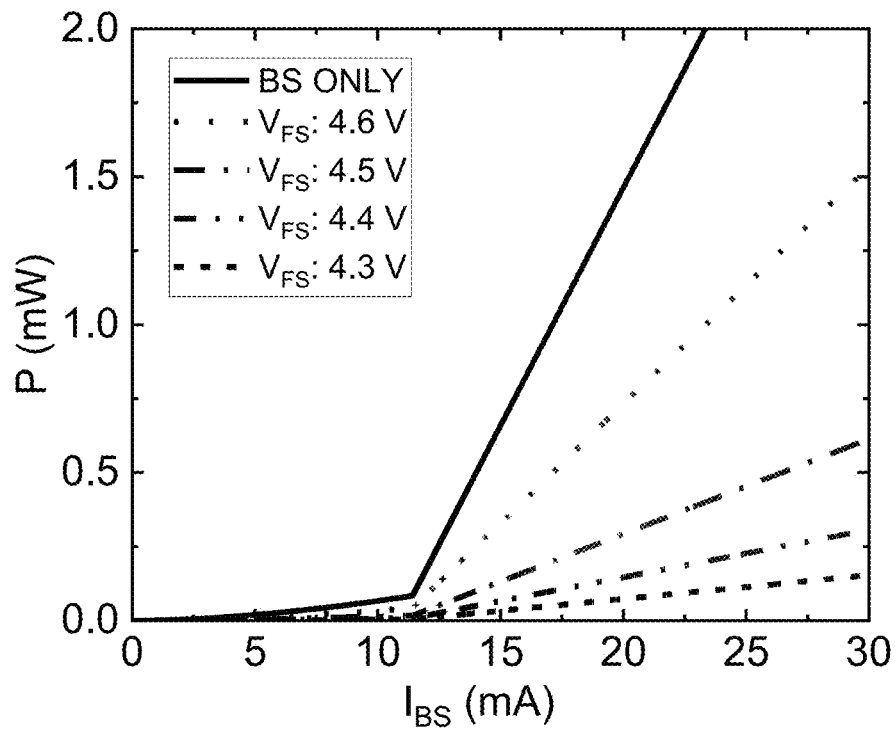
FIG. 42 shows for the embodiment of FIGS. 39A and 39B chip output power, P, vs back section drive current, I, when the back section is lasing and the front section is biased at different voltages and acting as an absorber. The back-section only performance of FIG. 40 is also reproduced for comparison.

FIG. 42 shows with different kinds of dotted and dashed lines a family of power vs current curves in the first mode of operation when the back section is lasing and the front section is acting as a tunable absorber. The power, P, is the power output from the LD chip, i.e. after traversal of the front section, and the current $I_{BS}$ is the current applied to the lasing back section. The different curves are for bias voltage increments of 0.1 V, where the bias voltages are close to the cross-over between loss and gain. Here we note that the general behavior is as shown in FIG. 34, but that the specific values shown in FIG. 34 are not the same as for this example LD chip. In FIG. 42, the response curve from FIG. 40 is also reproduced for reference, i.e. the output from the back section that is injected into the front section. It can be seen that, when the front section is very lossy (bias @ 4.3 V), the slope efficiency of the LD chip as a whole is very low and that, as the front section is biased more strongly to approach the loss/gain cross-over (bias increasing in steps through 4.4 V, 4.5 V and 4.6 V), the slope efficiency increases towards the value for the back section.

Figure 43:
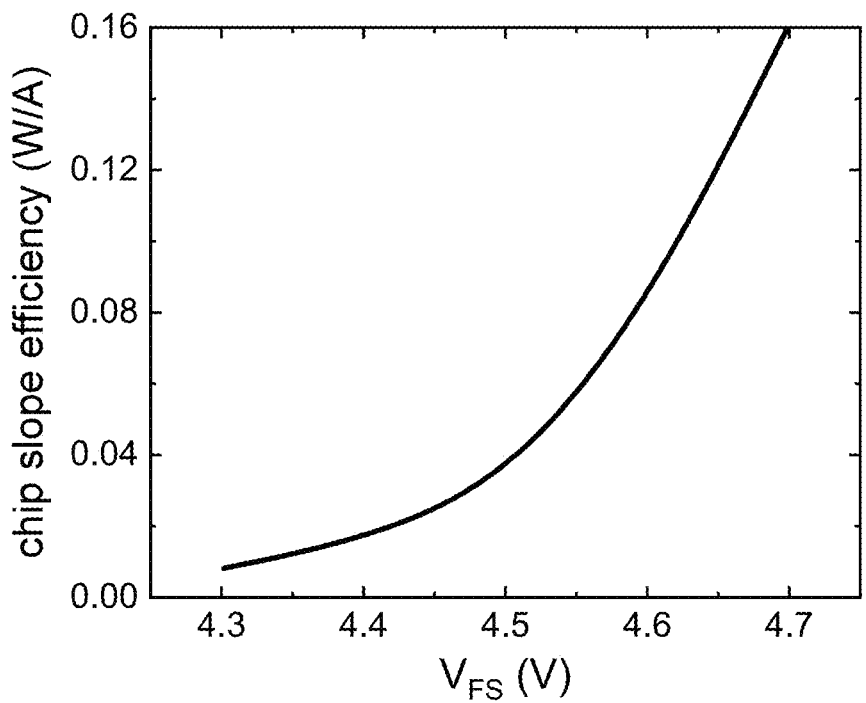
FIG. 43 plots for the embodiment of FIGS. 39A and 39B how the slope efficiency of the LD chip varies with front section bias voltage.

FIG. 43 plots how the slope efficiency of the LD chip varies with front section bias voltage. We see that the slope efficiency approaches that of the back section in isolation when the bias voltage is 4.7 V, i.e. about 0.2 W/A, but is as low as 0.01 or 0.02 W/A at bias voltages of around 4.3 to 4.4 V. This shows that through a suitable choice of front section bias voltage, the slope efficiency can be set (or varied) in the first mode of operation over an order of magnitude or more between a high value defined by the intrinsic slope efficiency of the back section and one tenth or an even smaller fraction thereof. The change of slope efficiency with front section bias voltage is smooth, gradual and predictable, so that in the first mode of operation the slope efficiency can be set (or varied as a function of output power) as desired with suitable control electronics. The control electronics may set the front section bias voltage to a fixed constant value in the first mode of operation, e.g. 4.6 V. Alternatively, the control electronics may smoothly vary or incrementally step the front section bias voltage, e.g. as a function of back section injection current. In the case of stepping, there may be only one step, in which case in the first mode of operation the LD chip will operate with two distinct slope efficiencies at lower and higher output power ranges respectively. There may alternatively be multiple steps in which case the slope efficiency will increase stepwise with the output power. In the case of a smooth or quasi-continuous increase in the front section bias voltage, the slope efficiency will gradually increase with the output power until the maximum defined by the intrinsic slope efficiency of the back section is reached.

The output power at which switching occurs from the first mode to the second mode of operation can be chosen as desired to meet a specific power and/or temperature stability specification. The switching may for example occur at output powers of say 2 mW, 5 mW or 10 mW. As discussed above, to operate in the second mode of operation, the control electronics deactivates the back section, i.e. no current is injected, and the front section is run on its own as a laser diode. In this example, the front section running on its own has a slope efficiency of 1.6 W/A, i.e. about 8 times that of the back section. The total range of slope efficiencies that can be generated when both modes of operation are considered is thus around two orders of magnitude in our example.

Figure 44:
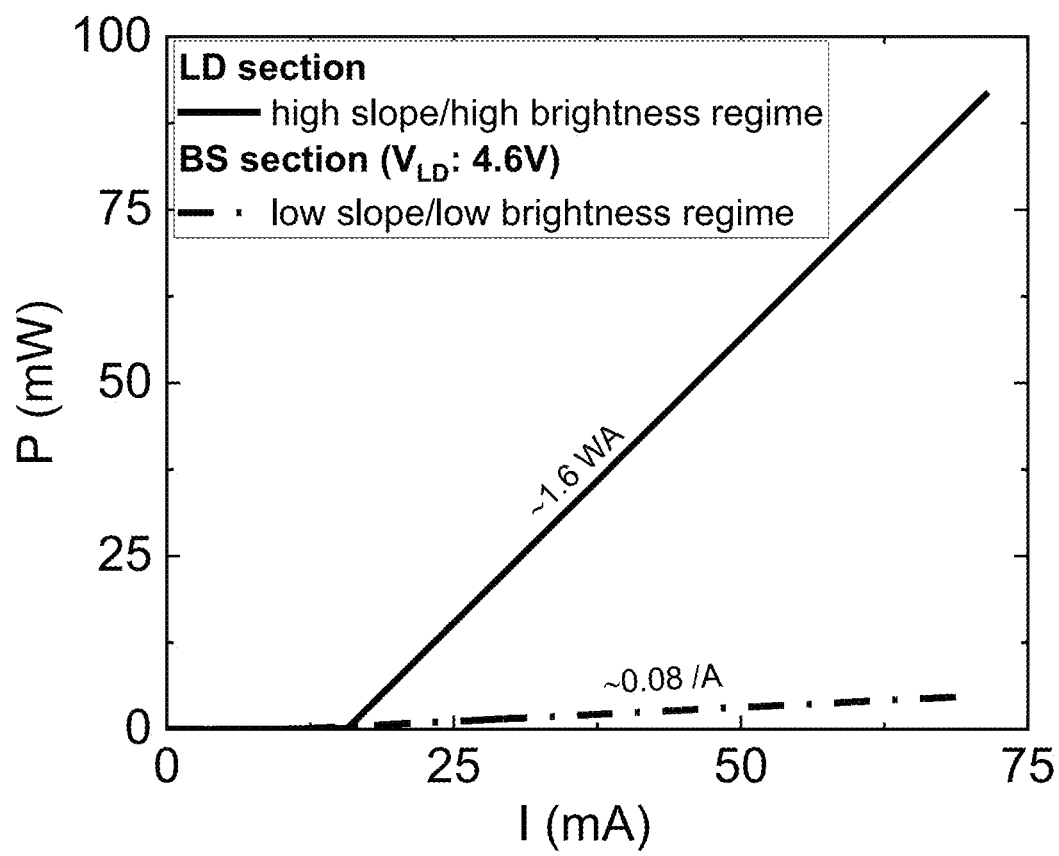
FIG. 44 shows for the embodiment of FIGS. 39A and 39B an example operation with low slope efficiency (for low output powers) and high slope efficiency (for high output powers).

FIG. 44 shows power, P, vs current, I, curves for an example operation with only two slopes, one curve for the first mode of operation, set by a fixed front section bias voltage, and another curve for the second mode of operation. The solid curve with a slope efficiency of 1.6 W/A is in the second mode of operation in which the front section is lasing on its own. The dot-dashed curve with a slope efficiency of 0.08 W/A is in the first mode of operation with the back section lasing and the front section acting as an absorber with a bias voltage of 4.6 V. The ratio of slope efficiencies is twenty but would be greater if the front section bias voltage were reduced (see FIG. 42). For example, with a bias voltage of 4.3 V, the slope efficiency is only about 0.01, giving a slope efficiency ratio between the two operational modes of one hundred and sixty.

It will be appreciated that variants of this embodiment may incorporate multiple emitters side by side in an array design, similar to that shown in FIG. 38 for the previous embodiment.

In a third embodiment of the tunable absorber/laser design, the back section designed to operate as a high slope efficiency laser and the front section is designed to operate (exclusively) as a tunable absorber. The high and low slope operational modes of the LD chip of the third embodiment are defined by the bias level applied to the tunable absorber. High slope operation of the LD chip is set by biasing the front section tunable absorber to absorb little or substantially no light from the lasing back section, or perhaps even to apply a small amount of gain, but not enough to make the front section lase, i.e. an amount of gain that is below threshold for the front section. Low slope operation of the LD chip is set by biasing the front section tunable absorber to absorb a significant proportion of the light from the lasing back section. The ratio of slope efficiencies in the two modes is thus controlled by the power attenuation ratio applied to the front section according to its bias dependent modal absorption (i.e. as shown in FIG. 34).

Figure 45A:
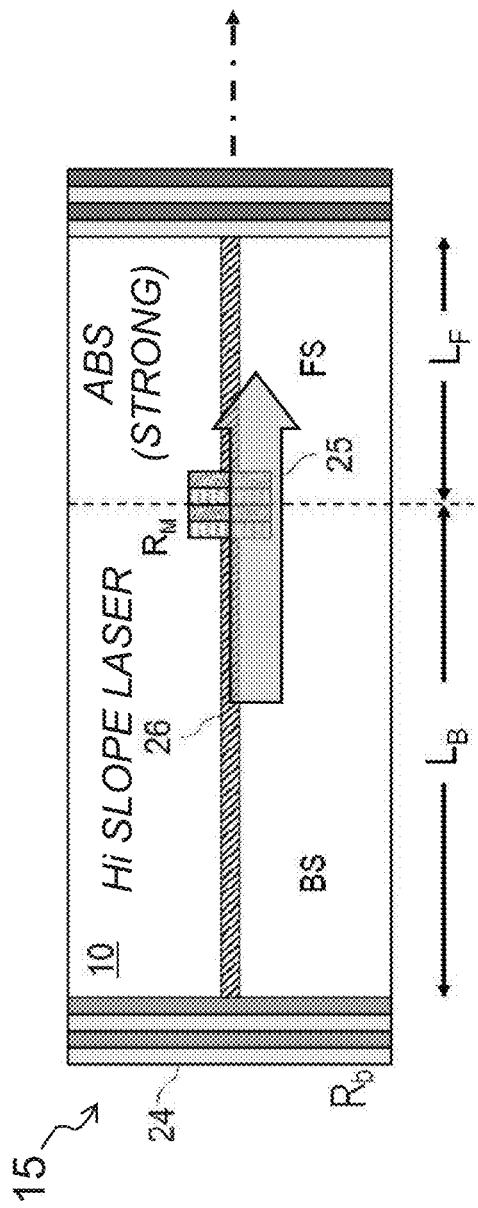
FIGS. 45A and 45B are schematic plan views of the LD chip according to a further embodiment in first and second modes of operation.
Figure 45B:
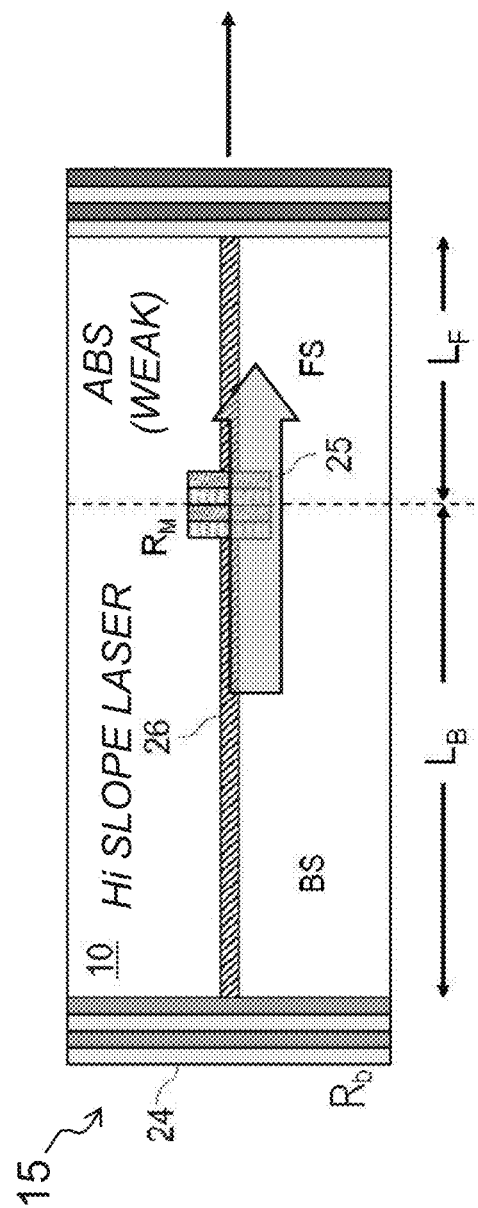

FIGS. 45A and 45B are schematic plan views of the LD chip according to such an embodiment in first and second modes of operation. FIG. 45A shows the first mode of operation in which the front section is biased to cause strong absorption to provide low slope efficiency of the LD chip output despite the intrinsic high slope efficiency performance of the back section. FIG. 45B shows the second mode of operation in which the back section operates as in the first mode of operation, but the bias applied to the front section is increased to reduce the absorption, so that the intrinsic high slope efficiency of the back section is represented also in high slope efficiency LD chip output, although perhaps slightly reduced (or perhaps substantially the same or increased) compared to the intrinsic slope efficiency of the back section. Since in this embodiment the back section needs to be a high slope efficiency laser, when considered as a stand-alone element, the monolithic mirror which is its output coupler will typically have a low reflectivity value, e.g. 5%≤$R_M$≤50%. An example LD chip according to this embodiment for emitting in the blue spectral region has the following parameter values:

Cavity lengths: L≈$L_F$+$L_B$; $L_F$=400 µm; $L_B$=400 µm
Internal loss: $a_i$=3 cm$^{-1}$
Back facet reflectivity: $R_b$=95%
Front facet reflectivity: $R_f$=10%
Monolithic mirror reflectivity: $R_M$=10%

Figure 46:
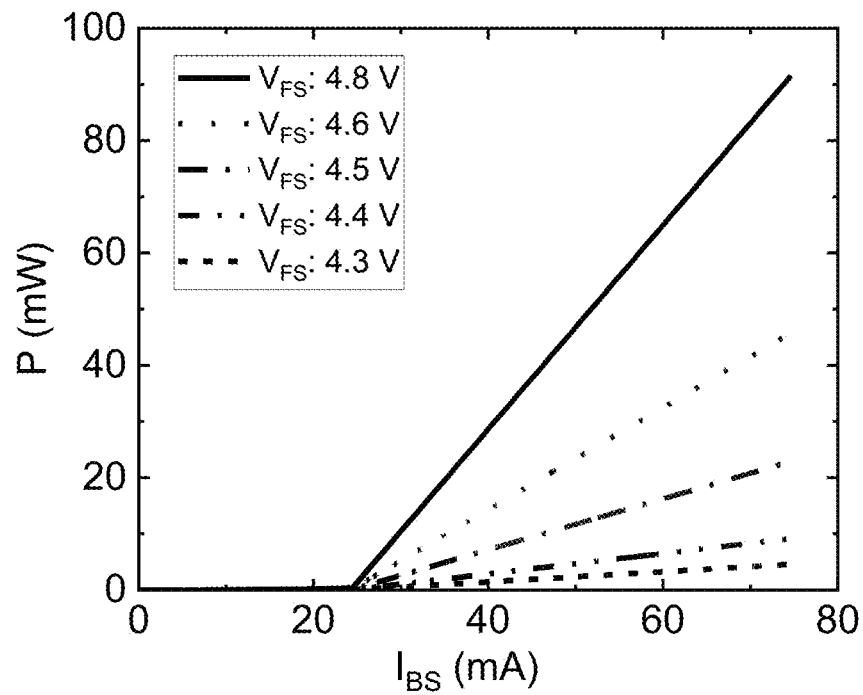
FIG. 46 is a graph of chip output power, P, vs back section drive current, I, for the embodiment of FIGS. 45A and 45B, wherein the different curves show performance with different front section bias voltages.

FIG. 46 shows with different kinds of dotted and dashed lines a family of power vs current curves, where the power, P, is the power output from the LD chip, i.e. after traversal of the front section, and the current $I_B$s is the current applied to the lasing back section. The different curves are for different front section bias voltage values $V_F$s, where the bias voltages are close to the cross-over between loss and gain.

Figure 47:
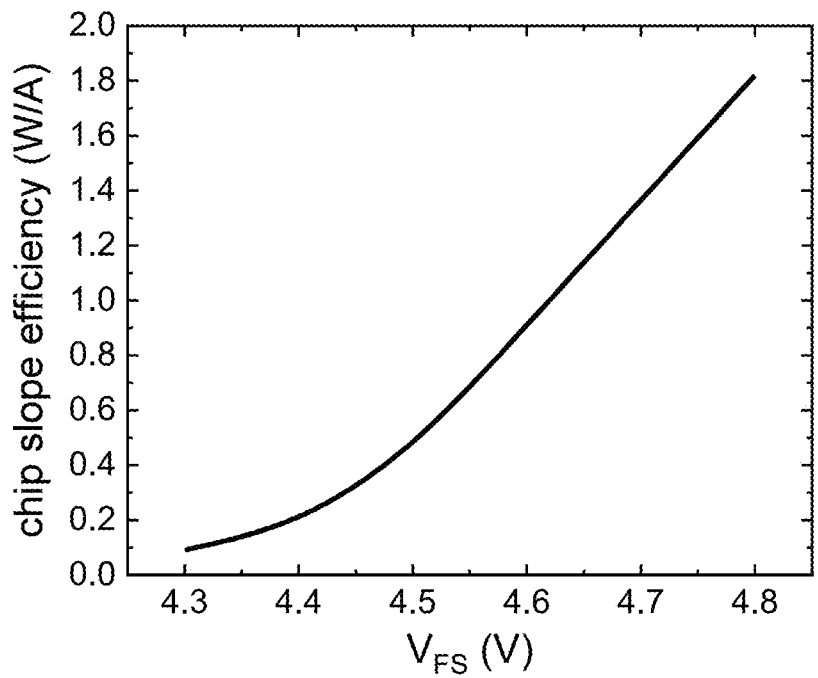
FIG. 47 plots how the slope efficiency of the LD chip of FIG. 46 varies with front section bias voltage.

FIG. 47 plots how the slope efficiency of the LD chip varies with front section bias voltage.

Figure 48:
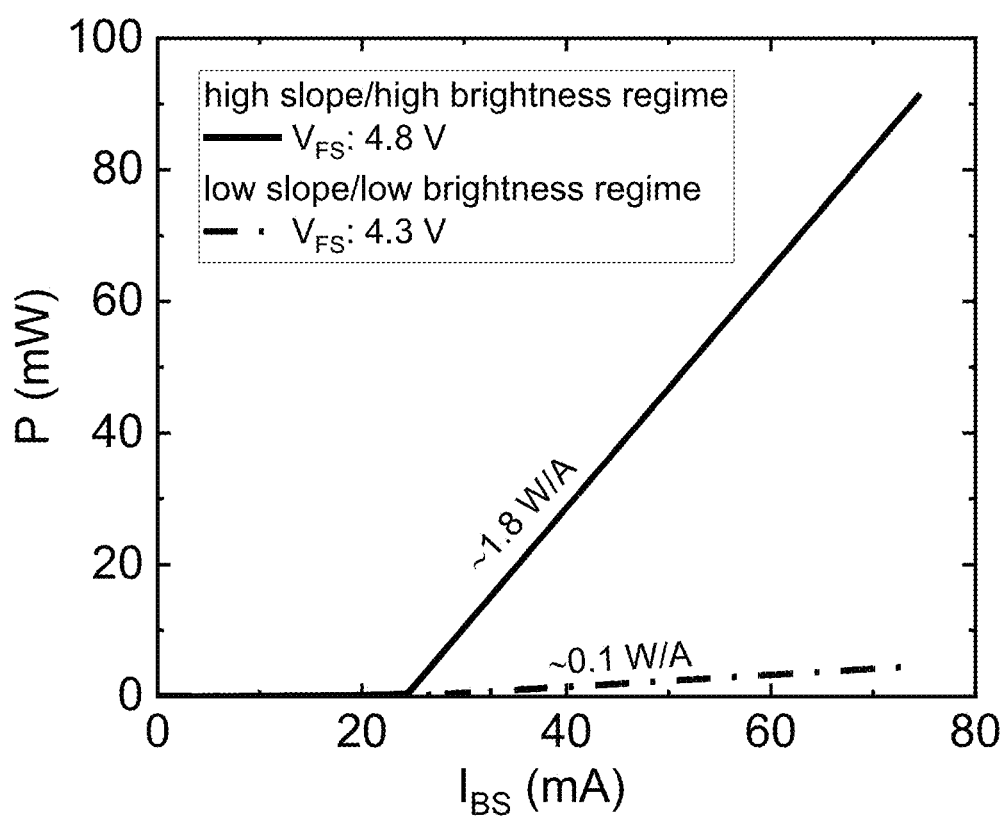
FIG. 48 shows chip output power, P, vs back section drive current, I, curves for an example operation of the LD chip of FIG. 46 with two slopes corresponding to front section bias voltages of 4.3 V and 4.8 V.

FIG. 48 shows power, P, vs current, I, curves for an example operation with two slopes. The solid curve with a slope efficiency of ~1.8 W/A has the front section biased with a bias voltage of 4.8 V, which set the absorber section so that it is absorbing only a small amount of the light emitted from the lasing back section. The dot-dashed curve with a slope efficiency of ~0.1 W/A has the front section biased with a bias voltage of 4.3 V to provide significant absorption.

It will be appreciated that variants of this embodiment may incorporate multiple emitters side by side in an array design, similar to that shown in FIG. 38 for the previous embodiment.

Figure 49:
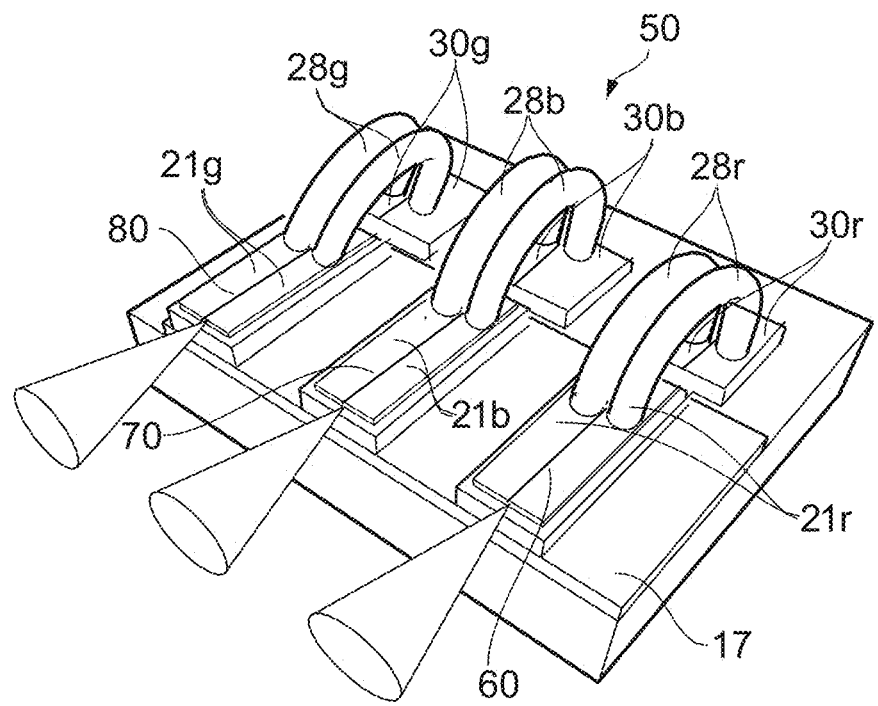
FIG. 49 is a schematic perspective view of an RGB light module incorporating red, green and blue LDs.

FIG. 49 is a schematic perspective view of an RGB light module 50. The light module 50 has a unitary construction and includes red, green and blue LD chips 60, 70 and 80. Any one or more of the LD chips 60, 70 or 80 may be according to embodiments of the disclosure. For example, the blue and green LD chips may be according to embodiments of the disclosure and the red LD chip may be some other design, or all of LD chips 60, 70 and 80 may be according to embodiments of the disclosure. The LD chips 60, 70 and 80 are arranged side by side on a common circuit board with a common n-electrode 17, which may or may not involve the different LDs having a common n-electrode. Alternatively, individual n-electrodes may be provided. Each emitter 60, 70 and 80 has its own pair of p-electrodes 21r, 21g and 21b, which are contacted by respective pairs of drive wire bridges 28r, 28g and 28b connected to pairs of p-drive pads 30r, 30g and 30b. The light emitted from each LD is schematically shown as being in a cone with a certain solid angle. (The outputs from the two side-by-side waveguides in each emitter may be guided to a common beam path or may be slightly laterally offset in the x-direction.) It will be understood that micro-lenses, optical fibers and other optical components may be coupled to the light module to form whatever output is desired.

Figure 50:
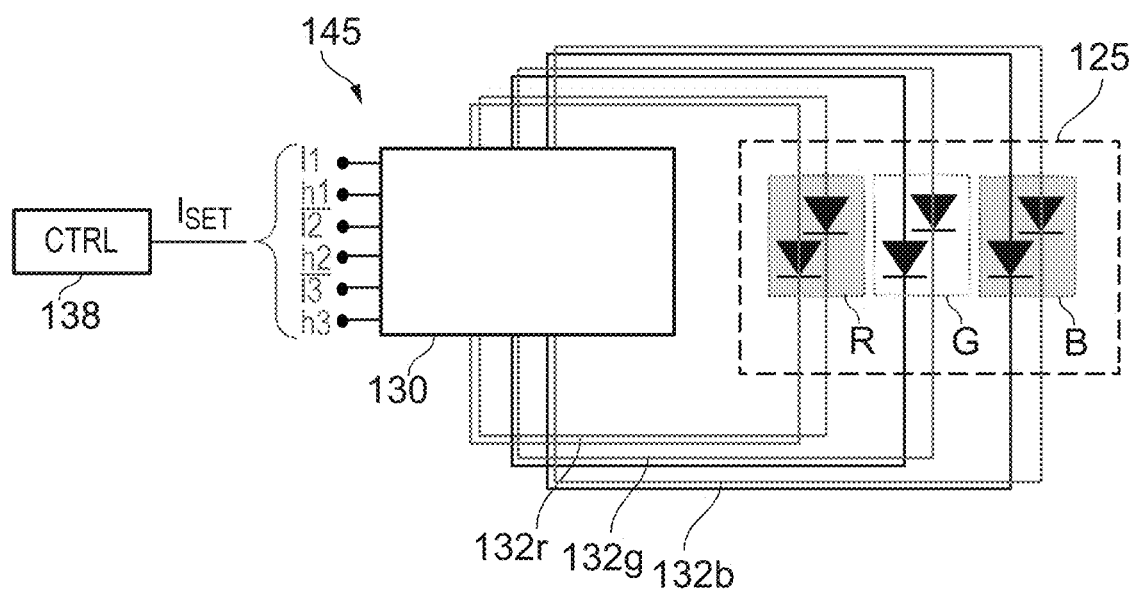
FIG. 50 is a schematic drawing of a light source unit including a drive circuit and other components suitable for integration of a three-emitter LD device or module.

FIG. 50 is a schematic drawing of a light source unit 145 including a drive circuit and other components suitable for integration of a three-emitter device or module 125 embodying the invention, the three emitters, each with one LD chip, being labelled R, G and B for red, green and blue. The three LD chips are controlled by respective dual lines 132r, 132g and 132b from a driver unit 130 to supply suitable drive currents (and bias voltages) to the electrodes. Suitable drive currents (and voltages) $I_{SET}$ ($V_{SET}$) are received from a controller 138 for each of the six components, i.e. one pair for each of the R, G and B laser diodes, these signal pairs being labelled l1, h1; l2, h2; l3, h3. The arrangement is suitable for any of the embodiments of the disclosure.

Figure 51:
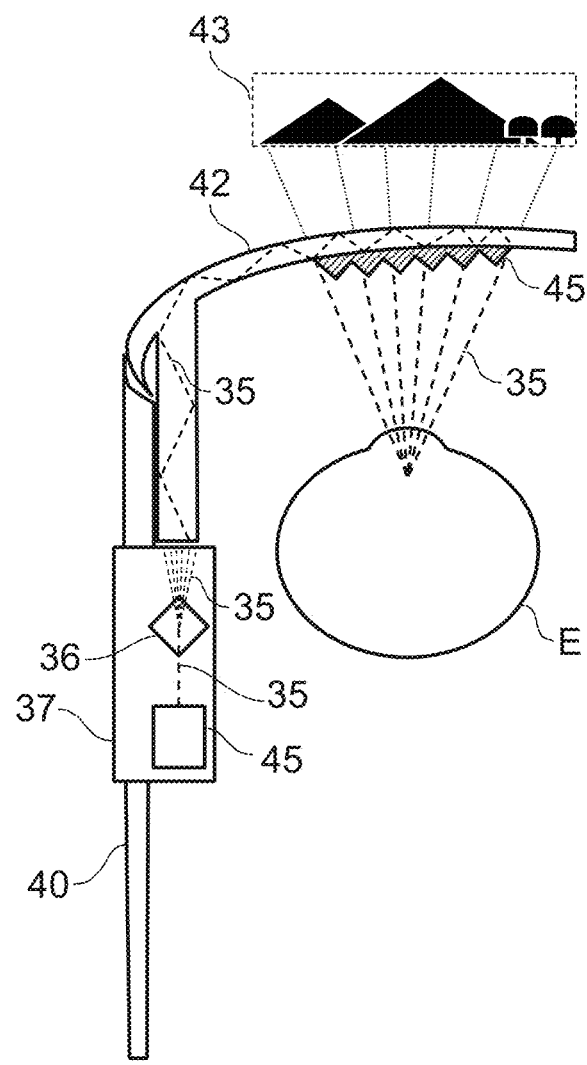
FIG. 51 shows an example near-to-eye projection system in a monocle format.

FIG. 51 shows an example of a near-to-eye projection system in a monocle format, i.e. glasses or spectacles for a single eye. A housing 37 is integrated midway along a temple 40 and houses the light source unit 145 of FIG. 50. The combined RGB light beam 35 output by the light source unit 145 is directed to a scanning element 36 which projects and couple the light beam 35 into a waveguide lens 42. The guided light beam is then extracted under the form of a virtual image 43 in front of a wearer's eye E through an outcoupling element 45.

Figure 52:
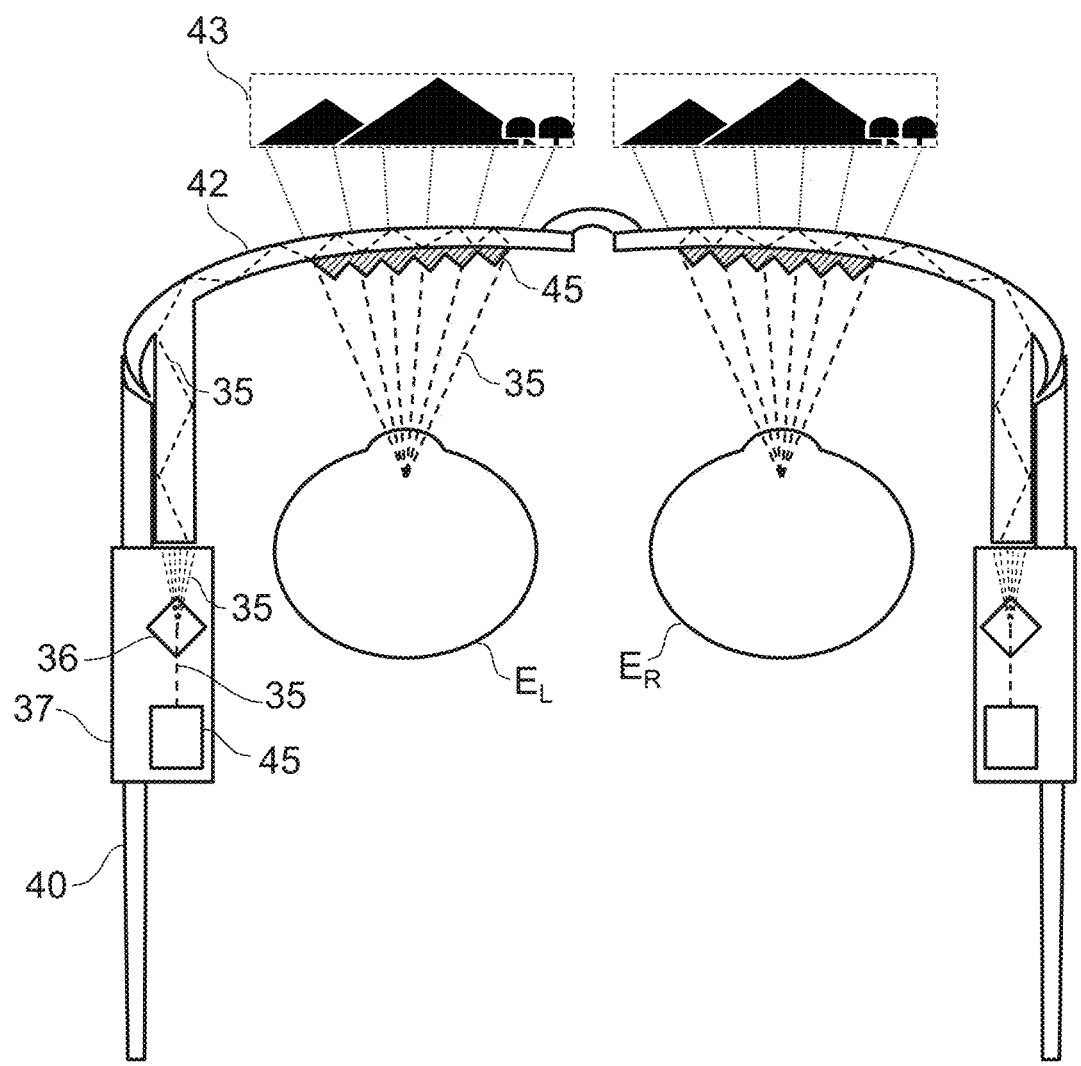
FIG. 52 shows an example near-to eye projection system in a spectacles format.

FIG. 52 shows an example near-to-eye projection system in a spectacles format which is essentially a doubled-up version of the single-eye system of FIG. 51 for near-to-eye projection into the left eye $E_L$ and right eye $E_R$. The same reference numerals are used. Projection in front of both eyes allows for additional possibilities, such as stereoscopic imaging for 3D.

It will be clear to one skilled in the art that many improvements and modifications can be made to the foregoing exemplary embodiments without departing from the scope of the present disclosure.

What is claimed is:
1. A laser diode chip comprising:
a plurality of semiconductor layers arranged on a substrate, the semiconductor layers collectively defining an active region layer sandwiched between upper and lower cladding layers, wherein the active region layer has a refractive index greater than that of the upper and lower cladding layers to provide waveguiding in the active region layer;
mutually opposed front and back end facets on which are formed front and back mirrors;
a ridge extending laterally between the front and back end facets and having a pair of sides that extend part way to the active region layer to define a waveguide in the active region layer;
a partially transmissive mirror arranged part way between the front end facet and the back end facet to subdivide the waveguide into a back waveguide section and a front waveguide section which form independent optical cavities, wherein the partially transmissive mirror is shared by the front and back waveguide sections, has a reflectivity $R_M$ greater than or equal to 70 percent and has a dual function of forming an output coupler for the back waveguide section and a back reflector for the front waveguide section;
a plurality of electrical contacts configured to allow the front and back waveguide sections to be independently driven; and
a controller configured to drive the electrical contacts in a first mode of operation to operate the laser diode chip with a first slope efficiency for a first output power range and in a second mode of operation to operate the laser diode chip with second slope efficiency for second output power range, wherein the second slope efficiency is higher than the first slope efficiency and the second power range is higher than the first power range,
wherein to produce the first mode of operation, the controller is configured to drive the electrical contacts to operate the back waveguide section as a laser diode and the front waveguide section as a bias-dependent tunable absorber, and
wherein to produce the second mode of operation, the controller is configured to drive the electrical contacts to operate the front waveguide section as a laser diode and to deactivate the back waveguide section.

2. The laser diode chip of claim 1, wherein the partially transmissive mirror has a reflectivity $R_M$ greater than the reflectivity of the front mirror Rf and the back mirror Rb.

3. The laser diode chip of claim 1, wherein the partially transmissive mirror has a reflectivity $R_M$ greater than or equal to one of: 75, 80, 85 and 90 percent.

4. The laser diode chip of claim 1, wherein the front mirror has a reflectivity Rf less than or equal to one of: 50, 40, 30 and 20 percent, and the back mirror has a reflectivity Rb greater than or equal to one of: 50, 60, 70, 80 and 90 percent.

5. The laser diode chip of claim 1, wherein the second slope efficiency is at least 1.5, 2, 3, 4, 5, 6, 7, 8, 9, 10, or 20 times greater than the first slope efficiency.

6. The laser diode chip of claim 1, wherein the laser diode chip is configured to emit in the blue spectral region, the first slope efficiency is less than 0.8 W/A and the second slope efficiency is greater than 1.2 W/A.

7. The laser diode chip of claim 1, wherein the laser diode chip is configured to emit in the green spectral region, the first slope efficiency is less than 0.3 W/A and the second slope efficiency is greater than 0.5 W/A.

8. The laser diode chip of claim 1, wherein the laser diode chip is configured to emit in the red spectral region, the first slope efficiency is less than 0.3 W/A and the second slope efficiency is greater than 0.8 W/A.

9. The laser diode chip of claim 1, wherein the partially transmissive mirror is a monolithic mirror defined by periodic channels extending vertically through the semiconductor layers which are filled with an insulating material to form a Bragg.

10. A light module comprising at least one laser diode chip, each laser diode chip comprising:
a plurality of semiconductor layers arranged on a substrate, the semiconductor layers collectively defining an active region layer sandwiched between upper and lower cladding layers, wherein the active region layer has a refractive index greater than that of the upper and lower cladding layers to provide waveguiding in the active region layer;
mutually opposed front and back end facets on which are formed front and back mirrors;
a ridge extending laterally between the front and back end facets and having a pair of sides that extend part way to the active region layer to define a waveguide in the active region layer;
a partially transmissive mirror arranged part way between the front end facet and the back end facet to subdivide the waveguide into a back waveguide section and a front waveguide section, wherein the partially transmissive mirror is shared by the front and back waveguide sections, has a reflectivity $R_M$ greater than or equal to 70 percent and has a dual function of forming an output coupler for the back waveguide section and a back reflector for the front waveguide section;
a plurality of electrical contacts configured to allow the front and back waveguide sections to be independently driven; and
a controller configured to drive the electrical contacts in a first mode of operation to operate the laser diode chip with first slope efficiency for a first output power range and in a second mode of operation to operate the laser diode chip with a second slope efficiency for a second output power range, wherein the second slope efficiency is higher than the first slope efficiency and the second power range is higher than the first power range, and to produce at least one of the first and second modes of operation, the controller is configured to drive the electrical contacts to operate one of the waveguide sections as a laser diode and the other of the waveguide sections as a bias-dependent tunable absorber,
wherein to produce the first mode of operation, the controller is configured to drive the electrical contacts to operate the back waveguide section as a laser diode and the front waveguide section as a bias-dependent tunable absorber, and
wherein to produce the second mode of operation, the controller is configured to drive the electrical contacts to operate the front waveguide section as a laser diode and to deactivate the back waveguide section.

11. A vision system configured to be placed on a human head incorporating a light module comprising at least one laser diode chip, each laser diode chip comprising:
a plurality of semiconductor layers arranged on a substrate, the semiconductor layers collectively defining an active region layer sandwiched between upper and lower cladding layers, wherein the active region layer has a refractive index greater than that of the upper and lower cladding layers to provide waveguiding in the active region layer;
mutually opposed front and back end facets on which are formed front and back mirrors;
a ridge extending laterally between the front and back end facets and having a pair of sides that extend part way to the active region layer to define a waveguide in the active region layer;
a partially transmissive mirror arranged part way between the front end facet and the back end facet to subdivide the waveguide into a back waveguide section and a front waveguide section, wherein the partially transmissive mirror is shared by the front and back waveguide sections, has a reflectivity $R_M$ greater than or equal to 70 percent and has a dual function of forming an output coupler for the back waveguide section and a back reflector for the front waveguide section;

a plurality of electrical contacts configured to allow the front and back waveguide sections to be independently driven; and a controller configured to drive the electrical contacts in a first mode of operation to operate the laser diode chip with a first slope efficiency for a first output power range and in a second mode of operation to operate the laser diode chip with a second slope efficiency for a second output power range, wherein the second slope efficiency is higher than the first slope efficiency and the second power range is higher than the first power range, and to produce at least one of the first and second modes of operation, the controller is configured to drive the electrical contacts to operate one of the waveguide sections as a laser diode and the other of the waveguide sections as a bias-dependent tunable absorber, wherein to produce the first mode of operation, the controller is configured to drive the electrical contacts to operate the back waveguide section as a laser diode and the front waveguide section as a bias-dependent tunable absorber, and wherein to produce the second mode of operation, the controller is configured to drive the electrical contacts to operate the front waveguide section as a laser diode and to deactivate the back waveguide section.

* * * * *

UNITED STATES PATENT AND TRADEMARK OFFICE
CERTIFICATE OF CORRECTION

PATENT NO. : 11,670,914 B2
APPLICATION NO. : 17/321843
DATED : June 6, 2023
INVENTOR(S) : Antonino Francesco Castiglia et al.

It is certified that error appears in the above-identified patent and that said Letters Patent is hereby corrected as shown below:

On the Title Page

Item (72) The correct name of one of the named inventors is Marcus DÜLK, not Marcus Pierre DÜLK.

Signed and Sealed this
Thirtieth Day of January, 2024

Katherine Kelly Vidal
*Director of the United States Patent and Trademark Office*